(12) United States Patent
Agarwal et al.

(10) Patent No.: US 8,236,595 B2
(45) Date of Patent: Aug. 7, 2012

(54) NANOWIRE SENSOR, NANOWIRE SENSOR ARRAY AND METHOD OF FABRICATING THE SAME

(75) Inventors: Ajay Agarwal, Singapore (SG); Navab Singh, Singapore (SG); Rakesh Kumar, Singapore (SG); Ieng Kin Lao, Singapore (SG); Narayanan Balasubramanian, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 359 days.

(21) Appl. No.: 12/376,993

(22) PCT Filed: Aug. 11, 2006

(86) PCT No.: PCT/SG2006/000227
§ 371 (c)(1),
(2), (4) Date: May 11, 2010

(87) PCT Pub. No.: WO2008/018834
PCT Pub. Date: Feb. 14, 2008

(65) Prior Publication Data
US 2011/0193183 A1    Aug. 11, 2011

(51) Int. Cl.
*H01L 21/00* (2006.01)
(52) U.S. Cl. ............... 438/49; 257/414; 257/E21.282; 257/E29.022; 977/957; 977/958
(58) Field of Classification Search ............... 257/414, 257/E21.282, E29.022; 438/49; 977/957, 977/958
See application file for complete search history.

(56) References Cited

U.S. PATENT DOCUMENTS

| 6,764,884 | B1 * | 7/2004 | Yu et al. ............... 438/157 |
| 6,870,235 | B2 * | 3/2005 | Abstreiter et al. ............ 257/414 |
| 6,885,055 | B2 | 4/2005 | Lee |
| 7,294,526 | B2 * | 11/2007 | Li et al. ............... 438/82 |
| 7,416,911 | B2 * | 8/2008 | Heath et al. ............... 438/49 |

(Continued)

FOREIGN PATENT DOCUMENTS
EP     1426756     6/2004
(Continued)

OTHER PUBLICATIONS

Ajay Agarwal et al, Transport Characteristics of Si Nanowires in Bulk Silicon and SOI wafers, 2006 IEEE Conference on Emerging Technologies—Nanoelectronics, pp. 67-70.

(Continued)

*Primary Examiner* — Allan R Wilson
(74) *Attorney, Agent, or Firm* — Altera Law Group, LLC

(57) ABSTRACT

A method of fabricating a sensor comprising a nanowire on a support substrate with a first semiconductor layer arranged on the support substrate is disclosed. The method comprises forming a fin structure from the first semiconductor layer, the fin structure comprising at least two supporting portions and a fin portion arranged there between; oxidizing at least the fin portion of the fin structure thereby forming the nanowire being surrounded by a first layer of oxide; and forming an insulating layer above the supporting portions; wherein the supporting portions and the first insulating layer form a microfluidic channel. A nanowire sensor is also disclosed. The nanowire sensor comprises a support substrate, a semiconducting fin structure arranged on the support substrate, the fin structure comprising at least two semiconducting supporting portions and a nanowire arranged there between; and a first insulating layer on a contact surface of the supporting portions; wherein the supporting portions and the first insulating layer form a microfluidic channel.

33 Claims, 57 Drawing Sheets

U.S. PATENT DOCUMENTS

| | | | |
|---|---|---|---|
| 2001/0053535 A1 | 12/2001 | Bashir et al. | |
| 2002/0117659 A1 | 8/2002 | Lieber et al. | |
| 2005/0072213 A1* | 4/2005 | Besnard et al. | 73/31.06 |
| 2006/0054936 A1* | 3/2006 | Lieber et al. | 257/210 |
| 2006/0131574 A1 | 6/2006 | Yu et al. | |
| 2007/0132043 A1* | 6/2007 | Bradley et al. | 257/414 |
| 2010/0227382 A1* | 9/2010 | Lieber et al. | 435/287.1 |
| 2010/0248209 A1* | 9/2010 | Datta et al. | 435/5 |

FOREIGN PATENT DOCUMENTS

| | | |
|---|---|---|
| EP | 1574854 | 9/2005 |
| JP | 2005-283578 | 10/2005 |
| JP | 2004-210563 | 6/2007 |
| WO | WO03/046265 | 6/2003 |
| WO | WO2004/028952 | 4/2004 |
| WO | WO2005/066343 | 7/2005 |
| WO | WO2006/042276 | 4/2006 |

OTHER PUBLICATIONS

Kedzierski et al, "Fabrication of Planar silicon nanowires on silicon-on-insulator using stress limited oxidation" In: Journal of Vacuum Science & Technology B: Microelectronics and Nanometer Structures, Nov. 1997, vol. 15, issue 6, pp. 2825-2828.

Hoess, Phage display of peptides and protein domains, Current Opinion in Structural Biology 3 (1993), pp. 572-579.

Wells and Lowman, Rapid evolution of peptide and protein binding properties in vitro, Current Opinion in Structural Biology 2 (1992), jpgs. 597-604.

Skerra et al, Filter Screening of Antibody Fab Fragments Secreted from Individual Bacterial Colonies: Specific Detection of Antigen Binding with a Two-Membrane System, Analytical Biochemistry 196 (1991) pp. 151-155.

Roberts, Totally in vitro protein selection using mRNA-protein fusions and ribosome display, Current Opinion in Chemical Biology 3 (1999), pp. 268-273.

* cited by examiner

138

108

162

108

164

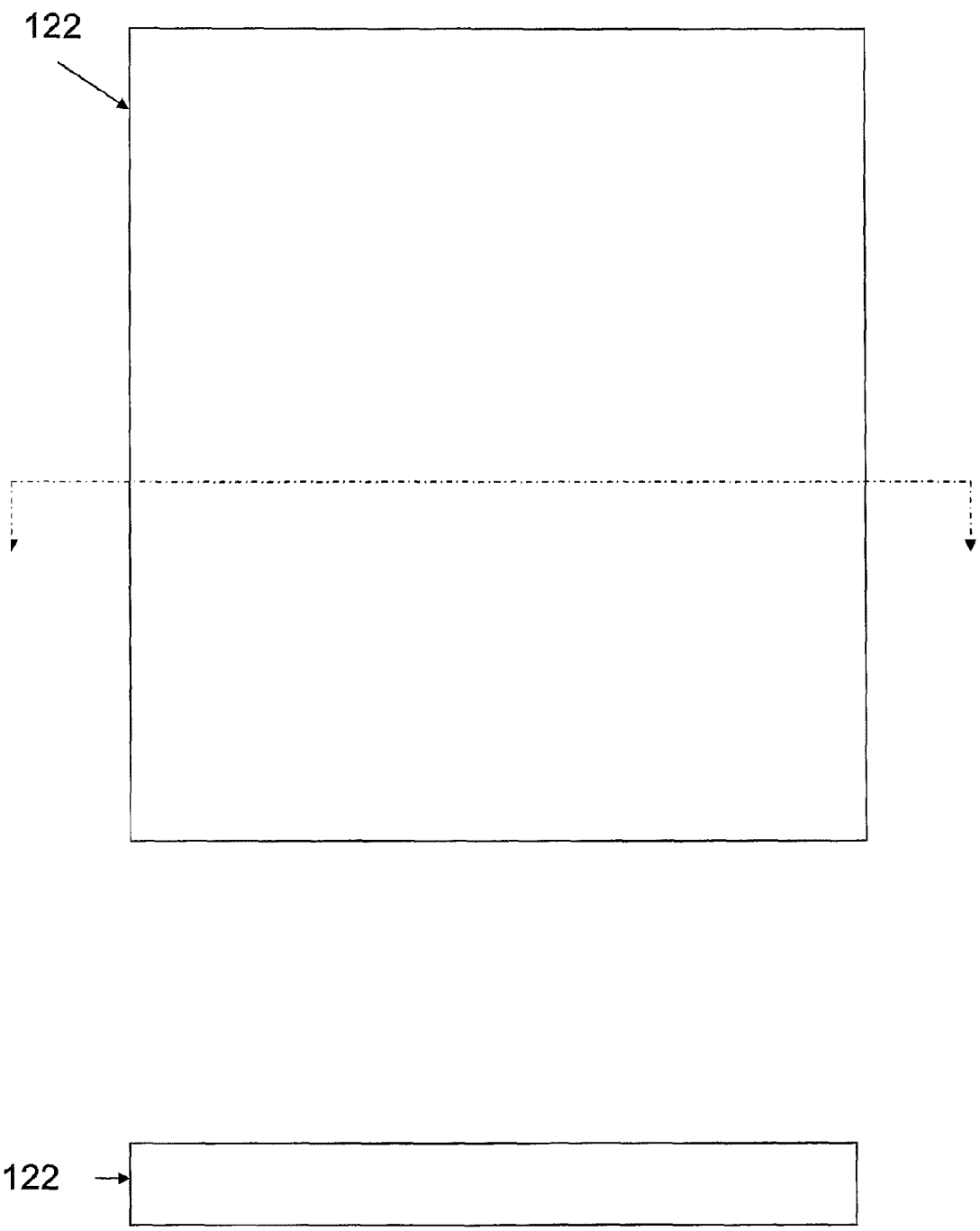

Prototype 1      Prototype 2

104

172
200
202

174

176

176

NANOWIRE SENSOR, NANOWIRE SENSOR ARRAY AND METHOD OF FABRICATING THE SAME

FIELD OF THE INVENTION

The present invention relates to the field of sensors, and in particular, to a method of fabricating a sensor comprising a nanowire on a support substrate with a semiconductor layer arranged on the support substrate. The present invention also relates to a nanowire sensor and a nanowire sensor array.

BACKGROUND OF THE INVENTION

One-dimensional nanostructures such as nanowires and carbon nanotubes are known to be promising candidates for highly sensitive and miniaturized molecular sensors. In particular, sensors based upon semiconductor nanostructures, such as carbon nanotubes, silicon (Si) nanowires, tin oxide ($SnO_2$) nanowires, and indium oxide ($In_2O_3$) nanowires, are particularly promising as their detection is based on the principle of a change in surface charge of the nanostructures in the presence or absence of molecular species.

Due to a high surface-to-volume ratio of nanowires, their electronic conductance may be sensitive enough to the surface species such that single molecule detection becomes possible. However, most of the existing studies based on "bottom-up" nanostructures are limited by complex integration, requiring transfer and positioning of an individual nanostructure, making reliable ohmic contacts and the control of doping concentrations. In addition, delivery of a biological receptor such as enzymes, antibodies, proteins or biological macromolecules that can be used for detection of an analyte remains a challenge in nanostructure sensor devices. The same applies to the delivery of the analyte to be detected. Currently, delivery is normally accomplished by using syringe pumps, micropipettes or atomic force microscopy (AFM) tips (Dip-pen) which is crude, time-consuming and trial and error based, as there is a need to accurately locate the nanowire with precision. Therefore, such delivery methods are only meant for laboratory experiments and are not useful from a product realization point of view.

Several attempts have been made to address these problems so as to enable utilization of nanowires for sensing in a fluidic environment. Amongst them are biosensors which incorporate the capability to deliver various fluids for surface modification, immobilization, detection and testing. One approach is described in United States Patent Application 2002/0117659. This application discloses nanoscale devices having a sample exposure region and a nanowire or functionalized nanowires for detecting the presence or absence of an analyte suspected to be present in a sample, and method for using the same. In United States Patent Application 2002/0117659, the nanowires act as sensors and are capable of a property change when it is in contact with a sample suspected of containing an analyte. According to this patent application, nanowires are fabricated by metal-catalyzed chemical vapor deposition (CVD) and laser catalytic growth.

In United States Patent Application 2002/0117659, the sample exposure region may be any region in close proximity to the nanowire wherein a sample in the sample exposure region addresses at least a portion of the nanowire. An example of the sample exposure region is a fluid flow channel and this may be formed by using a polydimethylsiloxane (PDMS) mold. Channels can be created and applied to a surface, and a mold can be removed. Alternatively, the channels can be made by fabricating a master using photolithography and casting PDMS on the master. The nanowire and the fluidic channels are formed separately by the above-mentioned techniques before being brought together in the same device.

Another approach is described in United States Patent Application 2001/0053535. This application discloses a microscale biosensor for use in the detection of target biological substances including molecules and cells. The biosensor is a microfluidic system with integrated electronics, inlet-outlet ports and interface schemes, high sensitivity detection of pathogen specificity, and allows processing of biological materials at semiconductor interfaces. In particular, the biosensor has a detection chamber, which is a small well or cavity produced by microfabrication techniques in a wafer and provided with sensing elements such as electrodes for sensing a change in an electrical characteristic or parameter (such as resistance or phase) in the chamber owing to the presence of the target microbiological species. To perform sensing, United States Patent Application 2001/0053535 relies on the integrated metal electrodes which operate based on the principle of impedance measurement. To fabricate the sensor, United States Patent Application 2001/0053535 utilizes topside processing for the formation of the integrated metal electrodes. The fluidic channels are fabricated in Si using anisotropic potassium hydroxide (KOH) etching. The sensor is said to be effective in detecting microbiological material in the form of pathogenic strain of bacteria approximately 2 micrometers in dimension.

Fabricating the prior art devices as mentioned above is rather cumbersome and expensive. Therefore, an objective of the present invention is to provide an alternative sensor that advantageously avoids or reduces some of the above-mentioned drawbacks of prior art devices in an easy and economical manner.

SUMMARY OF THE INVENTION

The invention provides a method of fabricating a sensor comprising a nanowire on a support substrate with a first semiconductor layer arranged on the support substrate. The method comprises forming a fin structure from the first semiconductor layer, the fin structure comprising at least two supporting portions and a fin portion arranged there between; oxidizing at least the fin portion of the fin structure thereby forming the nanowire being surrounded by a first layer of oxide; and forming a first insulating layer above the supporting portions; wherein the supporting portions and the first insulating layer form a microfluidic channel. This method can provide an easy and cost effective manner to produce sensors since the method is fully compatible with conventional Si (CMOS) technology and can be carried out in a standard Si foundry. This also means that other CMOS circuitry can be built alongside for signal processing, thereby allowing scalability and reducing production costs.

Nanowires of this type which are CMOS compatible have been disclosed in publications "Ajay Agarwal et al, Transport Characteristics of Si Nanowires in Bulk Silicon and SOI wafers, IEEE Conference on Emerging Technologies-Nanoelectronics" and "N. Singh et al, Room Temperature Coulomb Blockade Oscillations in Gate-All-Around Silicon Nanowire n-MOSFETs, IEEE Conference on Emerging Technologies—Nanoelectronics". Publication "Transport Characteristics of Si Nanowires in Bulk Silicon and SOI wafers" discloses fabrication of n-type silicon nanowires on bulk and SOI wafers using standard CMOS compatible technology and indicated that the nanowire can be integrated with micro-fluidic for biological molecular sensing applications.

Another type of nanowire which is CMOS-compatible has been disclosed in publication "Room Temperature Coulomb Blockade Oscillations in Gate-All-Around Silicon Nanowire n-MOSFETs". This publication describes a fully CMOS-compatible fabrication method for silicon nanowire Gate-All-Around NMOS on semiconductor-on-insulator (SOI) wafers.

In one embodiment of the invention, the method further comprises forming a second layer of oxide on a contact surface of the supporting portions before forming the first insulating layer. The second layer of oxide is typically silicon oxide but not so limited. The second layer of oxide can be about 0.2 micron to about 1 micron thick and is thicker than the first layer of oxide surrounding the nanowire. The second layer of oxide serves to protect the supporting portions for subsequent deposition.

In another embodiment of the invention, the method further comprises forming a first conductive layer on a contact surface of the second layer of oxide before forming the first insulating layer, which contains fluidic channels.

In yet another embodiment of the invention, the method further comprises planarizing the first insulating layer and removing a part of the first insulating layer to form a part of the microfluidic channel to make accessible a contact surface of the first layer of oxide surrounding the nanowire. Examples of the first insulating layer include but are not limited to silicon oxide, any other dielectric material or polymers such as SU8, polydimethylsiloxane (PDMS), acetate, Riston, Kapton, polyimide, and polyester for example. Examples of removing a part of the first insulating layer include but are not limited to selectively etching or dissolving in chemicals like developers for example. The method further comprises removing the first layer of oxide surrounding the nanowire to expose the nanowire and closing the microfluidic channel with a capping layer.

In another embodiment of the invention, the method further comprises doping the fin portion with at least one dopant. The at least one dopant can be either a p-type or an n-type dopant. Examples of p-type dopants include, but not limited to, boron, aluminum, gallium, indium and examples of n-type dopants include, but not limited to, phosphorus and arsenic. Doping the fin portion with an n-type dopant will result in an n-type nanowire and doping the fin portion with a p-type dopant will give rise to a p-type nanowire. Doping a combination of p-type dopants and n-type dopants on separate sections of the fin portion will result in a nanowire with a P/N diode junction. Different nanowire sensors as a result of doping the nanowires with different dopants can be used for different applications. P-type nanowire sensors and N-type nanowire sensors are complementary to each other. If a particular biological species when in contact with the nanowire increases the conductance of P-type nanowire, it decreases the conductance of N-type nanowire. This will indicate that the signal is genuine and not the noise. Also for the ease of signal processing, the increase or decrease in conductance may be required which can be achieved by one of the two types of nanowire sensors for a particular charge of the biological specie or specimen. In addition, P/N diode junction nanowire sensor can be used to measure temperature changes locally at the point of biological activity or reaction.

In another embodiment of the invention, the method further comprises forming a gap in the fin portion by removing a part of the fin portion. In another embodiment of the invention, the method further comprises covering a part of the fin portion with a dielectric material and performing a silicidation process on the fin portion. By doing so, the method can result in different types of nanowire in sensors. Examples of these types of nanowire in sensors include, for example a silicon nanowire with a gap and a silicided nanowire with a gap. These are also called nano-gap types of sensor. In the case of a nanowire sensor comprising a silicon nanowire with a gap, this indicates that there can be a nano-gap between two silicon electrodes. In the case of a nanowire sensor comprising a silicided nanowire with a gap, there can be a semiconductor portion acting as gap between two metal electrodes. Any molecule having conductivity better than the gap can be detected here by shorting the two electrodes. Its operation can be described as an OFF or ON mode. Silicided nano-gap sensor can also be used for localized temperature recording or sensing in biological analysis as the sensor is in a back-to-back diode configuration.

In another embodiment of the invention, a second insulating layer is arranged between the support substrate and the first semiconductor layer. This can give rise to a SOI structure as a SOI structure can comprise of an insulating layer arranged between the support substrate and the first semiconductor layer. The support substrate can include but is not limited to silicon, sapphire, polysilicon, silicon oxide and silicon nitride. The first semiconductor layer can include but is not limited to a material selected from the group consisting of silicon, gallium arsenide and silicon-germanium. The second insulating layer can include but is not limited to silicon oxide, a polymer or a dielectric material.

In another embodiment of the invention, the method further comprises forming at least two openings in the capping layer wherein each opening in the capping layer is positioned at a distance away from each supporting portion. The method further comprises filling each opening with the first conductive layer thereby forming an electrical connection from each opening to the contact surface of the supporting portions.

In another embodiment of the invention, the method further comprises oxidizing the entire fin structure. Thereby a first layer of oxide around the supporting portions is formed.

In another embodiment of the invention, the method further comprises depositing a second semiconductor layer on the support substrate before depositing the first semiconductor layer. Then an electrode is formed from the second semiconductor layer and the electrode is positioned below the nanowire. The method further comprises depositing a third insulating layer above the electrode before forming the fin structure. The second semiconductor layer can include but is not limited to silicon, gallium arsenide and silicon-germanium. The third insulating layer can include but is not limited to silicon oxide or a dielectric material.

In another embodiment of the invention, the method further comprises forming a passivation layer above the first conductive layer before forming the first insulating layer. The passivation layer can include but is not limited to silicon nitride, silicon oxide and aluminum oxide.

The present invention also provides for a nanowire sensor comprising a support substrate, a semiconducting fin structure arranged on the support substrate. The fin structure comprises at least two semiconducting supporting portions and a nanowire arranged there between; and a first insulating layer on a contact surface of the supporting portions. The supporting portions and the first insulating layer form a microfluidic channel.

In an embodiment of the nanowire sensor, the nanowire sensor further comprises a first layer of oxide on the contact surface of the supporting portions, between the contact surface of the supporting portions and the insulating layer.

In another embodiment of the nanowire sensor, the nanowire sensor further comprises a first conductive layer on a contact surface of the first layer of oxide, between the contact surface of the first layer of oxide and the insulating layer.

In another embodiment of the nanowire sensor, the nanowire is located above the support substrate, meaning that there is a space present in between the fin portion and the support substrate, such that the analyte can be in contact with the whole nanowire on all surfaces. Alternatively, the nanowire can be located directly on the support substrate.

In another embodiment of the nanowire sensor, the nanowire comprises of an n-type or a p-type dopant. The nanowire can also be formed as a P/N diode junction. As mentioned above, doping the nanowire with an n-type dopant will result in an n-type nanowire and doping the nanowire with a p-type dopant will give rise to a p-type nanowire. Doping a combination of p-type dopants and n-type dopants on separate sections of the nanowire will result in a nanowire with a P/N diode junction.

In another embodiment of the nanowire sensor, the nanowire comprises a gap.

In another embodiment of the nanowire sensor, the nanowire is silicided.

In another embodiment of the nanowire sensor, at least a surface of the nanowire is adapted to bind a capture molecule, which is able to bind and thus form a complex with an analyte of interest. The analyte of interest can be any chemical or biological compound for which a binding partner exists or can be generated. Examples of biological macromolecules that can be detected using a nanowire sensor (with or without the use of a capture molecule) include, but are not limited to nucleic acids such as deoxynucleic acid (DNA) molecules, ribonucleic acid (RNA) molecules, peptide nucleic acids (PNA), cDNA molecules, or relatively short oligonucleotides containing, for example, from 10 to 50 base pairs (bp). The nucleic acids that is to be detected can be double-stranded, but they also at least possess single-stranded regions or are present, for their detection, as single strands, for example as a result of previous thermal denaturation (strand separation). In this connection, the sequence of the nucleic acids to be detected can be at least partially, or completely, predetermined, i.e., known. Other biological macromolecules that can be detected using a sensor of the invention are proteins, peptides or carbohydrate molecules. The proteins can be composed of the 20 amino acids which are customarily found in proteins, but they can also contain amino acids which do not naturally occur or can, for example, be modified with sugar residues (oligosaccharides) or contain post-translational modifications. It is furthermore also possible to detect complexes, which are composed of several different macromolecular biopolymers, for example complexes composed of nucleic acids and proteins. Illustrative examples of proteins or peptides (to which the invention is of course by now means limited) include marker proteins that are indicative of a physiological status such as cardiac troponin I or T that are specific markers for myocardial infarction or natriuretic peptides such as brain natriuretic peptide (BNP) that can be used as a marker for the diagnosis of acute coronary syndrome or stroke. Other examples of analytes are biological entities such as viruses such as human immune deficiency virus, hepatitis virus (hepatitis A, B or C for example), the Dengue fever virus or cells of any origin (for example, mammalian cells, bacterial cells) or small organic molecules such a drug candidates or environmental toxins such as dioxines or DDT, to name only some of the various numbers of analytes of interested. A suitable capture molecule is chosen depending on the analyte the presence, absence or status of which is to be examined. For example, if the analyte is a nucleic acid, the capture molecule can be a nucleic acid molecule, for example, but not limited to, a short oligonucleotide with about 10 to 50 base pair that comprises a sequence segment that is to a large extent or completely complementary to the nucleic acid that is to be detected. If the analyte is a protein, a biological entity or a small organic molecule, the capture molecule can be an immunoglobulin such as an (monoclonal or polyclonal) antibody or a fragment thereof that has specific binding affinity towards the given analyte itself. Alternatively, the capture molecule may have specific binding affinity towards a label which is attached to the analyte. For example, the analyte such as a protein may be labeled with a commonly used labeling group such as digoxigenin or biotin and the capture molecule may be an antibody that specifically binds digoxigenin or a protein such as streptavidin or avidin that specifically binds biotin. The choice of the respective capture molecule is within the knowledge of the person of average skill in the art.

The surface of the nanowire can be modified, for example, by plasma etching as described in the International Patent Application WO 2005/066343 in order to render the surface suitable for binding. In case of nucleic acid molecules, either the nucleic acid molecule that is to be detected or the capture molecule can be immobilized after plasma etching (cf. WO 2005/066343). In the first case, no capture molecule is needed. Other approaches to modify the surface of the nanowire, if such a modification is necessary for immobilization of a capture molecule, are silanisation of the surface with silane compounds having a reactive group such as such as epoxy groups or amine groups through which covalently coupling with a respective group (for example an activated carboxyl, hydroxyl or thiol group can occur). Suitable silane molecules are preferably alkylsilyl compounds with the general formula $X—(CH_2)_p—SiR_1R_2R_3$ (I), wherein in formula (II), p represents an integer between 1 and 20, and preferably 1 and 10, wherein X is a reactive coupling group such as $NH_2$ or an epoxide, and wherein the silane molecules are immobilized on the surface of the nanowire by means of at least one of the residues $R_1$, $R_2$ and $R_3$, which may independently of one another be hydrogen, halogen, OR', NHR', NR'R", wherein R' and R" is alkyl (typically methyl, ethyl, propyl, butyl, etc., n=preferably 0-5, particularly preferably n=0-2). Compounds such as these are commercially available, for example from ABCR/Gelest (with simpler compounds also being available from Fluka or Aldrich). These compounds are particularly advantageous when a nanowire that is based on silicon is used. In this case, a covalent bond is produced between the silane molecules via free hydroxy groups on the surface of the nanowire. Other illustrative examples of suitable silane compounds include (3-aminopropyl)trimethoxysilane-tetramethoxysilane (APTMS) or (3-aminopropyl)triethoxysilane-tetramethoxysilane, to name only a few. A respective approach using APTMS silanization is described in Pharmaceutical Discovery, Oct. 1, 2005 Immobilization of Oligonucleotides on a Silicon Surface, Di Pietro et al. Modification of the nanowire surface by such silane compounds is also suitable for immobilizing capture molecules such as antibodies on small ligands such as biotin thereon. For example, a silane compound with an epoxide group can first react with an N-Hydroxysuccinimide (NHS) activated bifunctional ester which in turn can with react with via conventional coupling (for example using carbodiimide coupling by means 1-Ethyl-3-(3-dimethylaminopropyl)-carbodiimide (EDC) with an antibody that serves as capture molecule for the desired analyte. These coupling technologies are well known in the art and within the capability of the person of average skill in the art. The surface of the nanowire may also be covered with a biological-compatible binding layer, wherein the biological-compatible binding layer is capable of binding capture molecules to the surface of the nanowire. Examples of a biological-compatible layer which can be used include Collagen (Types I, III, or V), Chitosan, Heparin, as well as additional components such as Fibronectin, Decorin, Hyaluronic Acid, Chondroitin Sulphate, Heparan Sulphate and growth factors (TGFβ, bFGF). Another example of a biological-compatible binding layer includes amino-silane film, to which thiol-modified Deoxyribonucleic acid (DNA) oligomers acting as capture molecules can be immobilised via a heterobifunctional cross linking molecule bearing, for example, both thiol- and amino-reactive moieties.

In another embodiment of the nanowire sensor, the nanowire sensor further comprises a capping layer on the insulating layer to close the microfluidic channel.

In another embodiment of the nanowire sensor, the capping layer comprises at least two openings, each opening is positioned at a distance away from each supporting portion.

In another embodiment of the nanowire sensor, the nanowire sensor further comprises a second insulating layer arranged between the support substrate and the semiconductor fin structure.

In yet another embodiment of the nanowire sensor, the nanowire sensor comprises a passivation layer over the first conductive layer, between the first conductive layer and the first insulating layer.

In another embodiment of the nanowire sensor, the nanowire sensor further comprises an electrode. The electrode is positioned below the nanowire and between the support substrate and the nanowire.

In another embodiment of the nanowire sensor, the nanowire sensor further comprises a third insulating layer arranged between the electrode and the nanowire.

The present invention also provides for a nanowire sensor array comprising a plurality of nanowire sensors wherein each nanowire sensor is individually addressable via the supporting portions.

In an embodiment of the nanowire sensor array, the array comprises a plurality of microfluidic channels.

In another embodiment of the nanowire sensor array, the array comprises a control unit for individually addressing each nanowire sensor.

In yet another embodiment of the nanowire sensor array, the array comprises using one nanowire sensor as a reference and another nanowire sensor for measurement.

The present invention also provides for a detection method using the nanowire sensor array. The method comprises using one nanowire sensor as a reference and using another nanowire sensor for measurement.

The present invention also provides for a method of detecting an analyte. The method comprises measuring a first electrical signal of the nanowire sensor, contacting the nanowire sensor with a sample suspected to contain the analyte of interest in order to immobilize the analyte on the nanowire, measuring a second electrical signal of the nanowire and comparing the measured first electrical signal with the second electrical signal, thereby detecting the presence or absence of the analyte.

In another embodiment of the method of detecting an analyte, the method further comprises providing the surface of the nanowire with capture molecules that bind the analyte; and then bringing a sample suspected to containing the analyte of interest in contact with the capture molecule in order to enable complex formation between the analyte and the capture molecule.

In another embodiment of the method of detecting an analyte, when the difference in the first electrical signal and the second electrical signal exceeds a threshold value, the presence of an analyte is detected.

In another embodiment of the method of detecting an analyte, the analyte is a biological macromolecule, a biological entity or a small organic molecule.

BRIEF DESCRIPTION OF THE DRAWINGS

The following figures illustrate various exemplary embodiments of the present invention. However, it should be noted that the present invention is not limited to the exemplary embodiments illustrated in the following figures and also explained in the following.

DETAILED DESCRIPTION OF THE INVENTION

Exemplary embodiments of a sensor comprising a nanowire on a support substrate with a semiconductor layer arranged on the support substrate are described in details below with reference to the accompanying figures. In addition, the exemplary embodiments described below can be modified in various aspects without changing the essence of the invention.

Figure 1:
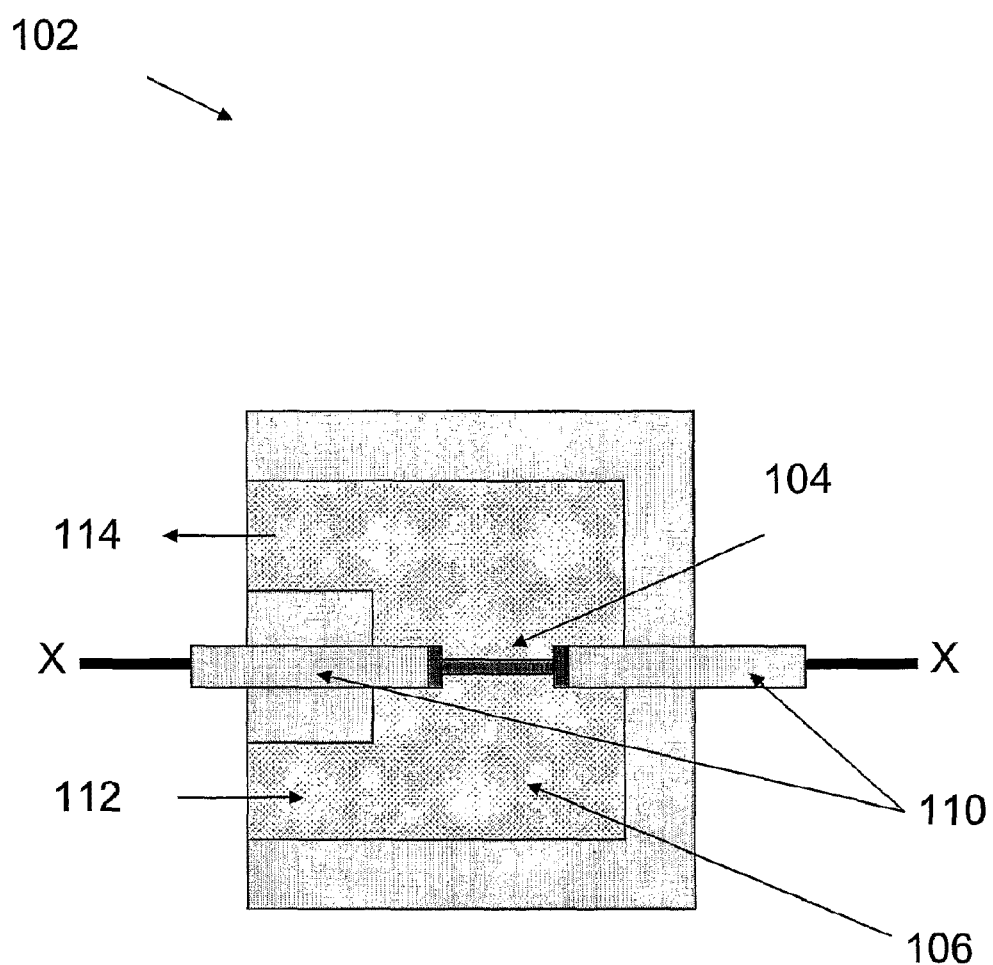
FIG. 1 shows a top view of a nanowire sensor according to a first embodiment of the present invention.

FIG. 1 shows a top view of a nanowire sensor 102 comprising a single nanowire 104 made from semiconductor materials integrated with a fluidic channel 106 according to a first embodiment of the present invention. The nanowire sensor 102 can serve as a block solution for a stand alone device or for other lab-on-a-chip (LOC) applications. With reference to FIG. 1, the nanowire 104 is positioned across the fluidic channel 106 and has two respective ends. Each end of the nanowire 104 is connected to and supported by a respective supporting portion (not shown) made from semiconductor materials. Each end of the nanowire 104 is further connected to a respective electrical contact pad 110 via the supporting portion. The fluidic channel 106 has an inlet port 112 and an outlet port 114, either or both of which can be connected to and from other blocks of the LOC.

Cross-sections through the sensor 102 along the line X-X shown in FIG. 1 during different fabrication steps are now shown in FIG. 2A to FIG. 2I. Features already described with respect to FIG. 1 will not be described again here. Nevertheless, same reference signs refer to identical components.

Figure 2A:
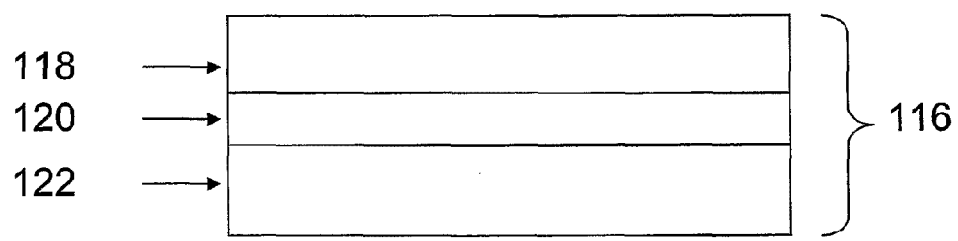
FIGS. 2A to 2I show cross-sectional views through the nanowire sensor during different fabrication steps according to the first embodiment of the present invention.

FIG. 2A shows a starting SOI structure 116. The SOI structure 116 includes a semiconductor device layer 118 separated vertically from a support substrate 122 by an insulating layer or a buried oxide (BOX) layer 120. The BOX layer 120 electrically isolates the device layer 118 from the support substrate 122. The SOI structure 116 may be fabricated by any standard techniques, such as wafer bonding or a separation by implantation of oxygen (SIMOX) technique.

In the illustrated embodiment of the invention in FIG. 2A, the device layer 118 is typically Si but may be formed from any suitable semiconductor materials including, but not limited to poly-silicon, gallium arsenide (GaAs), germanium or silicon-germanium (SiGe). The device layer 118 may be initially doped with n-type dopants to render it n-type or p-type dopants to render it p-type. The thickness of the device layer 118 is typically in the range of about 2 nanometers to about 1 micrometer. The support substrate 122 may be formed from any suitable semiconductor materials including, but not limited to, Si, sapphire, polycrystalline silicon (polysilicon), silicon oxide ($SiO_2$) or silicon nitride ($Si_3N_4$). The BOX layer 120 is usually an insulating layer. The BOX layer 120 is typically $SiO_2$ based on tetraethylorthosilicate (TEOS), Silane ($SiH_4$) or thermal oxidation of Si, glass, silicon nitride ($Si_3N_4$) or silicon carbide having a thickness in the range of about 2 nanometers to about few micrometers, but is not limited to this.

In an intermediate step after starting with the SOI wafer 116 with a Si device layer 118, a photoresist layer (not shown) is applied or coated onto the top surface of the Si device layer 118. The photoresist layer is then patterned to form a FIN portion arranged in between two supporting portions by standard photolithography techniques. Subsequently, using the patterned photoresist layer as a mask, portions of the Si device layer 118 not covered by the mask is etched away by an anisotropic etching process such as Reactive Ion Etching (RIE).

Figures 1, 2B:
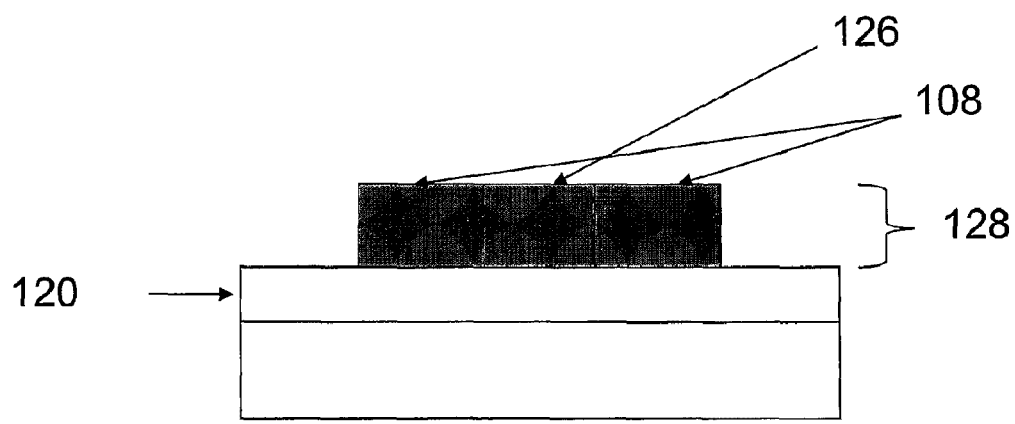
Figures 2, 2B:
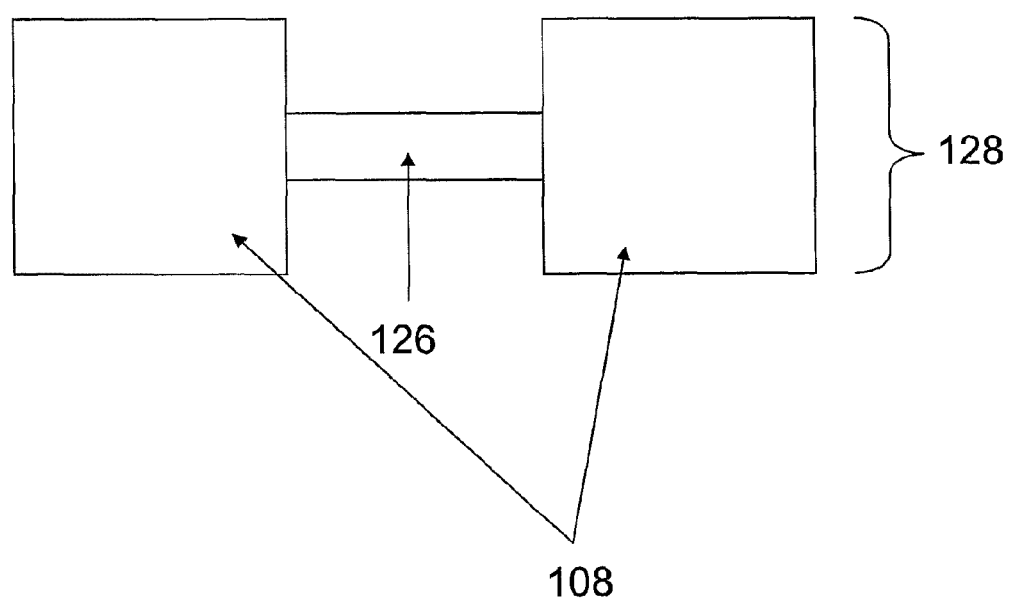

In FIG. 2B-1, a resultant Si FIN structure 128 comprising of a Si FIN portion 126 arranged in between and connected at each end to a respective Si supporting portion 108 is formed on the BOX layer 120. The Si FIN portion 126 acts as a bridge linking the respective Si supporting portion 108. FIG. 2B-2 shows the top view of the FIN structure. The Si supporting portions 108 are typically blocks with a wider dimension when compared to the Si FIN portion 126. FIG. 2B-2 shows that the Si FIN portion 126 is arranged in the middle between the two Si supporting portions 108. Alternatively, the Si FIN portion 126 can also be arranged towards either side of the two Si supporting portions 108. The resultant FIN structure 128 is analogous to a FIN portion connecting a source region and a drain region in a FINFET structure. FINFET structures of this kind have been described in U.S. Pat. No. 6,764,884 and U.S. Pat. No. 6,885,055 for example. After forming the FIN structure 128, the photoresist layer is removed or stripped away by a photoresist stripper (PRS). Photoresist stripping, or simply 'resist stripping', is the removal of unwanted photoresist layer from the wafer. Its objective is to eliminate the photoresist material from the wafer as quickly as possible, without allowing any surface materials under the photoresist to be attacked by the chemicals used. In this regard, any other suitable techniques or processes may also be used in order to provide greater flexibility with respect to forming of the FIN structure 128 comprising the Si FIN portion 126 arranged in between two Si supporting portions 108 on the BOX layer 120.

The structure 128 comprising the Si FIN portion 126 arranged in between the two Si supporting portions 108 is then subjected to a self-limiting oxidation process. As described by Jakub Kedzierski and Jeffery Bokor, J. Vac. Sci. Technol. B 15(6), November/December 1997, self-limiting oxidation is a process whereby a semiconductor material such as but not limited to Si, silicon-germanium, germanium, polycrystalline silicon and polycrystalline germanium is oxidized in dry oxygen ($O_2$) for an approximate range of temperatures between about 800° C. to about 1200° C. and for durations between about 2 to about 10 hours to produce Si cores surrounded by a $SiO_2$ portion or film. During the self-limiting oxidation process, Si is being oxidized to $SiO_2$. Since $SiO_2$ occupies a larger volume than Si, as the oxidation progresses, newly formed inner oxide layers tend to push the older oxide layers further out. The high viscosity of $SiO_2$ makes this radial plastic deformation of outer oxide layers difficult, and as a result a large normal stress is generated back toward the Si—$SiO_2$ interface. Normal stress at the Si interface slows the oxidation rate by making the transition of Si to $SiO_2$ less energetically favorable. Eventually, at a certain radius, oxidation slows down to an insignificant rate, resulting in an oxidized structure comprising of one or more thin Si cores surrounded by the $SiO_2$ film or portion. The number and dimensions of the Si cores vary according to temperature and duration of oxidation and can be controlled by setting the respective experimental conditions and aspect ratio of the initial structure.

Figure 2C:
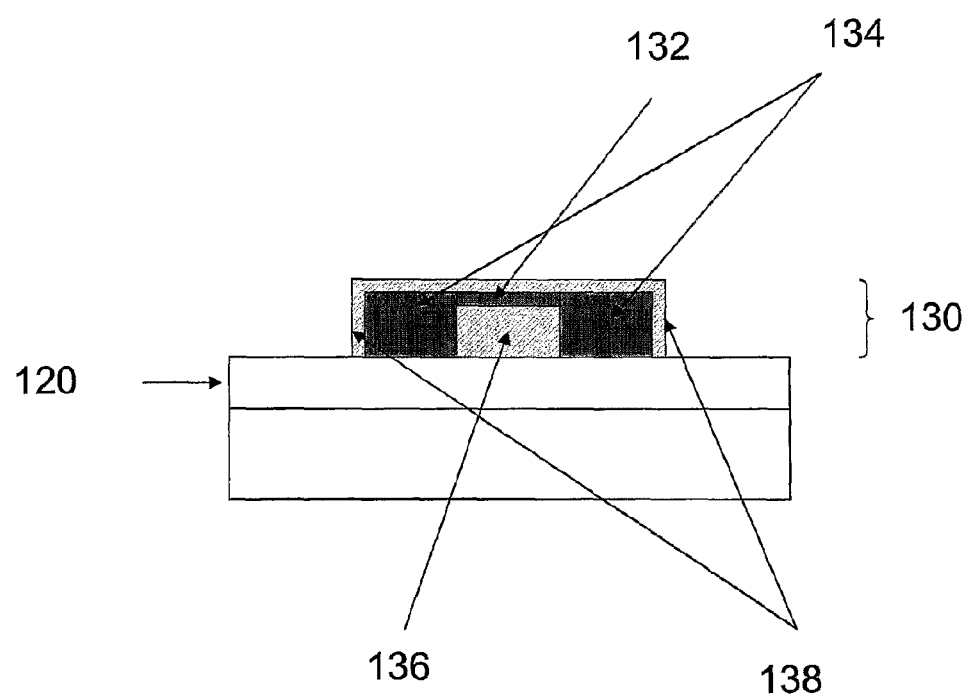

In FIG. 2C, an oxidized structure 130 comprising of a thin Si core 132 surrounded by a $SiO_2$ portion or film 136 arranged in between two thicker Si cores 134 surrounded by another $SiO_2$ portion or film 138 is formed after the self-limiting oxidation process is performed on the entire structure 128. The process will convert the structure 128 comprising the Si FIN portion 126 arranged in between the two Si supporting portions 108 into an oxidized structure 130 comprising of a thin Si core 132 surrounded by a $SiO_2$ portion or film 136 arranged in between two thicker Si cores 134 surrounded by another $SiO_2$ portion or film 138. The Si core 132 surrounded by the $SiO_2$ portion or film 136 is formed as a result of the oxidation of the Si FIN portion 126. The two thicker Si cores 134 surrounded by the $SiO_2$ portion or film 138 are formed as a result of the oxidation of the two Si supporting portions 108.

However, oxidation can also be limited to just the Si FIN portion 126 (not illustrated in FIG. 2C). Subjecting only the Si FIN portion 126 to oxidation will give rise to the thin Si core 132 of reduced dimensions, surrounded by the $SiO_2$ portion or film 136. The thin Si core 132 is supported at the respective ends by the two supporting Si portions 108 which are not oxidized. Either of the embodiments can be realized depending on requirements.

In both of the above-described embodiments where the self-limiting oxidation process is carried out, the thin Si core 132 can be positioned on or above the box layer 120 and at any height between the non-oxidized Si supporting portions 108 or between the resultant Si cores 134 of the Si supporting portions 108. The thin Si core 132 eventually forms the nanowire 104 in the present invention.

Figure 2D:
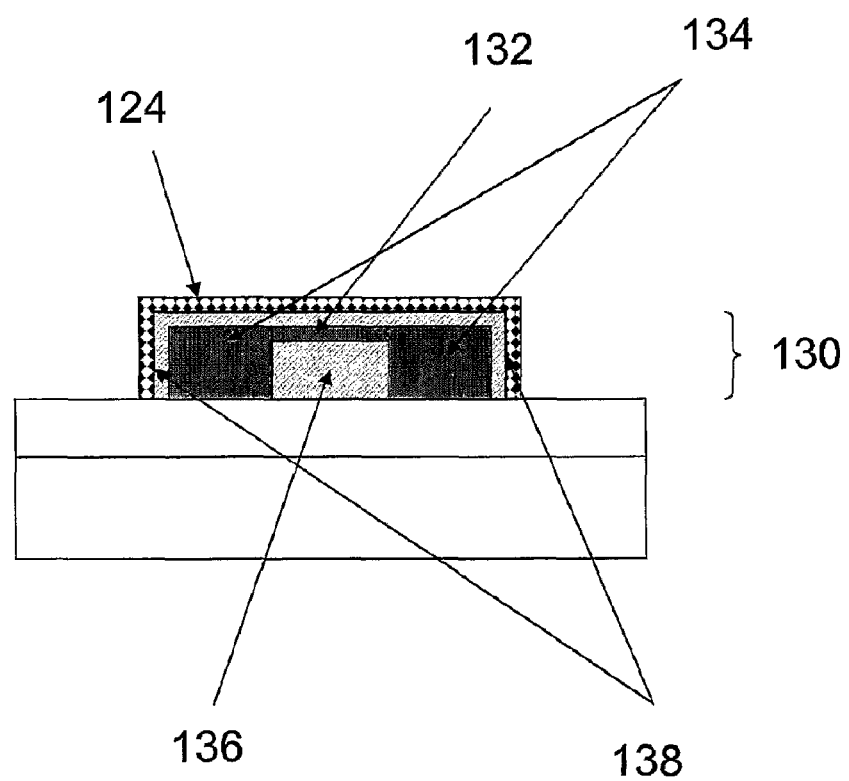

After the self-limiting oxidation process, a layer of $SiO_2$ 124 is being deposited over the oxidized structure 130 as shown in FIG. 2D. This layer of $SiO_2$ 124 may be the same as the $SiO_2$ portion or film 136 surrounding the thin Si core 132 and the $SiO_2$ portion or film 138 surrounding the two thicker Si cores 134. However, the layer of $SiO_2$ 124 is relatively thicker compared to the respective $SiO_2$ portions or films 136, 138 and serves to protect the two thicker Si cores 134 for subsequent metal deposition or etching process. The layer of $SiO_2$ 124 and the respective $SiO_2$ portions or films 136, 138 may merge together if they are of the same material.

In an intermediate step, after the deposition of the layer of $SiO_2$ 124, a layer of photoresist (not shown) is deposited over the layer of $SiO_2$ 124. Contact openings or recesses are formed in the photoresist layer by standard photolithography techniques to make accessible the layer of $SiO_2$ 124 over the respective top surfaces of the Si supporting portions 108 or the layer of $SiO_2$ 124 over the $SiO_2$ portion 138 surrounding the two thicker Si cores 134. Portions of the layer of $SiO_2$ 124 and the $SiO_2$ portion or film 138 surrounding the two thicker Si cores 134 are further etched to expose portions of the two thicker Si cores 134.

Figure 2E:
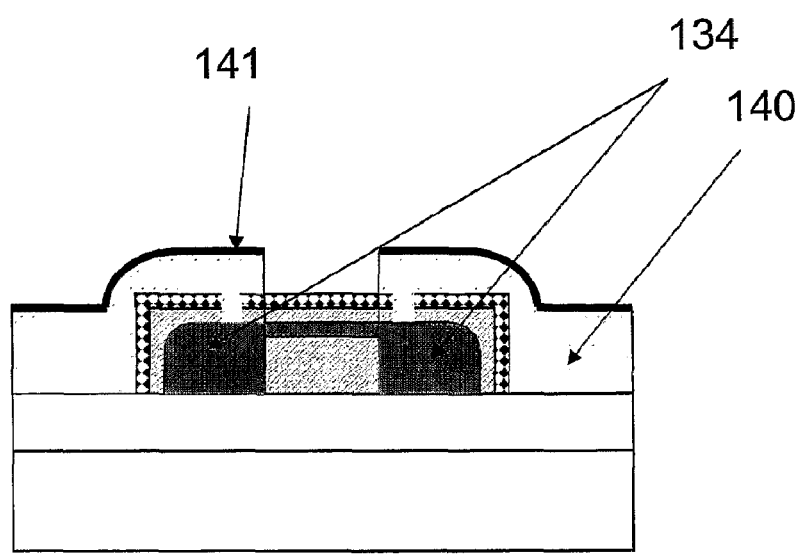

Next in FIG. 2E, a conductive layer 140 about 1000 to 15000 Angstrom thick is deposited into the contact openings, portions of the conductive layer 140 being in contact with the two thicker Si cores 134. In an illustrative embodiment, each of the portion of the conductive layer 140 in contact with the thicker Si core 134 may be a 0.18 micron via or hole. The conductive layer 140 is usually a metal or a metal alloy. The metals can be but are not limited to aluminum, aluminum alloyed by Si, Copper (Cu) in various ratios, tantalum, tantalum nitride, titanium, titanium nitride, or a combination of these metals for example. After deposition of the conductive layer 140, contact lines (not shown in FIG. 2E) are further defined from the contact openings to the electrical contact pads 110 (as shown in FIG. 1) using standard lithography and metal etch techniques. The photoresist layer is then removed or stripped away by a photoresist stripper.

Following the deposition of the conductive layer 140 into the contact openings, a passivation layer 141 is deposited over the conductive layer 140 as shown in FIG. 2E. The passivation layer 141 may be formed from any suitable semiconductor materials including, but not limited to, Si, sapphire, polycrystalline silicon (polysilicon), silicon oxide ($SiO_2$) or silicon nitride ($Si_3N_4$). The passivation layer may protect metal lines from any reaction with the test solutions and also helps in reducing non-specific binding of analytes or molecules in areas other than the thin Si core or nanowire.

Figure 2F:
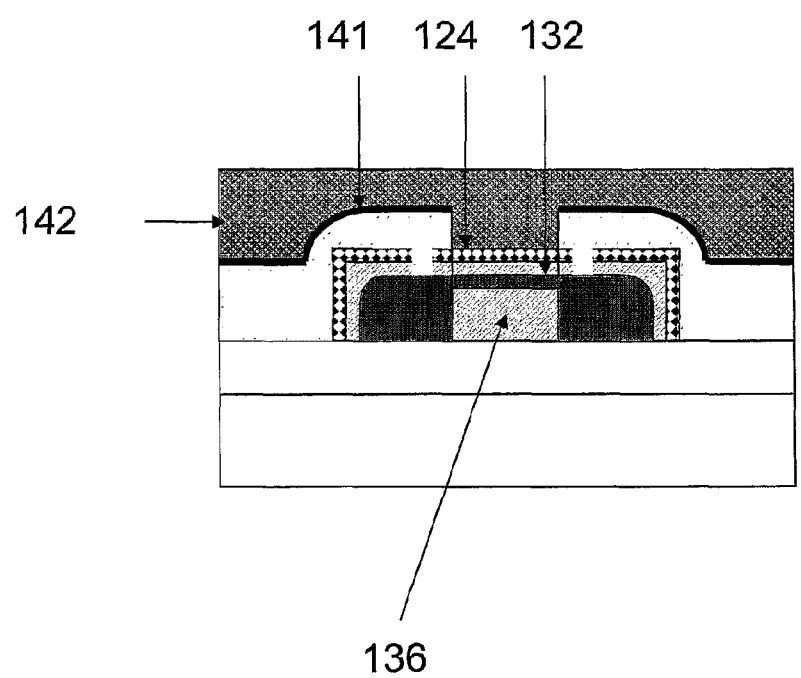

Then in FIG. 2F, an insulating layer 142 of thickness in the range of about 1 micrometer to about hundreds of micrometers is deposited onto the passivation layer 141 and onto the layer of $SiO_2$ 124 over the top surface of the $SiO_2$ portion 136 surrounding the thin Si core 132. The insulating layer 142 can be an oxide layer (such as $SiO_2$), polymers such as SU8, polydimethylsiloxane (PDMS), acetate, Riston, Kapton, polyimide, and polyester for example or other dielectric materials. The thickness of the insulating layer 142 provides some depth for the formation of a channel thereafter. After deposition, the insulating layer 142 may be further planarized using polishing processes which include one of chemical mechanical polishing (CMP), chemical polishing, mechanical polishing or ion milling. The polishing process provides a smooth surface for further deposition of a capping layer. But for polymers like SU8, planarization is not required.

Figure 2G:
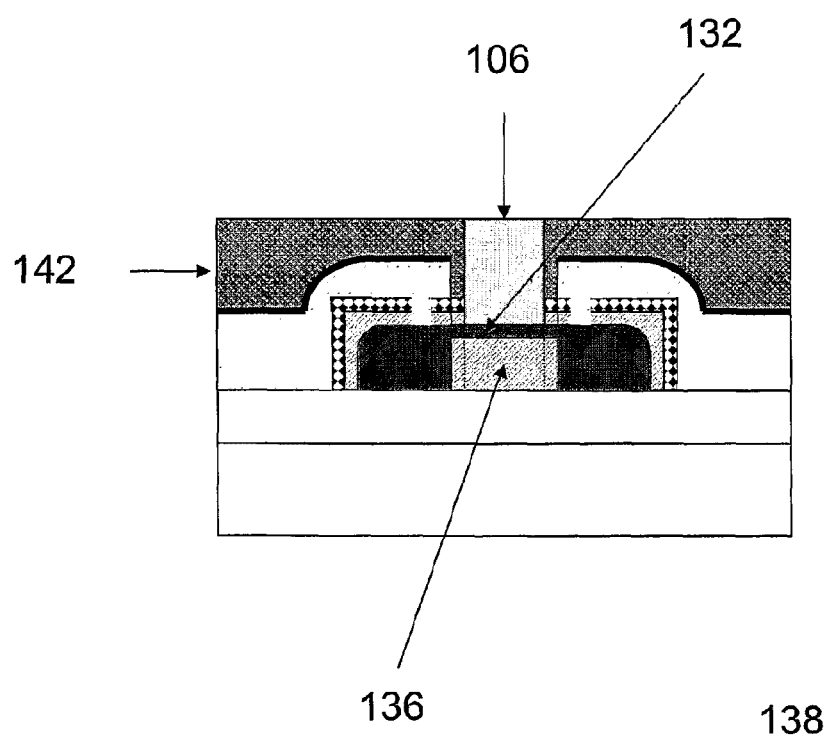
Figure 2H:
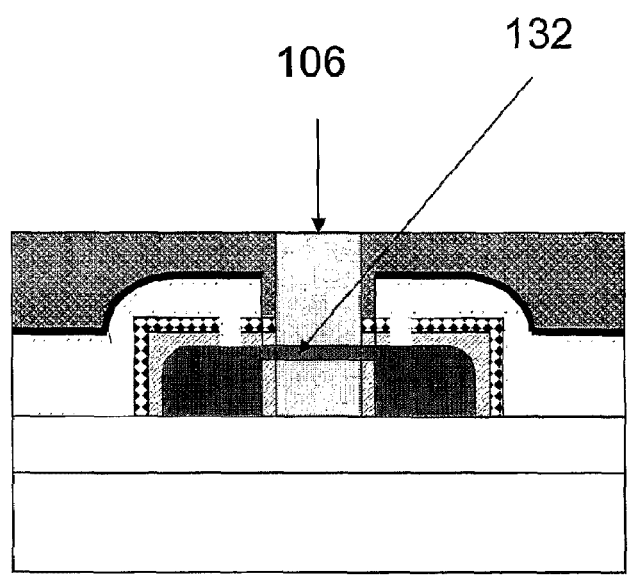

In another intermediate step, a further layer of photoresist (not shown) is deposited over the insulating layer 142. The photoresist layer is patterned by standard photolithography techniques to form an opening over the region where a channel 106 is to be formed in the insulating layer 142. In FIG. 2G, using the photoresist layer as a mask, a portion of the insulating layer 142 is etched away by an etching process, such as dry etching to form a channel 106 making accessible the top surface of the $SiO_2$ portion 136 surrounding the thin Si core 132 but leaving the $SiO_2$ portion 136 at the thin Si core 132. Dry etching is an etching process that does not utilize any liquid chemicals or etchants to remove materials from the wafer, generating only volatile byproducts in the process. Dry etching may be accomplished by any of the following: 1) through chemical reactions that consume the material, using chemically reactive gases or plasma; 2) physical removal of the material, usually by momentum transfer; or 3) a combination of both physical removal and chemical reactions. In an exemplary embodiment, if the insulating layer 142 is a polymer like SU8 for example, it may not be necessary to deposit or coat another layer of photoresist in order to form the opening for subsequent formation of the channel 106, as SU8 is also a type of photoresist. Ultra-violet (UV) light or electron beam can be shined through a mask and after development and baking; a channel 106 can be formed in the insulating layer 142.

After the dry etching step, the photoresist layer (if it has been earlier deposited) is then removed or stripped away by a photoresist stripper. To release the thin Si core 132 from the surrounding $SiO_2$ portion 136, an etching process such as wet etching is used. Contrary to dry etching, wet etching is the removal of material by immersing the wafer in a liquid bath of chemical etchant. The chemical etchant can be hydrofluoric acid (HF), including diluted HF, buffered HF such as Buffered Oxide Etch (BOE) and HF vapors for example, but any other suitable etchants for removal of $SiO_2$ can be used. However, it is to be noted that the $SiO_2$ portion 136 around the thin Si core 132 may not be fully removed by the etching process. The $SiO_2$ portion 136 may be reduced to a few nanometers on the thin Si core 132 or be partially removed from the thin Si core 132 surface, for example top surface while bottom surface of the thin Si core 132 remains in contact with the $SiO_2$ portion 136. This may serve to give physical strength to the thin Si core 132. After the etching steps, it can be seen from FIG. 2H that the resultant structure comprises a thin Si core 132 (which forms the nanowire 104), which may or may not be covered by a $SiO_2$ portion 136 housed in the channel 106.

Figure 2I:
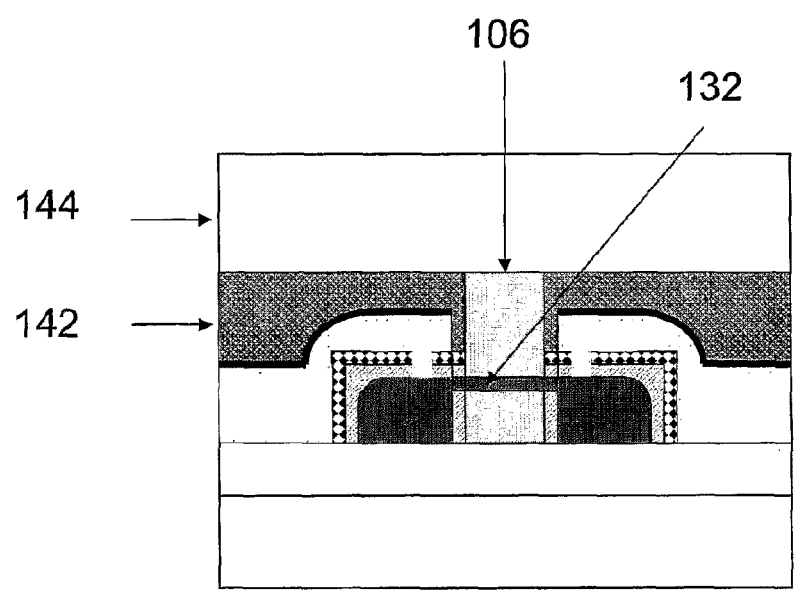

In FIG. 2I, further to the release of the thin Si core 132 or nanowire 104, a capping layer 144 is deposited onto the top surface of the insulating layer 142. The capping layer 144 may be formed from any suitable materials including, but not limited to, silicon, glass, silica, an organic polymer or PDMS. The capping layer 144 can comprise fluidic input and output ports and can serve to enclose the channel 106 housing the thin Si core 132 or the nanowire 104. In another embodiment, the capping layer 144 may also have openings or channels complementary to the fluidic channel 106 in the insulating layer 142 so as to allow for a bigger channel allowing a greater volume of fluid flow through the channel. This completes the integrated sensor device including a thin Si core 132 or nanowire 104 and a fluidic channel 106.

Figure 3:
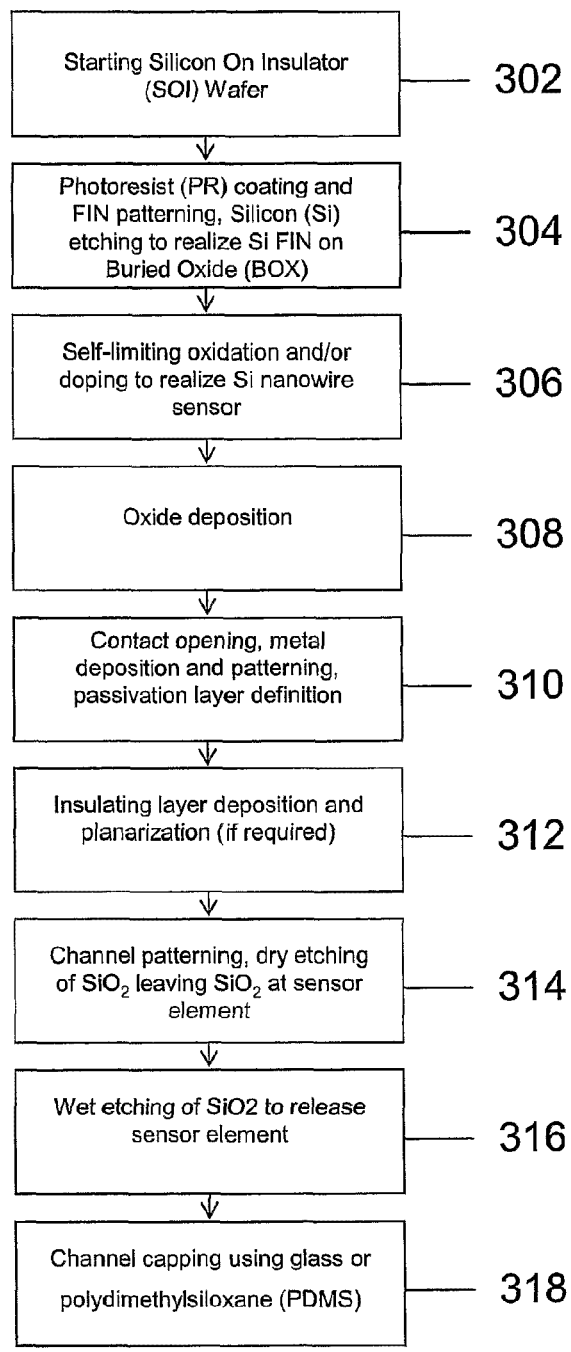
FIG. 3 shows a flow chart of a method of fabricating a sensor comprising a nanowire on a support substrate with a first semiconductor layer arranged on the support substrate according to the first embodiment of the present invention.

The flow diagram of the method 300 of fabricating a sensor comprising a nanowire on a support substrate with a semiconductor layer arranged on the support substrate as disclosed in FIG. 2A to FIG. 2I is shown in FIG. 3. The method 300 begins at 302 with a starting SOI structure 116 comprising a Si device layer 118 separated vertically from a support substrate 122 by a buried oxide (BOX) layer 120. Next, in 304 a photosensitive layer is coated onto a top surface of the device layer 118. The photoresist layer is then patterned to form a FIN portion arranged in between two supporting portions by standard photolithography techniques. Using the FIN pattern photoresist layer as a mask, portions of the Si device layer 118 not covered by the mask are etched away to realize a structure 128 comprising of a Si FIN 126 arranged in between two Si supporting portions 108 on the BOX layer 120. In 306, the structure 128 comprising the Si FIN 126 between two Si supporting portions 220 is further subjected to a self-limiting oxidation process to achieved an oxidized structure 130 comprising two thicker Si cores 134 with a thinner Si core 132 arranged in between, all surrounded by $SiO_2$ portions 136, 138. Subsequently in 308, a layer of oxide 124 is deposited on the oxidized structure 130. Next in 310, contact openings are formed for further metal layer 140 deposition onto the layer of $SiO_2$ 124 over the respective top surfaces of the $SiO_2$ portion 138 surrounding the two thicker Si cores 134, with portions of the metal layer 140 being in contact with the two thicker Si cores 134. A further passivation layer 141 is deposited over the metal layer 140. Then in 312, an insulating layer 142 is deposited onto the passivation layer 141 and onto the layer of $SiO_2$ 124 over the top surface of the $SiO_2$ portion 136 surrounding the thinner Si core 132. The insulating layer 142 is further planarized. But if the insulating layer 142 includes polymers like SU8, planarization is not required. In 314, a portion of the insulating layer 142 is etched by dry etching to form a channel 106 making accessible the top surface of the $SiO_2$ portion 136 surrounding the thinner Si core 132 but leaving the $SiO_2$ portion 136 at the thinner Si core 132. Then in 316, the $SiO_2$ portion 136 surrounding the thinner Si core 132 is etched by wet etching to release the nanowire 104 or sensor element. Finally in 318, the channel 106 is capped using a suitable capping substrate such as glass or PDMS for example.

Figure 4A:
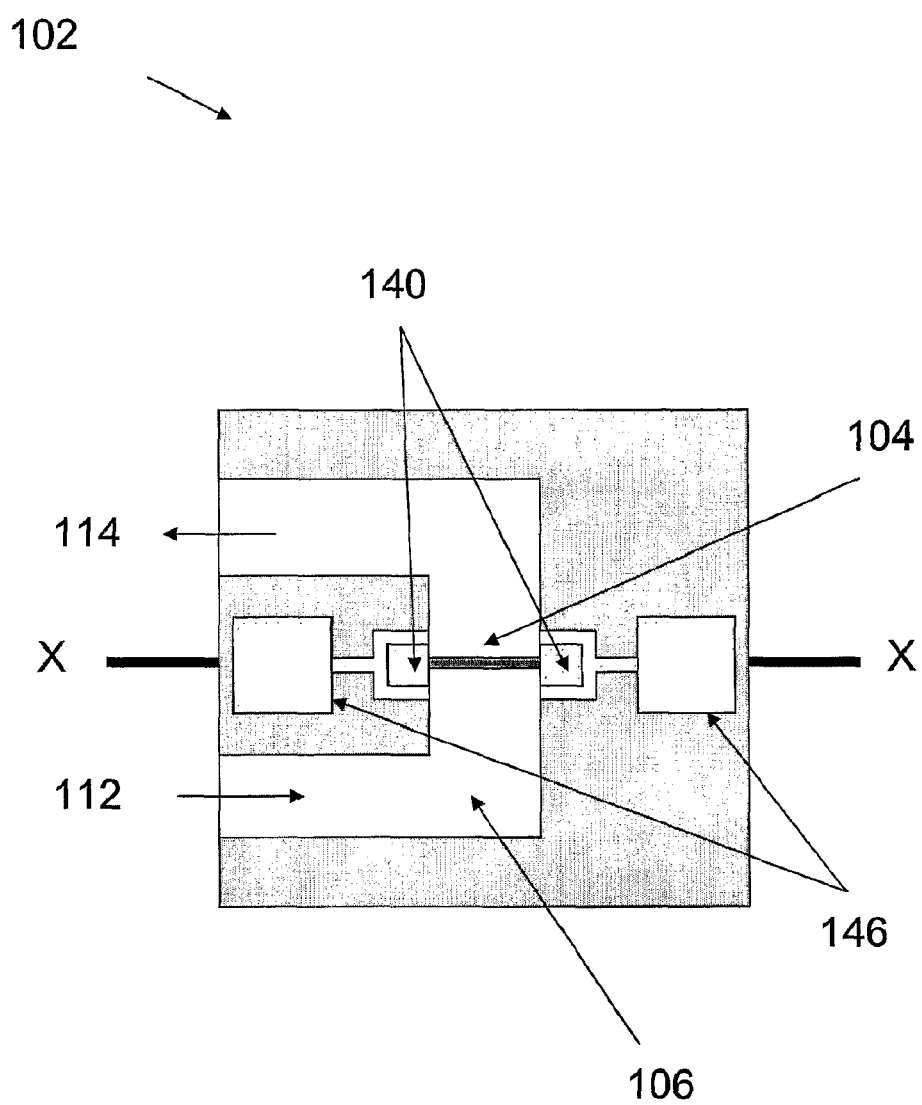
FIG. 4A shows a top view of a nanowire sensor with through vias on capping layer according to a second embodiment of the present invention and FIG. 4B shows a cross-sectional view through the nanowire sensor according to the second embodiment of the present invention.
Figure 4B:
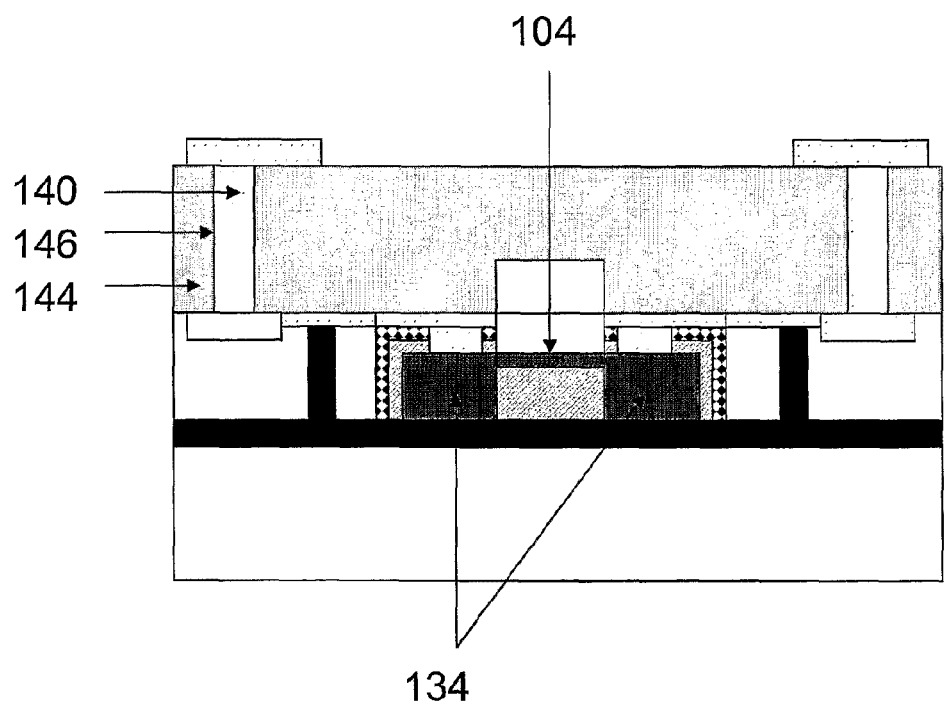

Various capping schemes are proposed for closing the channel. FIG. 4A shows a top view of a sensor 102 with a capping scheme according to a second embodiment of the present invention and FIG. 4B shows a cross-section through the sensor 102 of FIG. 4A at X-X. The capping scheme disclosed in FIG. 4A and FIG. 4B according to the second embodiment of the present invention is different from the capping scheme disclosed in FIG. 1 according to the first embodiment of the present invention. In the sensor 102 as shown in FIG. 4A, the nanowire 104 is positioned across the fluidic channel 106 and has two ends. Each end of the nanowire 104 is connected via a conductive layer 140 to a through wafer via 146. The fluidic channel 106 has an inlet port 112 and an outlet port 114, either or both of which can be connected to and from other blocks of the LOC. In FIG. 4B, the capping layer 144 can be a thin wafer with large sized through wafer vias 146. The through wafer vias 146 can be formed by standard lithography and etching techniques. Thereafter, the through wafer vias 146 are filled with a conductive layer 140 thereby forming an electrical connection from each via 146 to each respective thicker Si core 134. Each end of the nanowire 104 is supported by a respective thicker Si core 134. In FIG. 4A and FIG. 4B, each through wafer via 146 in the capping layer 144 is positioned at a distance away from each respective thicker Si core 134, and therefore away from the nanowire 104. One advantage of the arrangement is the elimination of possible misalignment arising during creation of the through wafer vias 146 before deposition of the conductive layer 140. If the vias 146 are positioned too close to the nanowire 104, even any slight misalignment will result in the conductive layer 140 being deposited onto the nanowire 104.

Figure 5A:
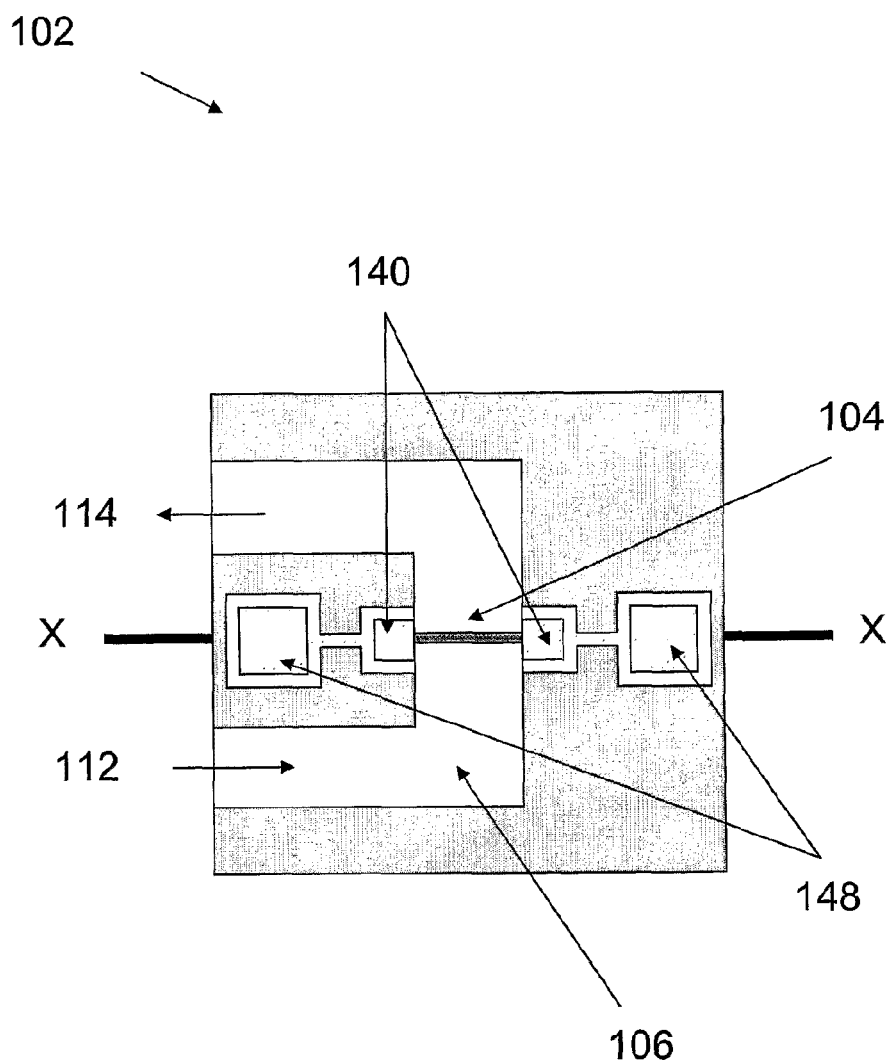
FIG. 5A shows a top view of a nanowire sensor with bond pad openings on capping layer according to a third embodiment of the present invention and FIG. 5B shows a cross-sectional view through the nanowire sensor according to the third embodiment of the present invention.
Figure 5B:
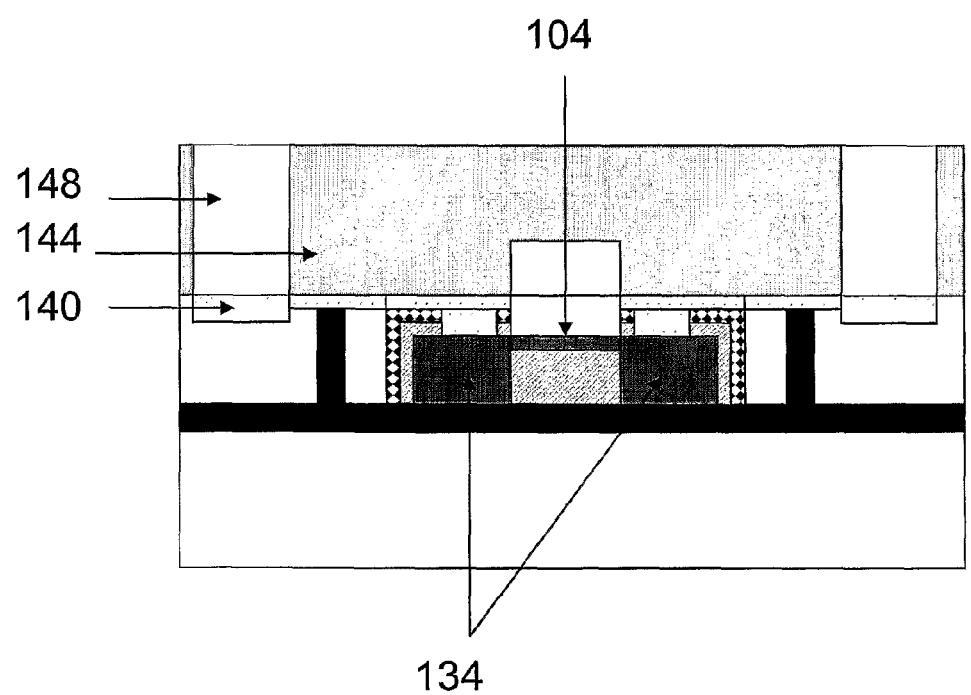

FIG. 5A shows a top view of a sensor 102 with another capping scheme according to a third embodiment of the present invention and FIG. 5B shows a cross section through the nanowire sensor 102 of FIG. 5A at X-X. The capping scheme disclosed in FIG. 5A and FIG. 5B according to the third embodiment of the present invention is different from the capping scheme disclosed in FIG. 1 according to the first embodiment of the present invention and in FIG. 4A and FIG. 4B according to the second embodiment of the present invention. In the sensor 102 as shown in FIG. 5A, the nanowire 104 is positioned across the fluidic channel 106 and has two respective ends. Each end of the nanowire 104 is connected via a conductive layer 140 to a bond pad opening 148. The fluidic channel 106 has an inlet port 112 and an outlet port 114, either or both of which can be connected to and from other blocks of the LOC. In FIG. 5B, the capping layer 144 comprises of respective bond pad openings 148 for accessing the conductive layer 140 connecting the respective thicker Si core 134. Each end of the nanowire 104 is supported by a respective thicker Si core 134. The third embodiment in FIG.

5A and FIG. 5B differs from the second embodiment in FIG. 4A and FIG. 4B in that the bond pad openings are not filled with conductive layer 140 after portions of the capping layer 144 are etched away to make the bond pad openings 148. But similar to FIG. 4A and FIG. 4B, each of the bond pad opening 148 is positioned at a distance away from each respective thicker Si core 134, and therefore away from the nanowire 104. This prevents problems in case of a misalignment during creation of the bond pad openings 148. In both the embodiments in FIG. 4A and FIG. 4B and in FIG. 5A and FIG. 5B, a signal can be measured by applying a voltage potential across the respective conductive layer 140 in the through wafer vias 146 in FIG. 4B or across the respective bond pad openings 148 in FIG. 5B and measuring the current there between.

Figure 6A:
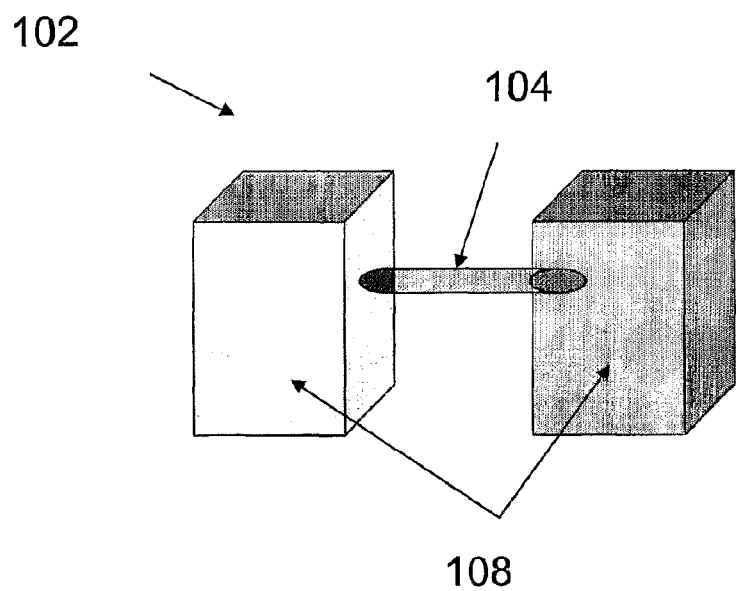
FIG. 6A to 6F show nanowires of different structural arrangements.
Figure 6B:
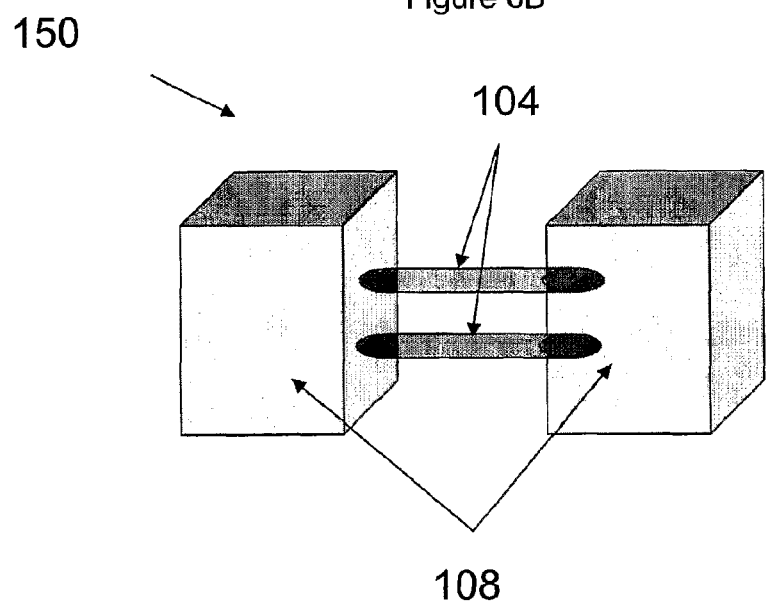
Figure 6C:
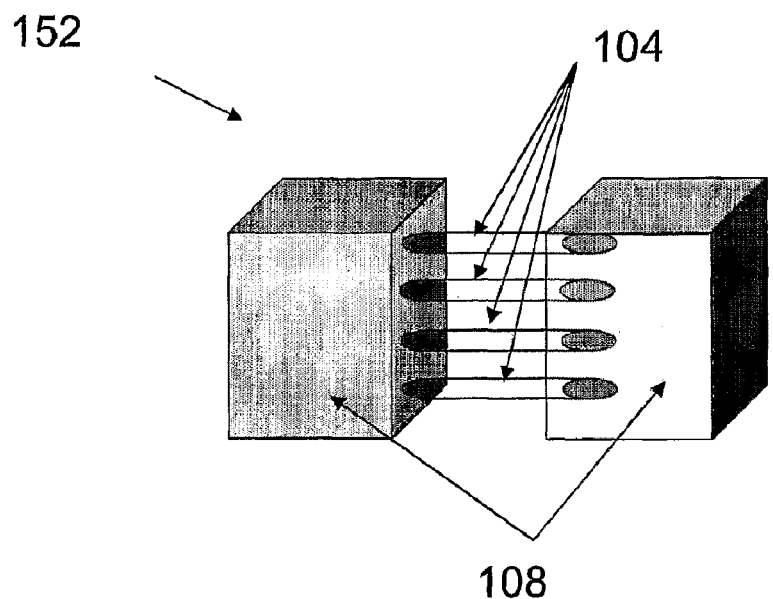
Figure 6D:
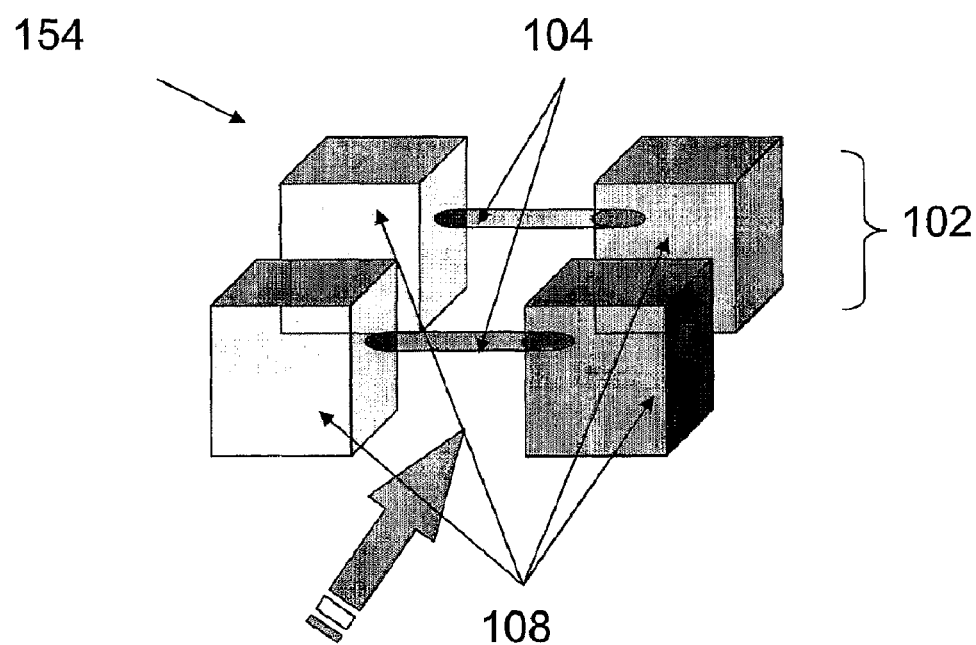
Figure 6E:
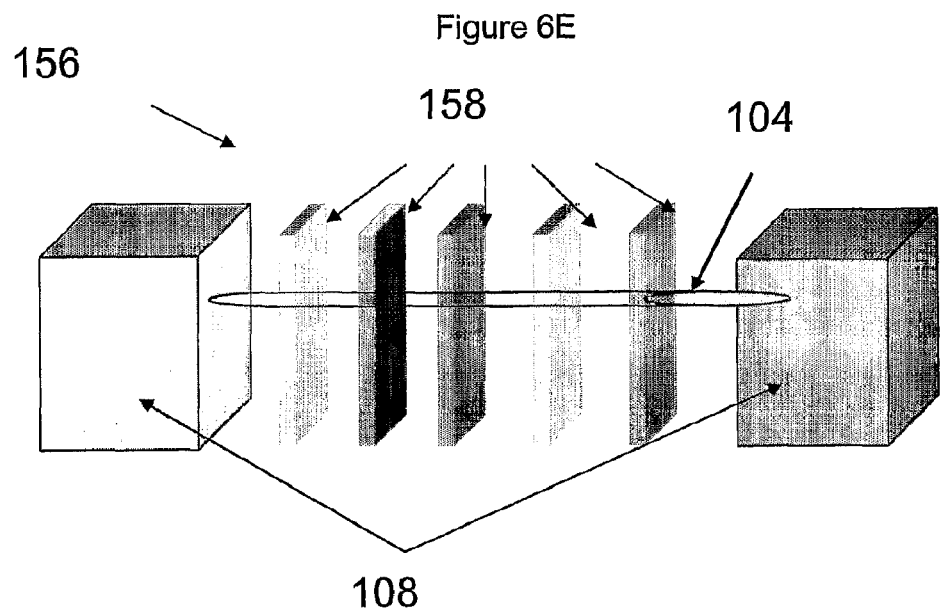
Figure 6F:
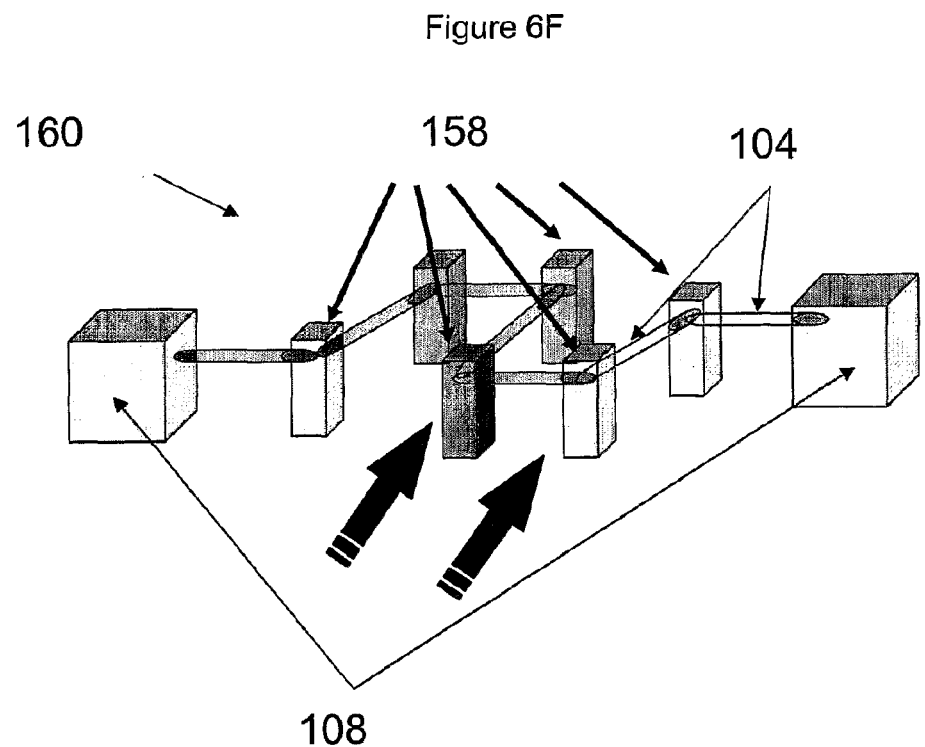

Nanowire sensors according to the present invention can comprise nanowires of different structural arrangements. Some of the arrangements are illustrated in FIG. 6A to FIG. 6F. FIG. 6A shows a nanowire sensor 102 comprising of a single nanowire 104 arranged in between two supporting portions 108 and FIG. 6B shows a nanowire sensor 150 comprising of two single nanowires 104 arranged in between two supporting portions 108. If wanted, a nanowire sensor 152 comprising of a plurality of single nanowires 104 (at least three nanowires) arranged in between two supporting portions 108 can also be realized as shown in FIG. 6C. FIG. 6D depicts a nanowire array 154 comprising of two single nanowire sensors 102 arranged in parallel. Each single nanowire sensor 102, similar to that in FIG. 6A comprises a single nanowire 104 arranged in between two supporting portions 108. More than two single nanowire sensors 102 can be arranged in parallel or along the direction of the fluid flow depending on requirements. In addition, "double" nanowire sensors 150 as shown in FIG. 6B, "multiple" nanowire sensor 152 as shown in FIG. 6C or combination of either can also be arranged in parallel. FIG. 6E discloses a nanowire sensor 156 comprising of a single long nanowire 104 passing through several Si or $SiO_2$ blocks 158, arranged in between two supporting portions 108. However, any suitable number of nanowires can also be utilized depending on requirements. In addition, the nanowires can also be arranged in any suitable arrangement or any desired pattern. FIG. 6F discloses a nanowire sensor array 160 comprising a plurality of single nanowires 104 passing through several Si or $SiO_2$ blocks 158, arranged in between supporting portions 108. If wanted, for example, in view of size constraints and a low concentration of target molecules, a zigzag profile or any other arrangements can be adopted to increase detection capability of the nanowire sensor as these arrangements allows for a larger surface area for contacting the sample. In principle, there are a large number of nanowire structural arrangements to cater to the different requirements.

Figure 7A:
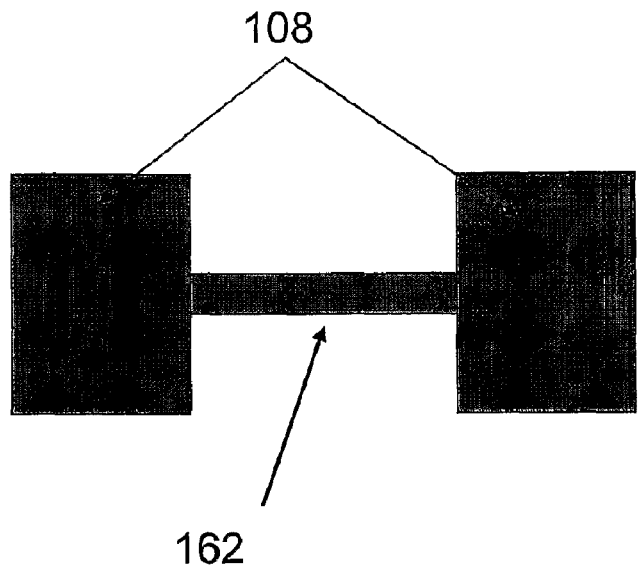
FIG. 7A to 7D show nanowires of different functional types.

Nanowire sensors according to the present invention can also comprise nanowires of different functional types, some of which are described in FIG. 7A to FIG. 7D. In the embodiment that is shown in FIG. 7A, controlled doping of the nanowire can be carried out to form sensors with n-type or p-type nanowires 162. The n-type or p-type nanowires 162 can be arranged between two supporting portions 108. P-type dopants including, but not limited to, boron, aluminum, gallium, indium can be used to form p-type nanowires and n-type dopants including, but not limited to, phosphorus, arsenic, antimony can be used as dopants to form n-type nanowires. The doping of the nanowires may be carried out after the self limiting oxidation step in FIG. 2C or it can be done at any step before the formation of the nanowire sensor. The preferred implant stage is before self-limited oxidation step.

Figure 7B:
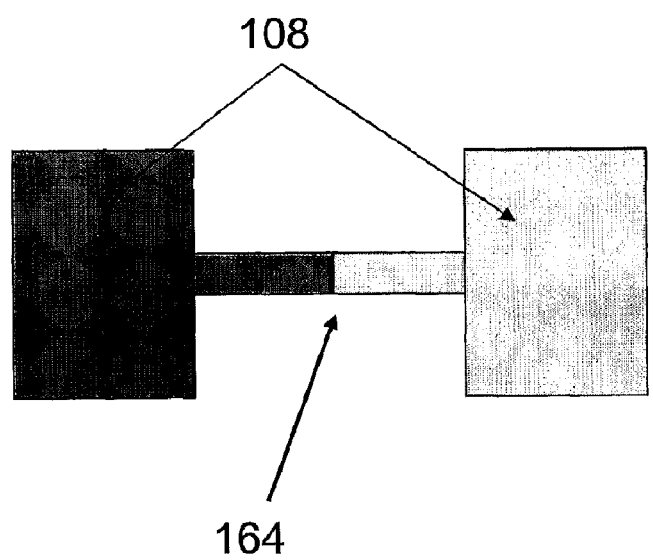

In another embodiment as shown in FIG. 7B, a sensor comprising a nanowire with a P/N diode junction 164 can be realized. The nanowire with a P/N diode junction 164 can be arranged between two supporting portions 108. Nanowires with P/N diode junction 164 is realized by partially doping one part of the nanowire by n-type dopants and the other part of the nanowire by p-type dopants. Multiple P/N junctions can also be realized on the same nanowire. The step of doping a combination of p-type and n-type dopants on a nanowire to form a nanowire with P/N diode junction 164 may also be carried out after the self limiting oxidation step in FIG. 2C or it can be done at any step before the formation of the nanowire sensor.

Figure 7C:
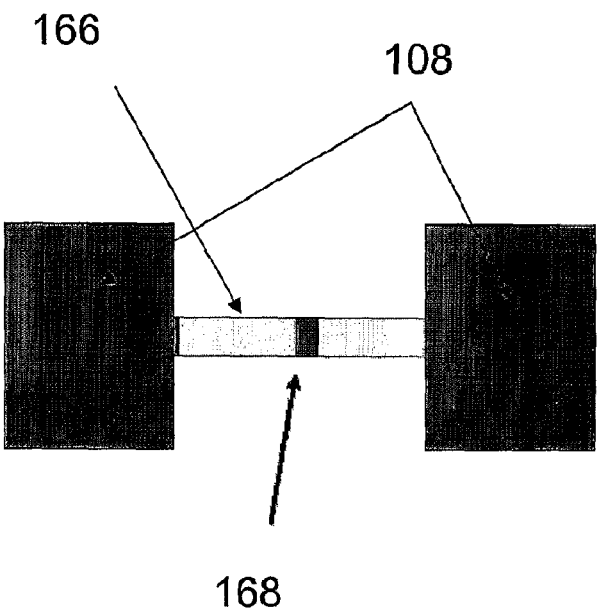

In yet another embodiment as shown in FIG. 7C, a sensor comprising silicided nanowire 166 with one or more nanogaps 168 can be realized. The silicided nanowire 166 can be arranged between two supporting portions 108. In this embodiment, a portion or portions of the Si nanowire which defines the nanogaps 168 are covered by a layer of dielectric material, typically $SiO_2$, or any other suitable dielectric materials. The rest of the Si nanowire is coated by a conductive layer, including but not limited to metals like tungsten and nickel and metal alloys. The Si nanowire is then heat treated to convert portions of the Si which are in contact with the layer of metal into metal silicide. The un-reacted metal is then removed in acid solutions like sulphuric acid. The layer of dielectric material is also removed.

Figure 7D:
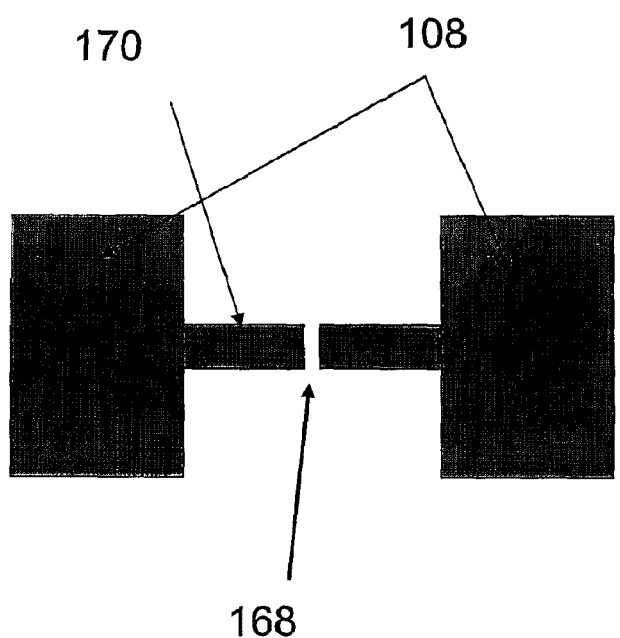

In yet another embodiment as shown in FIG. 7D, Si nanowires 170 with one or more nanogaps 168 can be realized. The Si nanowire 170 can be arranged between two supporting portions 108. A portion or portions of the Si nanowire 170 can be etched selectively using a selective mask to create a nanogap or nanogaps 168. The etching can be carried out at any one of the suitable process step, for example after the time of formation of the fin portion 126 in FIG. 2B-1, after the self-limiting oxidation step in FIG. 2C or after the release of the nanowire in FIG. 2I. Other etching methods like dry or wet etching, lithography or focused ion-beam etch can also be used.

A plurality of nanowires can also be formed in an array to increase the probability of attachment of targeted bio-molecules or molecular species. This is particularly useful for detection even at lower concentrations. Second, each nanowire in the array can be individually measured for its electrical conductance. This will inherently enhance the sensitivity of the nanowire array as one nanowire will not shunt another nanowire, which would render the change in conductance smaller. Third, each nanowire can be integrated with a microfluidic channel to deliver target bio-molecule onto the nanowire for sensing. Fourth, groups of nanowires within an array can be functionalized to attract specific binding or reason for multiplexed analysis. Fifth, through suitable fluidic layout, different set of nanowire arrays can be used for different analysis of bio-molecules in parallel. Finally, additional back gate electrode can be incorporated for every array or even individual nanowire or groups of nanowires to selectively modify the surface binding properties. This can be an attractive tool, which would allow selective binding of molecules and thus may provide a way to address specific molecules, Therefore a nanowire sensor array can be a useful tool to study a range of new phenomenon.

Figure 8:
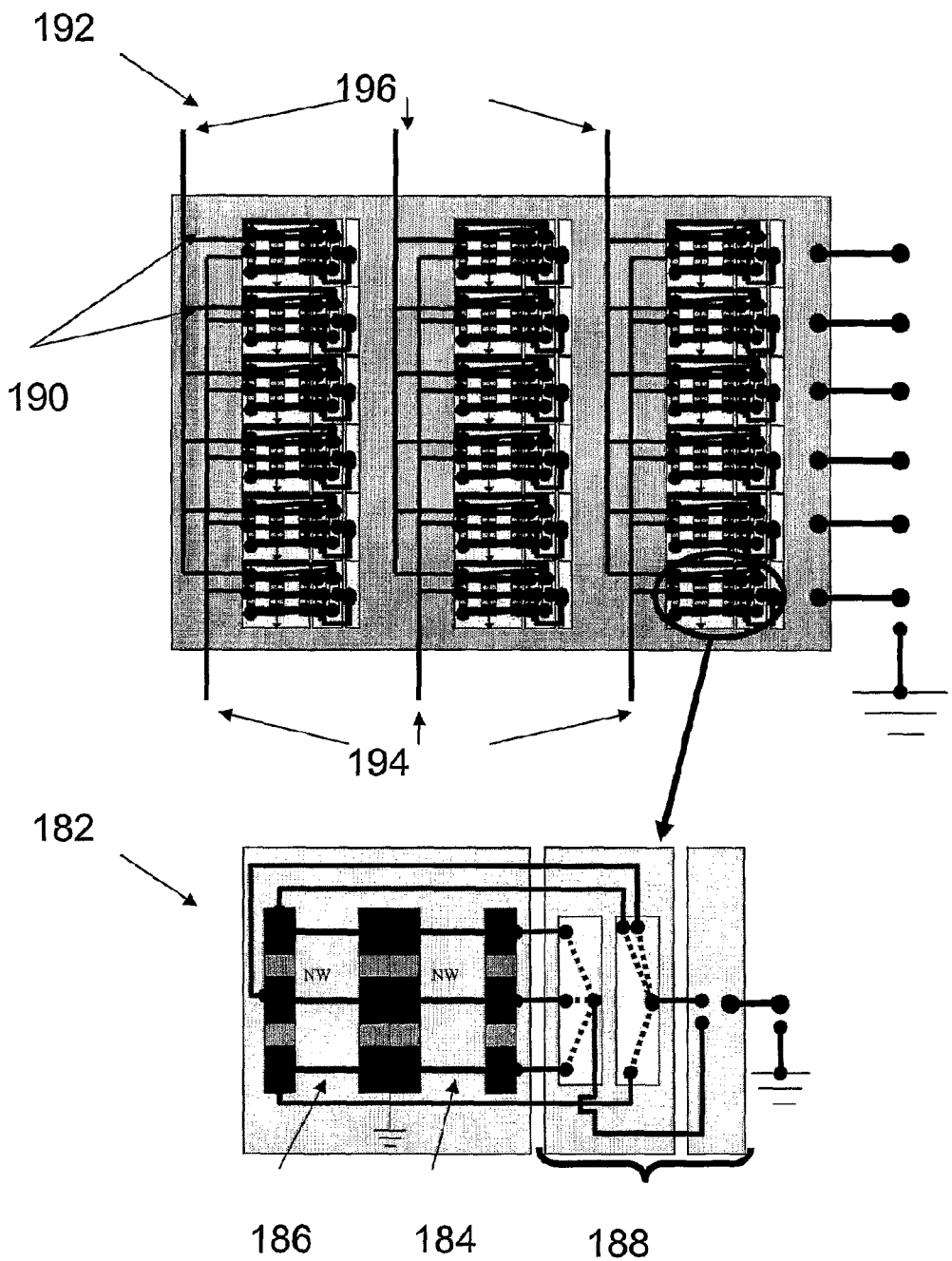
FIG. 8 shows a schematic of a nanowire sensor array.

FIG. 8 shows a schematic of a multiplexed nanowire sensor array 192 where a plurality of nanowire sensor arrays 182 are connected to parallel fluidic channels 190 with a common analyte input 194 and output 196: In the enlarged view, each nanowire sensor array 182 can have two arrays of nanowires, one for the analysis of an analyte or bio-molecule, called the "sensor array" 184 and the other for a reference buffer solution, called the "reference array" 186. Each nanowire sensor array 182 can be independently integrated with the fluidic channels 190, input 194 and output 196 ports for allowing fluidic flow. Each nanowire sensor in an array can be individually measured for its conductance change and all the nanowires can be electronically interfaced with circuits, either on-chip or off-chip. This conductance change can be measured by a control electronics circuit block 188 shown in FIG. 8. Once the sensors in each array 182 are distinguishably modified with suitable chemical reagents, the sensors can detect various bio-molecules or markers simultaneously. The nanowire sensor array 182 can operate based on a conductance change, which may be due to a charge or a mass induced stress when a bio-molecule is immobilized on the nanowire sensor element with suitable surface modification. In addition, there may not be a need to have two arrays of nanowires for all application modes. Depending on the application, one or more than two arrays of nanowires may be suitable. Also there may not be a need for a separate 'reference array'. The array itself can at as reference before measurement. In this case, both arrays can work as independent arrays.

Figure 9B:
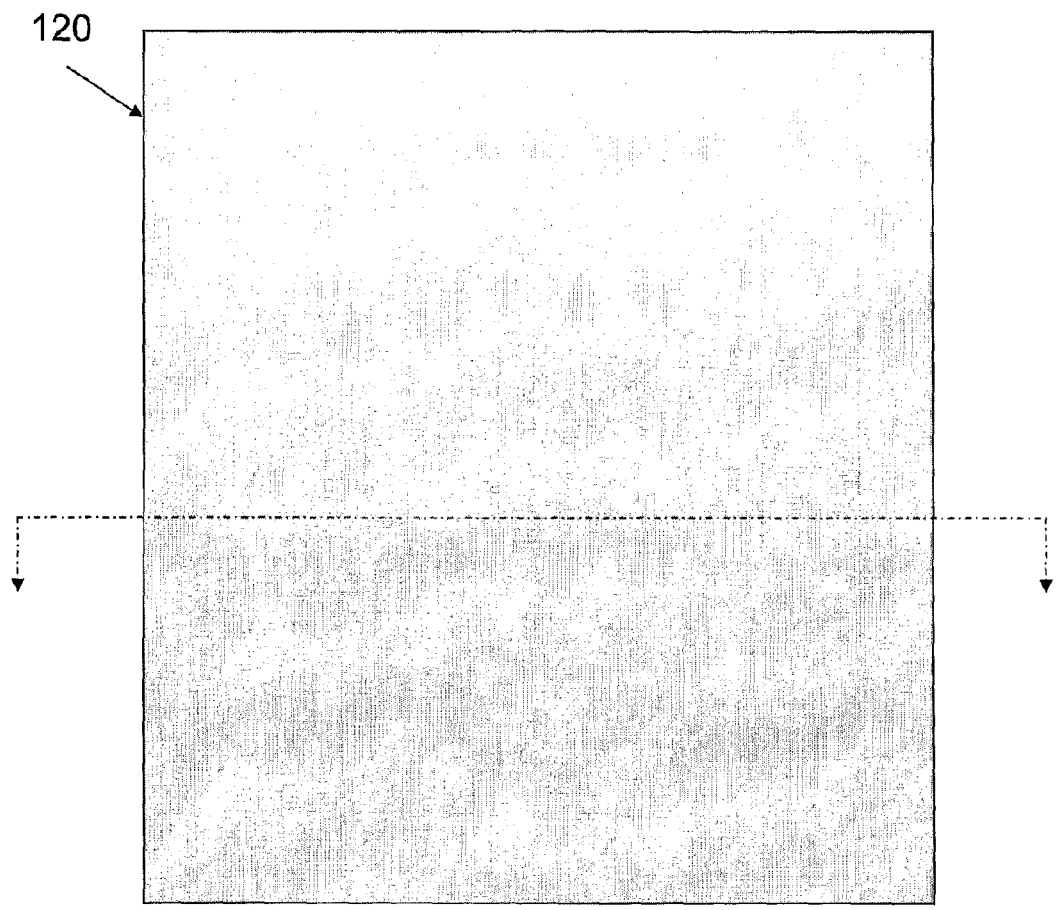
FIGS. 9A to 9N show respective top and cross-sectional views through the nanowire sensor array during different fabrication steps according to the first embodiment of the present invention.
Figure 9B:
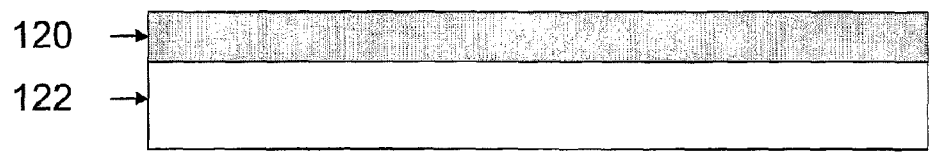
Figure 9C:
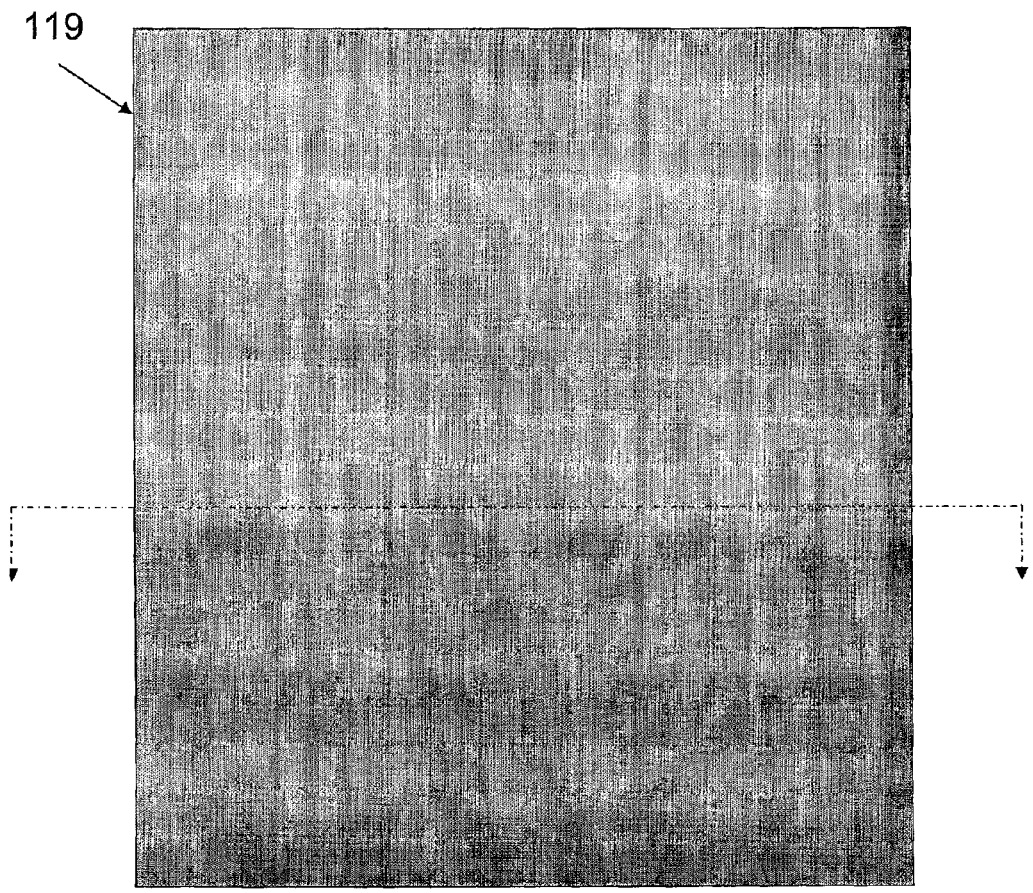
Figure 9C:
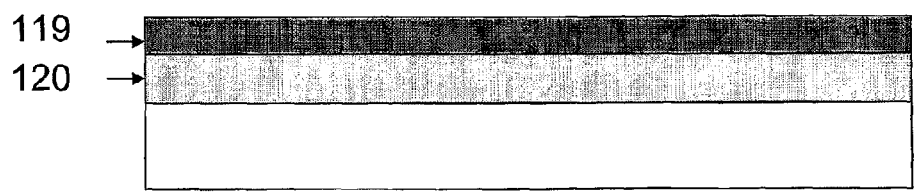
Figure 9D:
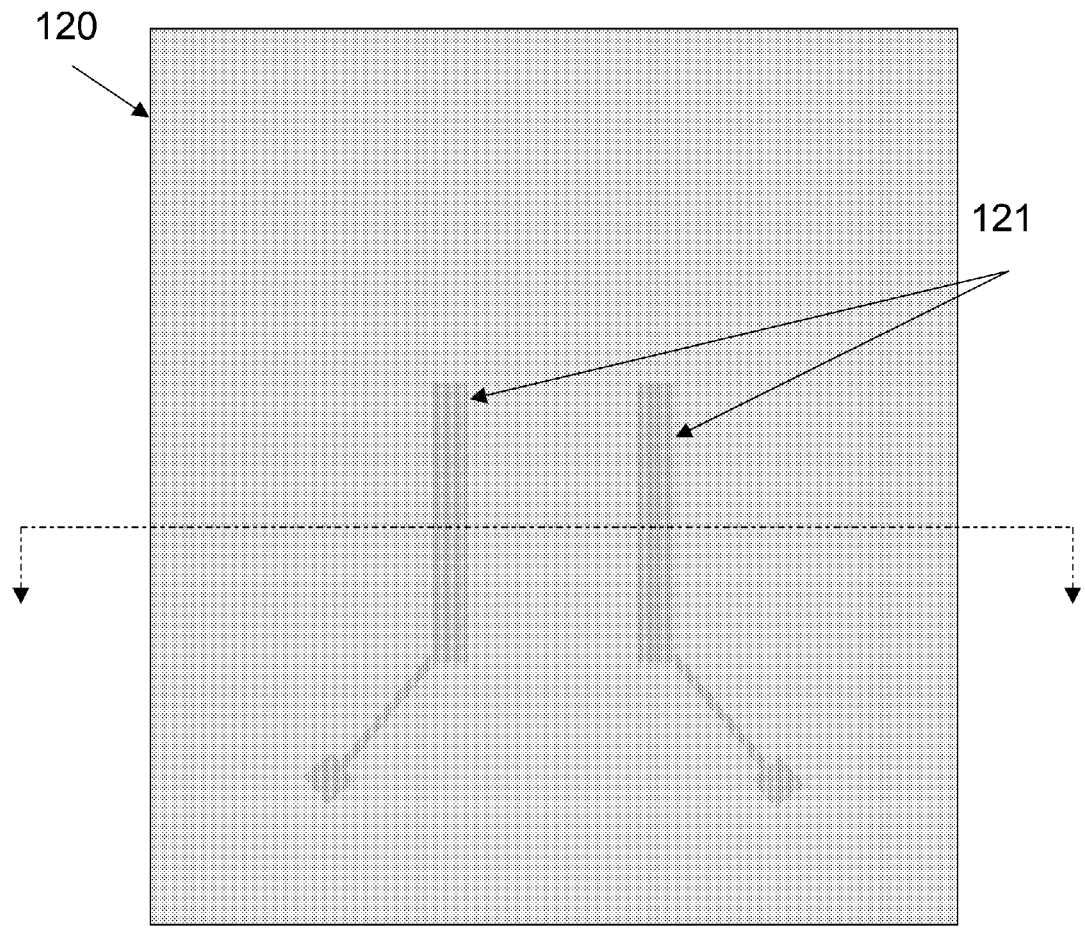
Figure 9D:
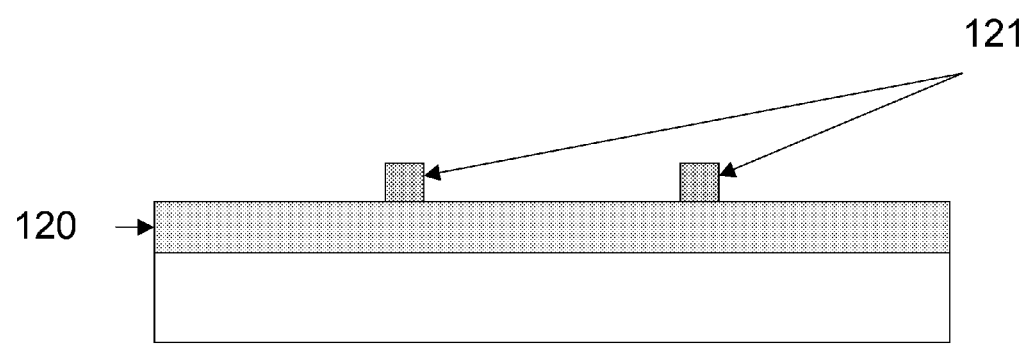
Figure 9E:
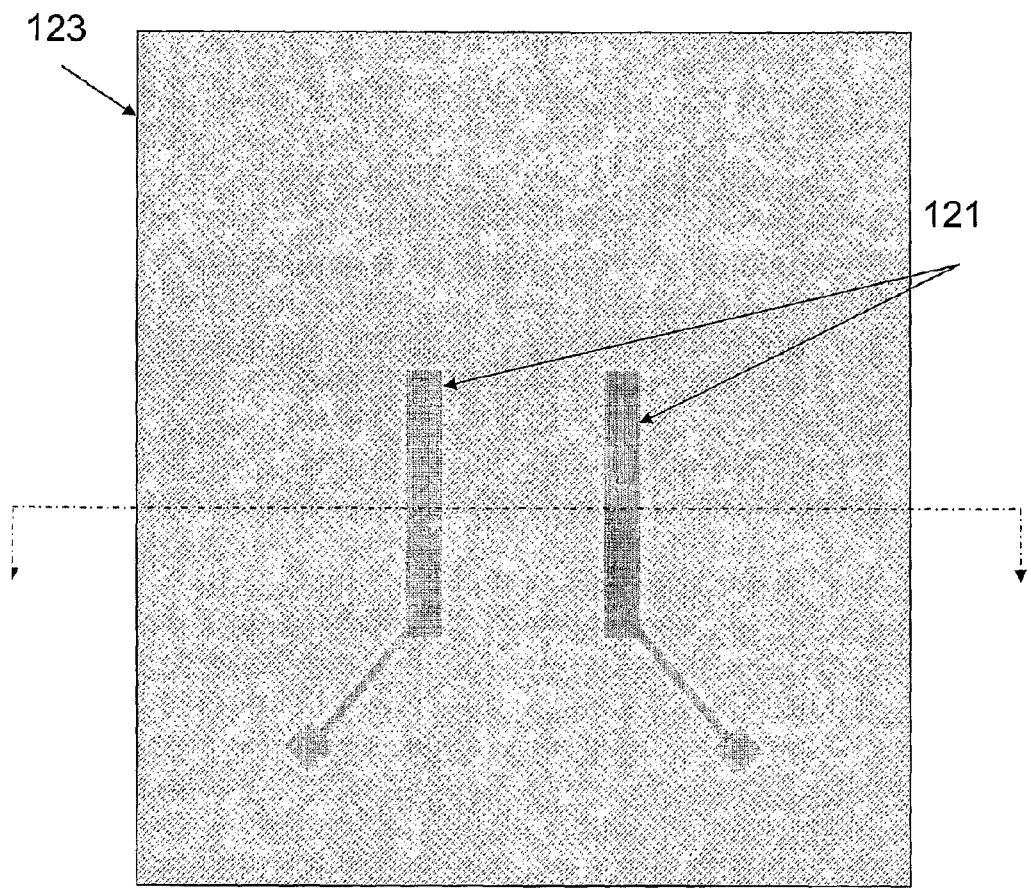
Figure 9E:
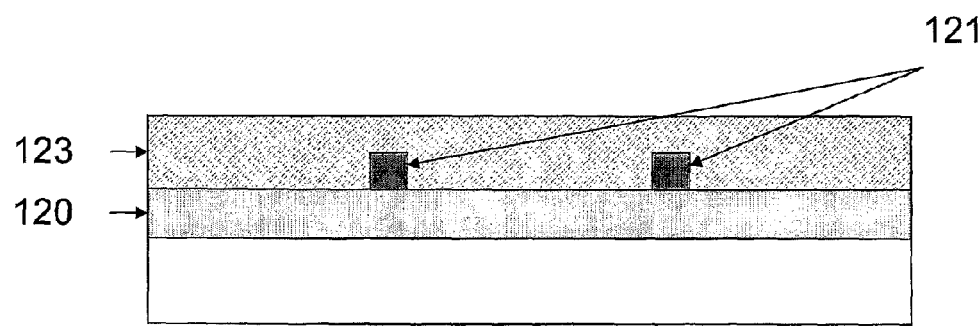
Figure 9F:
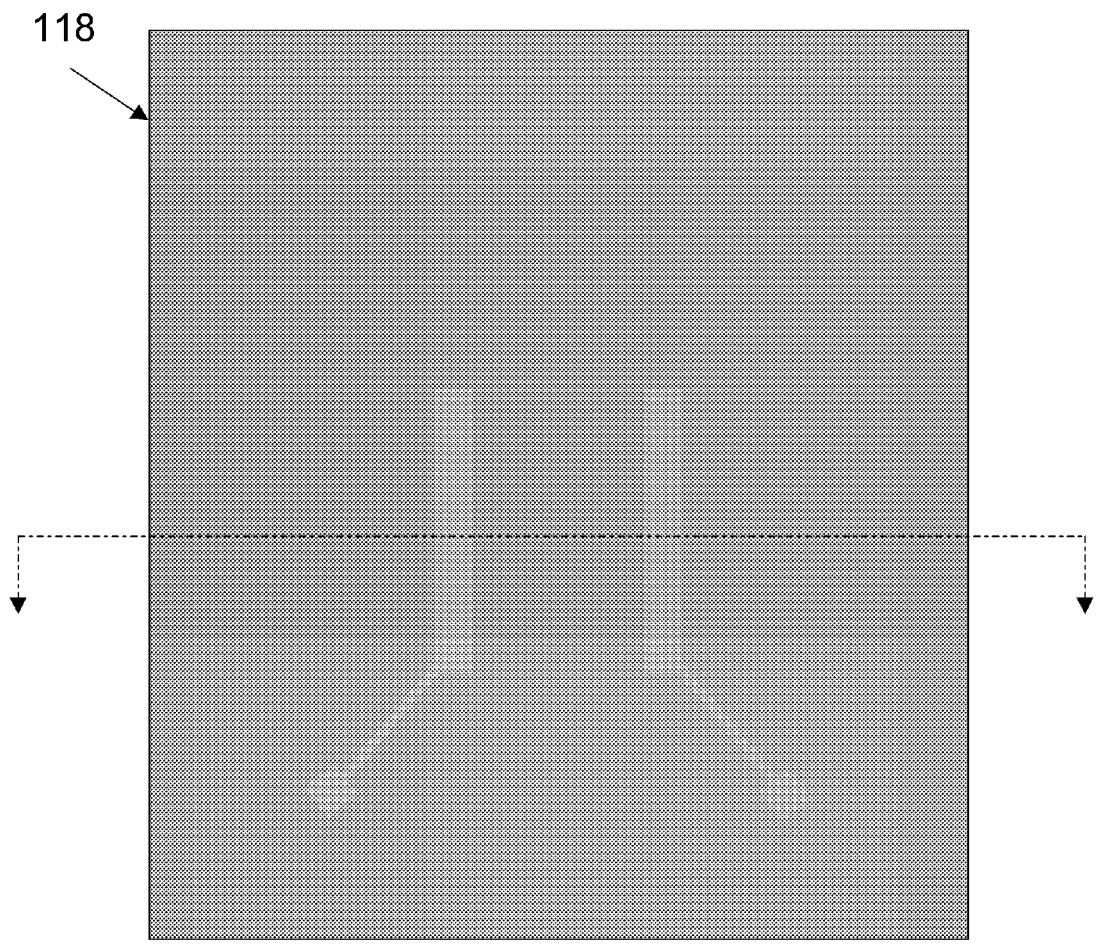
Figure 9F:
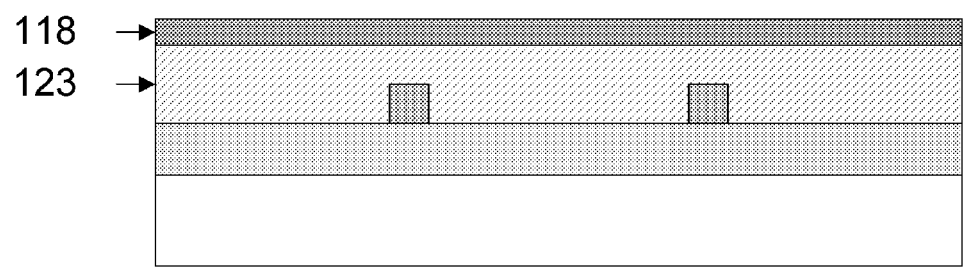
Figure 9G:
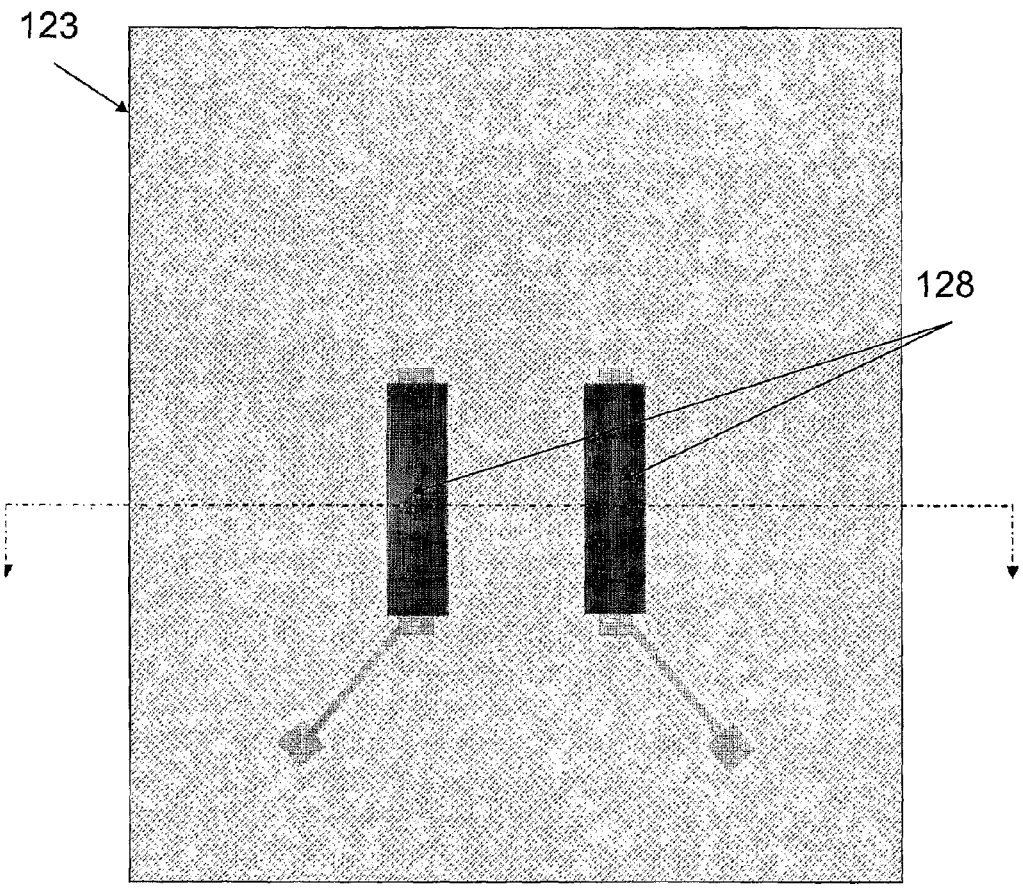
Figure 9G:
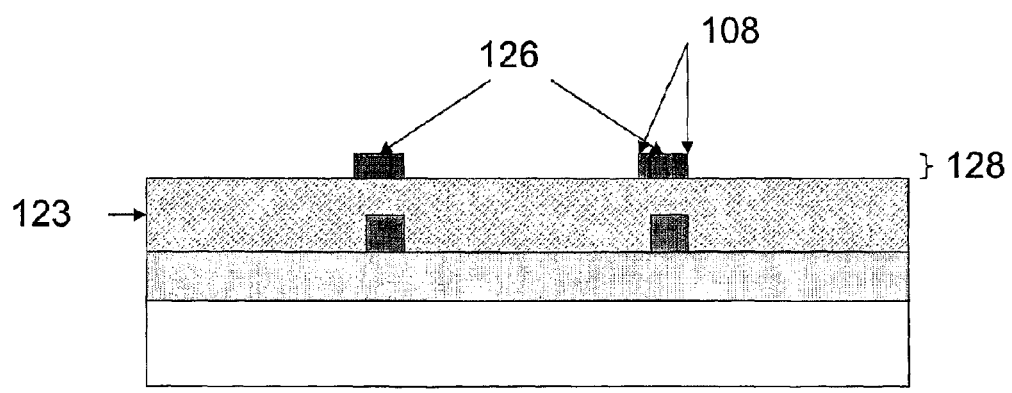
Figure 9H:
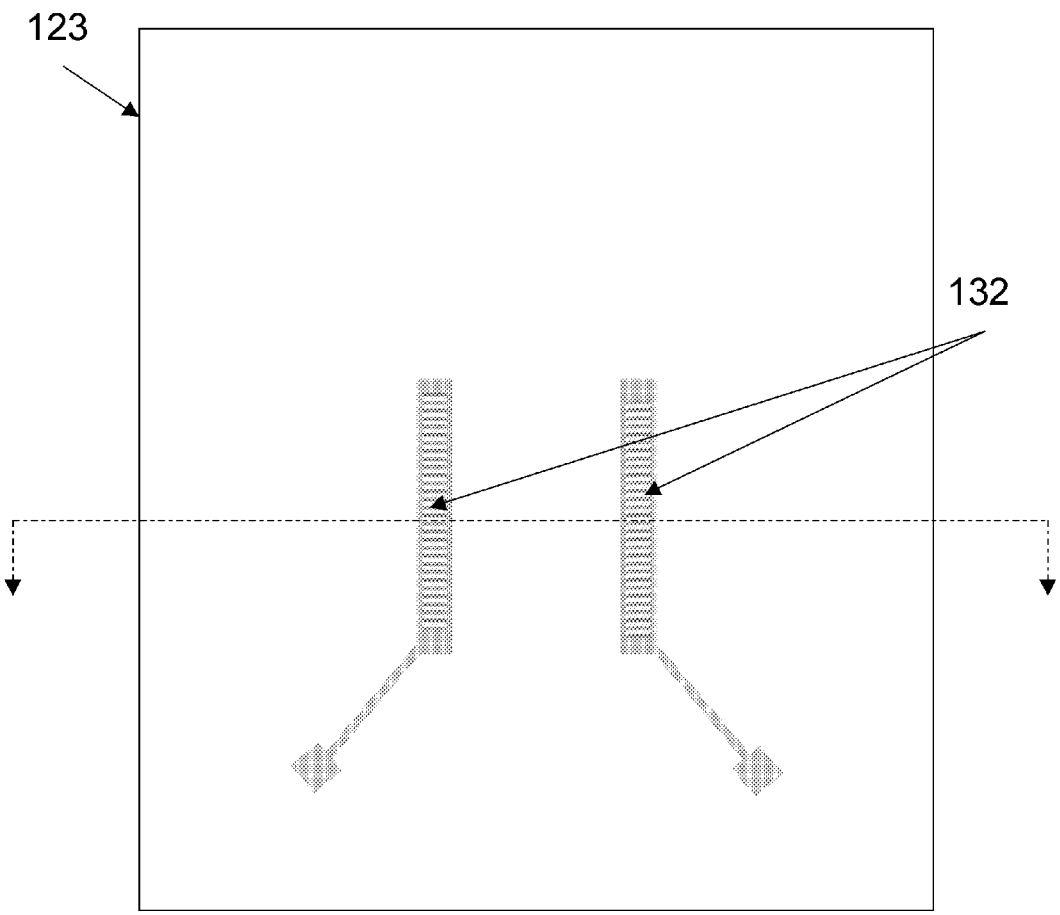
Figure 9H:
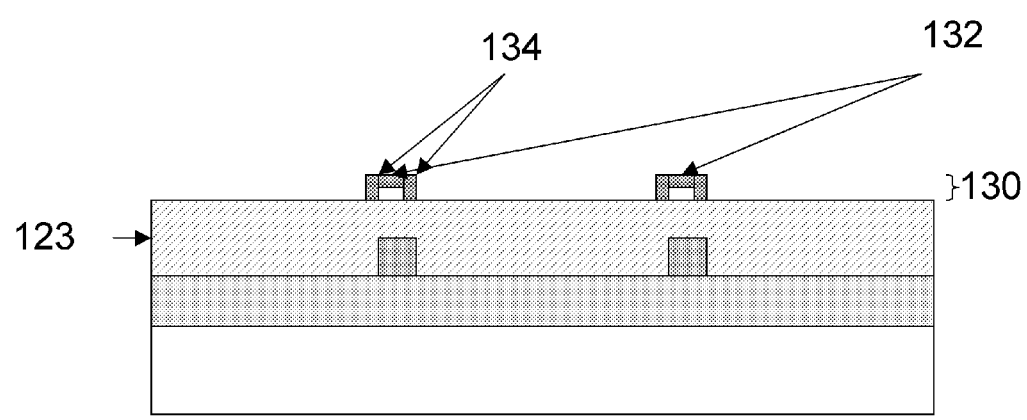
Figure 9I:
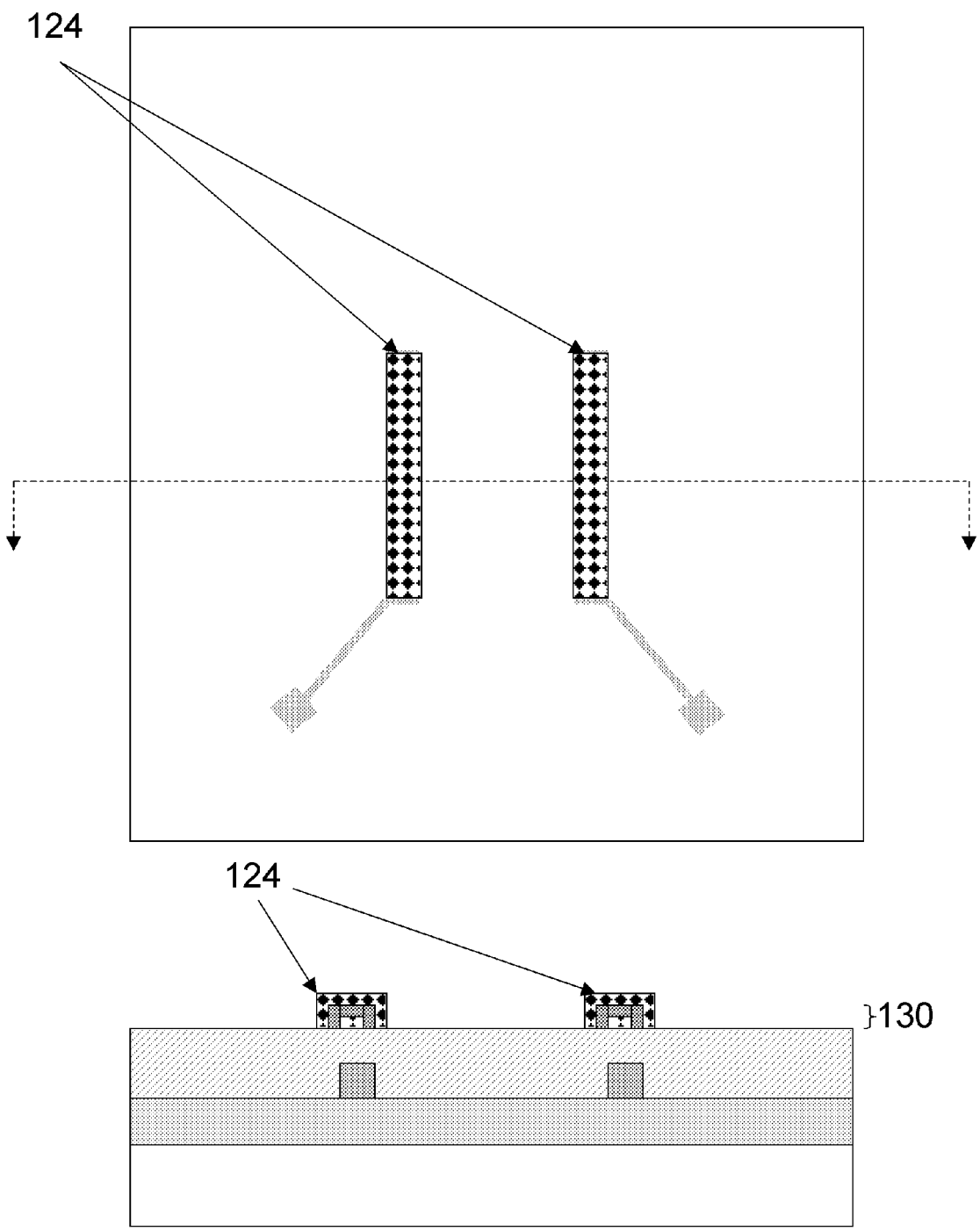
Figure 9J:
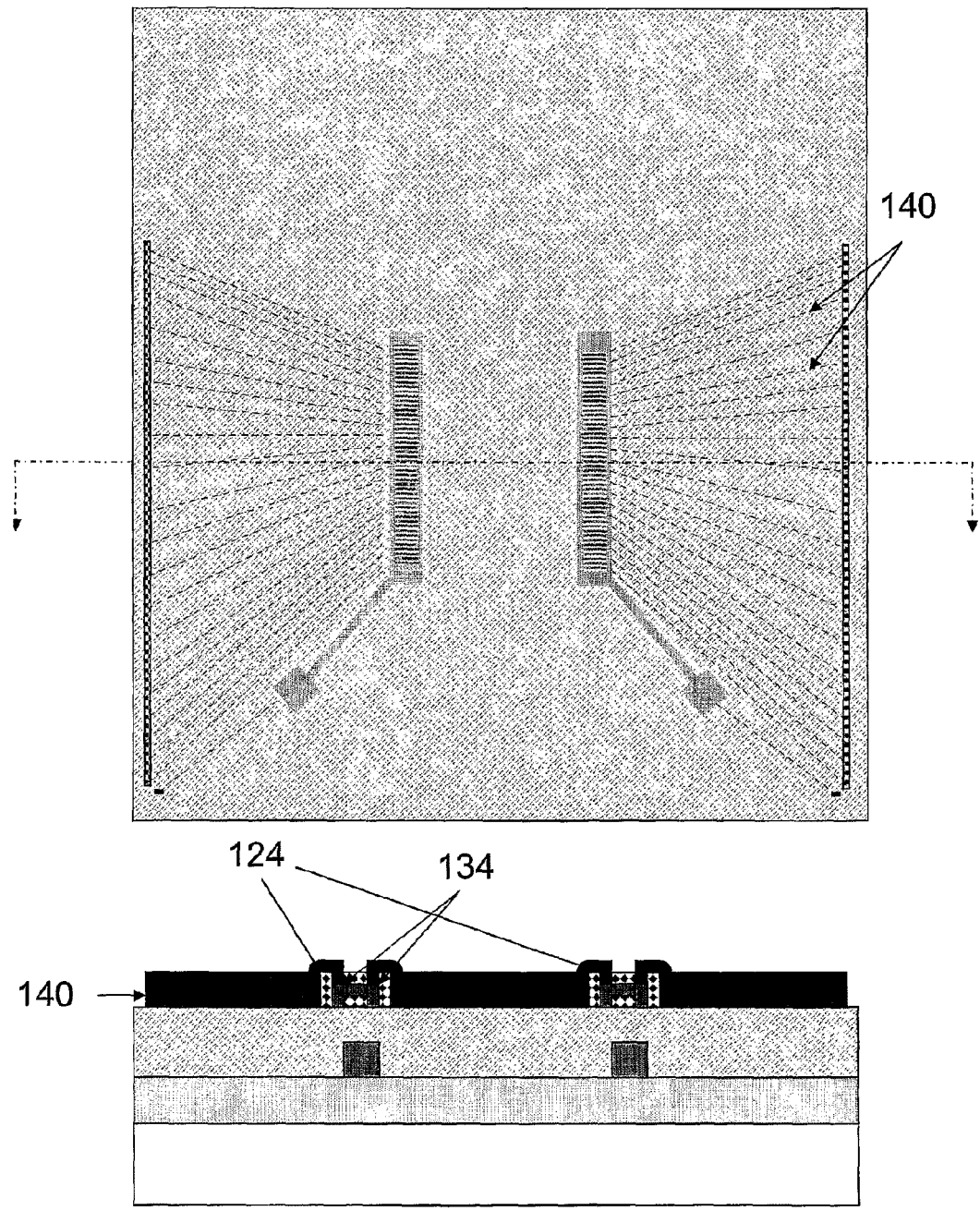
Figure 9K:
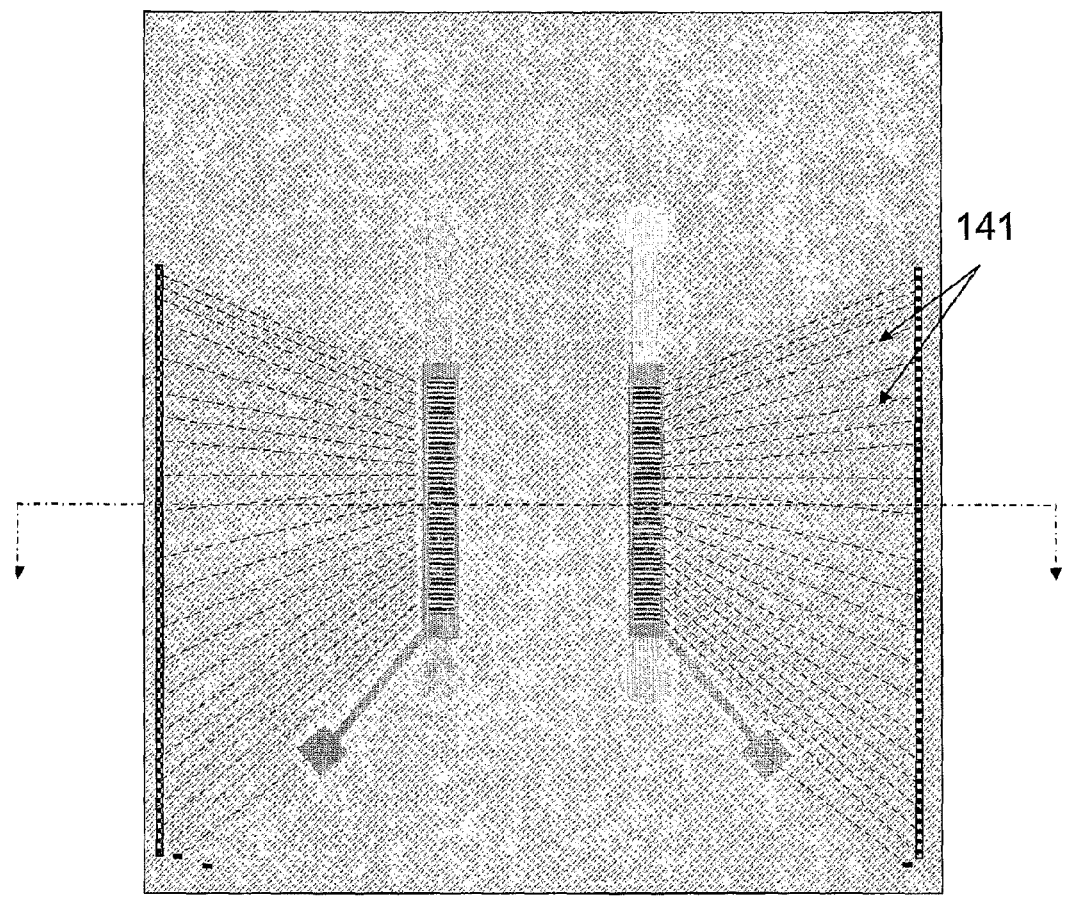
Figure 9K:
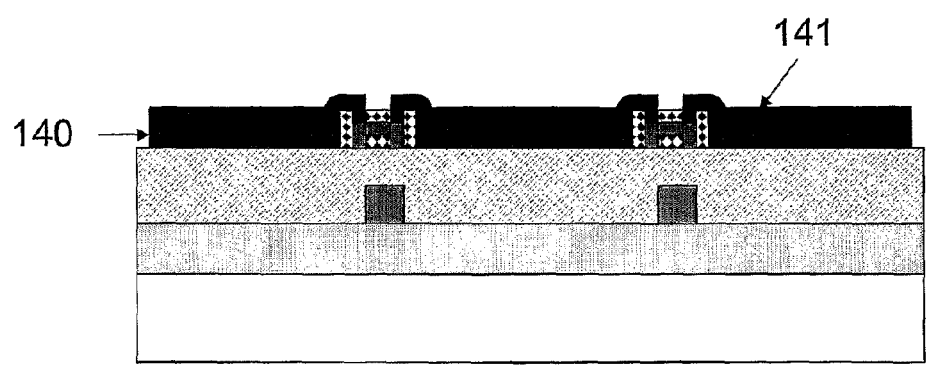
Figure 9L:
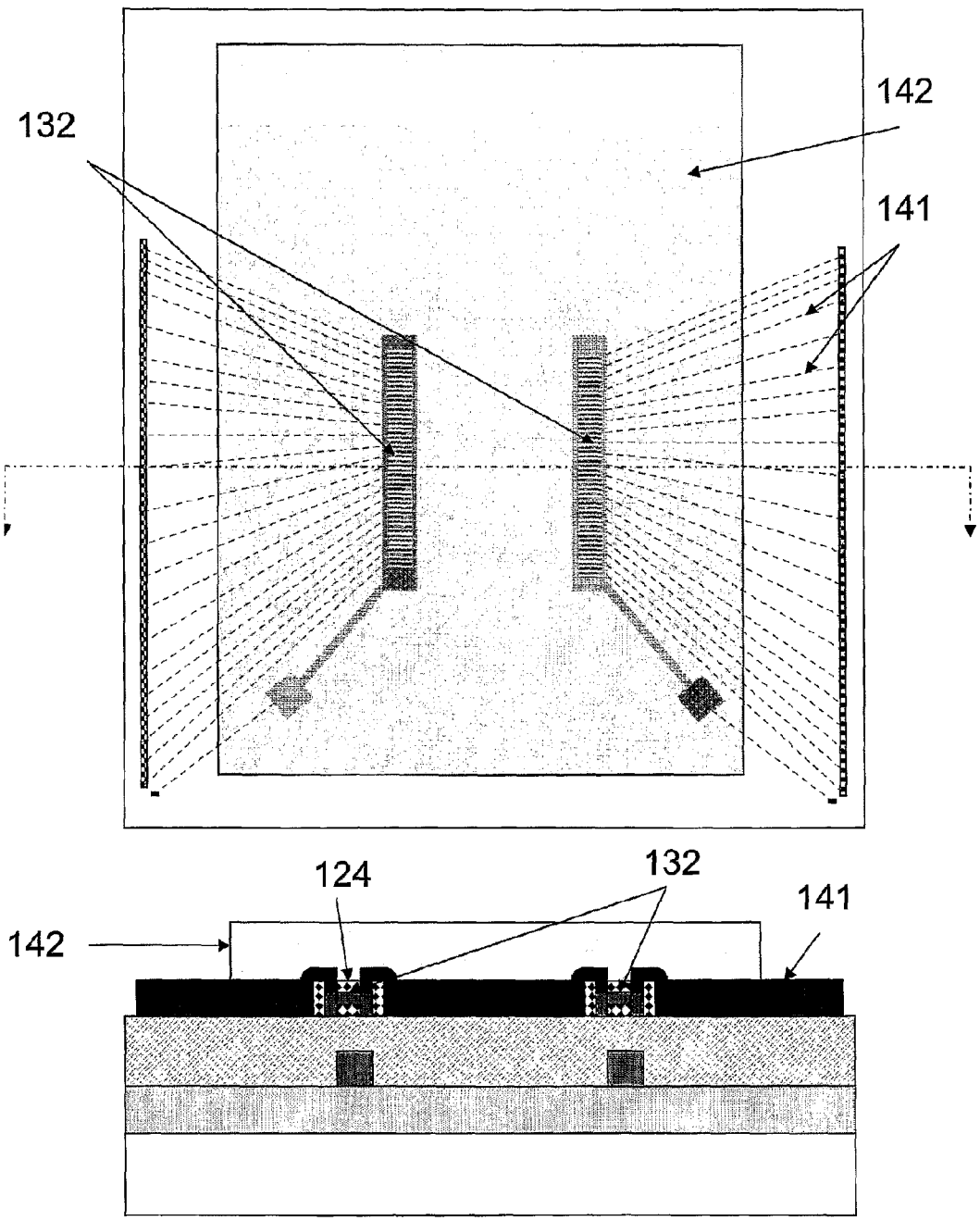
Figure 9M:
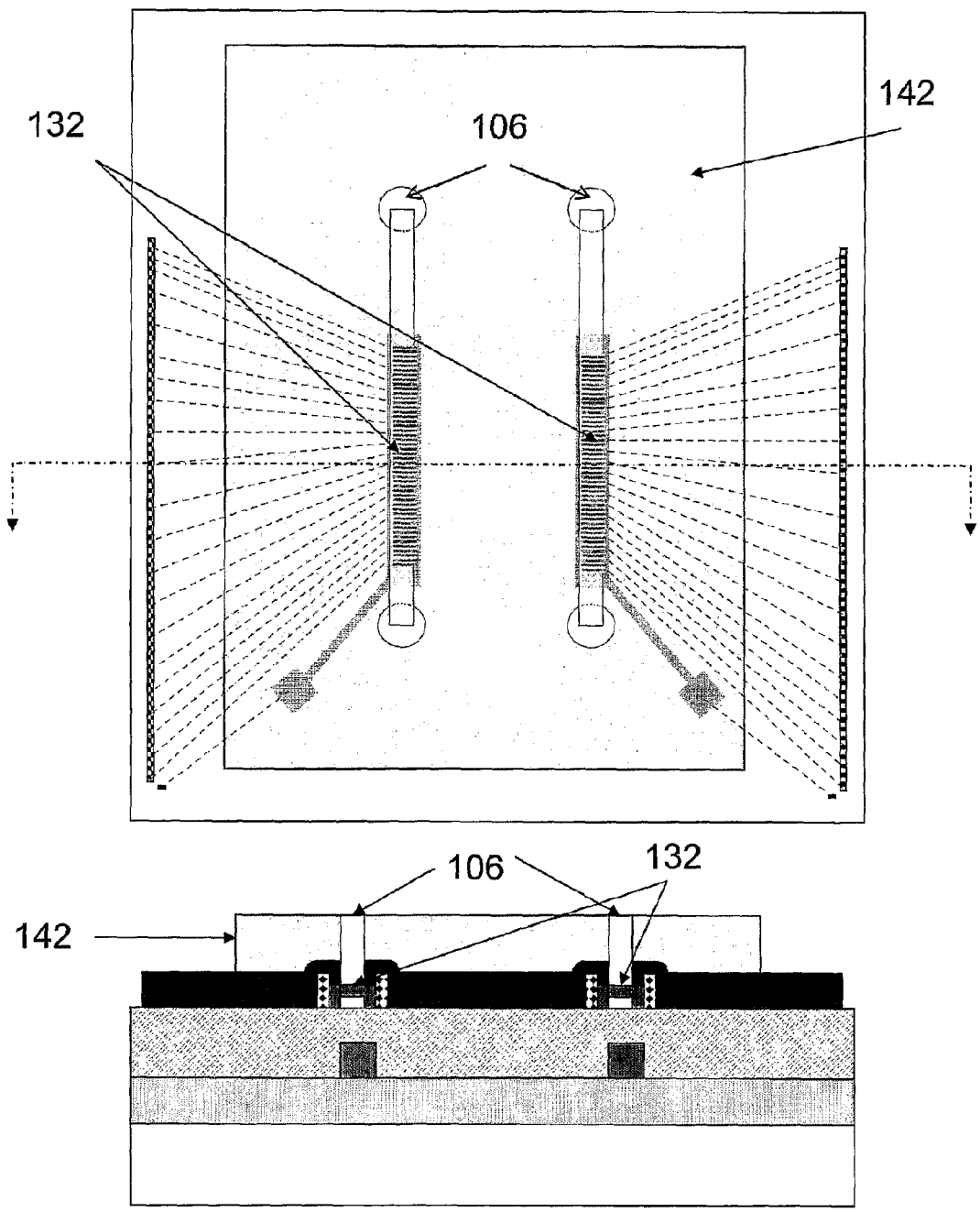
Figure 9N:
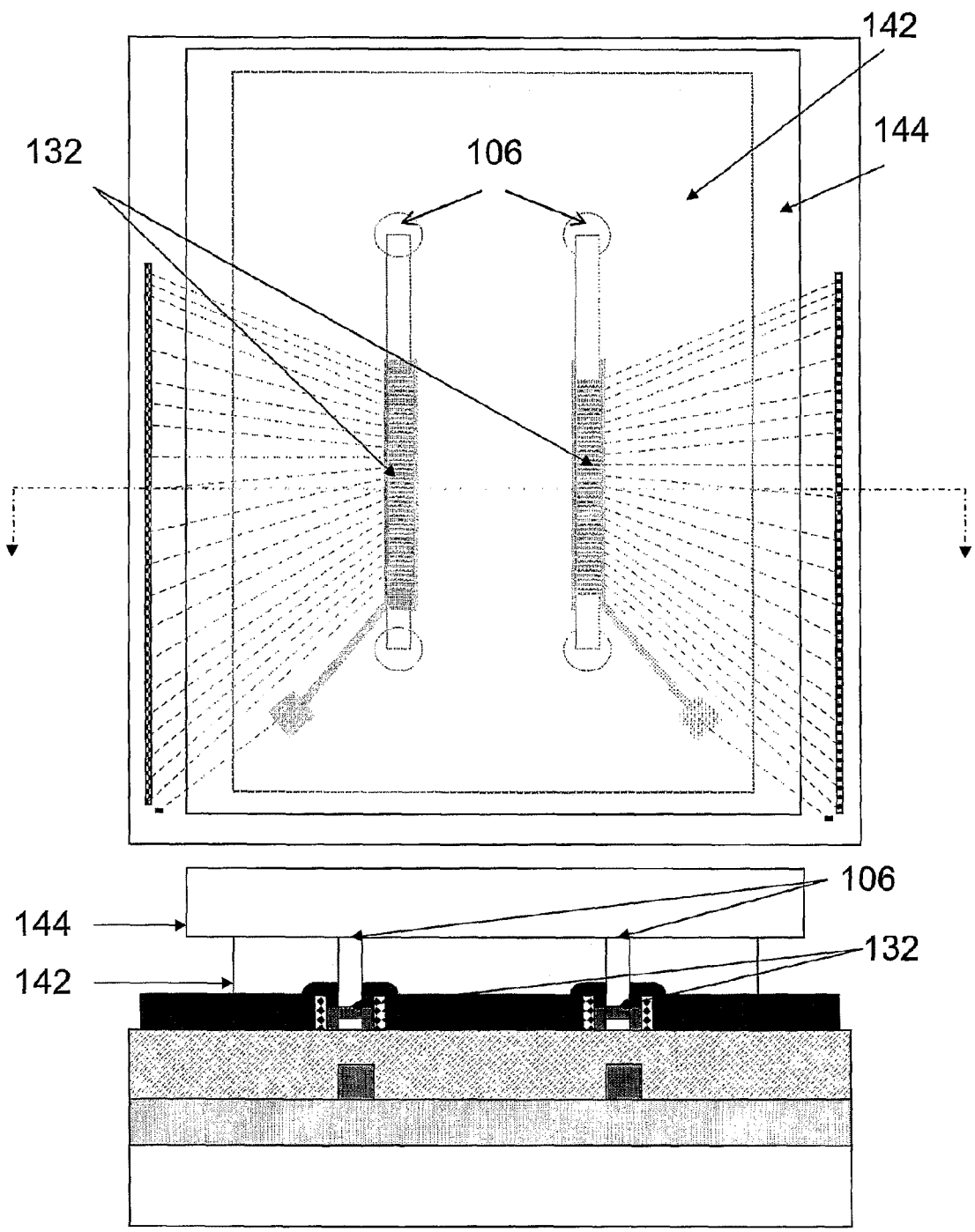

FIG. 9A to FIG. 9N show respective top and cross-sectional views through a nanowire sensor array during different fabrication steps according to an embodiment of the present invention. The fabrication steps are similar to the fabrication steps shown in FIG. 2A to FIG. 2I except for three extra steps shown in FIG. 9C, FIG. 9D and FIG. 9E involving the formation of a back gate electrode before the formation of the nanowire.

FIG. 9A shows a starting support substrate 122. FIG. 9B shows deposition of an insulating layer or a buried oxide (BOX) layer 120 on the support substrate 122. For fabrication of the back gate electrode, a second semiconductor device layer 119 is deposited over the insulating layer or BOX layer 120 as shown in FIG. 9C. The second semiconductor device layer 119 can be of the same material as the first semiconductor device layer 118 (shown earlier in FIG. 2A) and is typically Si but may be formed from any suitable semiconductor materials including, but not limited to poly-silicon, gallium arsenide (GaAs), germanium or silicon-germanium (SiGe).

After deposition of the second semiconductor device layer 119, a photoresist layer (not shown) is applied or coated onto the top surface of the Si device layer 119. The photoresist layer is then patterned to form at least two electrodes by standard photolithography techniques. Subsequently, using the patterned photoresist layer as a mask, portions of the second semiconductor layer 119 not covered by the mask is etched away by an anisotropic etching process such as Reactive Ion Etching (RIE). At least two resultant electrodes 121 are formed on the BOX layer 120 as shown in FIG. 9D.

Next, a second insulating layer 123 is deposited over the respective electrodes 121 and over the BOX layer 120 as shown in FIG. 9E. Then, another semiconductor layer or a first semiconductor device layer 118 (as it is termed in FIG. 2A) is deposited over the second insulating layer 123 as shown in FIG. 9F. A photoresist layer (not shown) is applied or coated onto the top surface of the first semiconductor device layer 118. The photoresist layer is then patterned to form a FIN portion arranged in between two supporting portions by standard photolithography techniques.

Subsequently, using the patterned photoresist layer as a mask, portions of the first semiconductor device layer 118 not covered by the mask is etched away by an anisotropic etching process such as Reactive Ion Etching (RIE). A resultant Si FIN structure 128 comprising of a Si FIN portion 126 arranged in between and connected at each end to a respective Si supporting portion 108 is formed on the second insulating layer 123 as shown in FIG. 9G.

The structure 128 comprising the Si FIN portion 126 arranged in between the two Si supporting portions 108 is then subjected to a self-limiting oxidation process. The process will convert the structure 128 comprising the Si FIN portion 126 arranged in between the two Si supporting portions 108 into an oxidized structure 130 comprising of a thin Si core 132 surrounded by a $SiO_2$ portion or film (not shown in this FIG. 9H due to the scale) arranged in between two thicker Si cores 134 surrounded by another $SiO_2$ portion or film (not shown in FIG. 9H due to the scale) on the second insulating layer 123 as shown in FIG. 9H. The Si core 132 surrounded by the $SiO_2$ portion or film is formed as a result of the oxidation of the Si FIN portion 126. The two thicker Si cores 134 surrounded by the $SiO_2$ portion or film are formed as a result of the oxidation of the two Si supporting portions 108. The thin Si core 132 eventually forms the nanowire in the present invention.

After the self-limiting oxidation process, a layer of $SiO_2$ 124 is being deposited over the oxidized structure 130 as shown in FIG. 9I. This layer of $SiO_2$ 124 may be the same as the $SiO_2$ portion or film surrounding the thin Si core 132 and the $SiO_2$ portion or film surrounding the two thicker Si cores 134. However, the layer of $SiO_2$ 124 is relatively thicker compared to the respective $SiO_2$ portion or film and serves to protect the two thicker Si cores 134 for subsequent deposition. The layer of $SiO_2$ 124 and the respective $SiO_2$ portion or film may merge together if they are of the same material.

In an intermediate step, after the deposition of the layer of $SiO_2$ 124, a layer of photoresist (not shown) is deposited over the layer of $SiO_2$ 124. Contact openings or recesses are formed in the photoresist layer by standard photolithography techniques to make accessible the layer of $SiO_2$ 124 over the $SiO_2$ portion surrounding the two thicker Si cores 134. Portions of the layer of $SiO_2$ 124 and the $SiO_2$ portion or film surrounding the two thicker Si cores 134 are also etched to expose portions of the two thicker Si cores 134. Next, a conductive layer 140 is deposited into the contact openings, with portions of the conductive layer 140 being in contact with the two thicker Si cores 134 as shown in FIG. 9J. The photoresist layer is then removed or stripped away by a photoresist stripper.

Following the deposition of the conductive layer 140 into the contact openings, a passivation layer 141 is deposited over the conductive layer 140 as shown in FIG. 9K.

Then, an insulating layer 142, as shown in FIG. 9L is deposited onto the passivation layer 141 and onto the layer of $SiO_2$ 124 over the top surface of the $SiO_2$ portion surrounding the thin Si core 132. After deposition, the insulating layer 142 may be further planarized using one of the polishing processes as mentioned earlier. The polishing process provides a smooth surface for further deposition of a capping layer. But if the insulating layer is a polymer like SU8, planarization is not required.

In another intermediate step, a further layer of photoresist (not shown) is deposited over the insulating layer 142. The photoresist layer is patterned by standard photolithography techniques to form an opening over the region where a channel 106 is to be formed in the insulating layer 142 as shown in FIG. 9M. Using the photoresist layer as a mask, a portion of the insulating layer 142 is etched away by an etching process, such as dry etching to form a channel 106 making accessible the top surface of the $SiO_2$ portion surrounding the thin Si core 132 but leaving the $SiO_2$ portion at the thin Si core 132.

After the dry etching step, the photoresist layer is then removed or stripped away by a photoresist stripper. To release the thin Si core 132 from the surrounding SiO$_2$ portion, an etching process is used. In an exemplary embodiment, if the insulating layer 142 is a polymer like SU8 for example, it may not be necessary to deposit or coat another layer of photoresist in order to form the opening for subsequent formation of the channel 106, as SU8 is also a type of photoresist.

Further to the release of the thin Si core 132 or nanowire, a capping layer 144 is deposited onto the top surface of the insulating layer 142 as shown in FIG. 9N. The capping layer 144 can comprise fluidic input and output ports and can serve to enclose the channel 106 housing the thin Si core 132 or the nanowire.

In summary, the fabrication steps are similar to that in FIG. 2A to FIG. 2I except for three extra steps shown in FIG. 9C, FIG. 9D and FIG. 9E involving the formation of a back gate electrode before the formation of the nanowire. The purpose of a sensor array formed with a back gated configuration is such that a back gate voltage can be used to modulate the conductance of each nanowire array individually. This can be an attractive option where the surface binding or catalytic properties of the nanowire can be modified by an external electric field.

Figure 10:
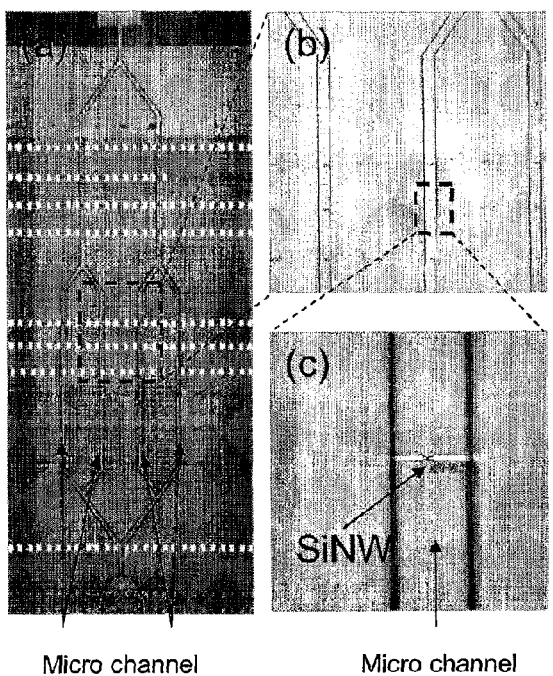
FIG. 10 shows different prototypes of fluidic channel formations.
Figure 10:
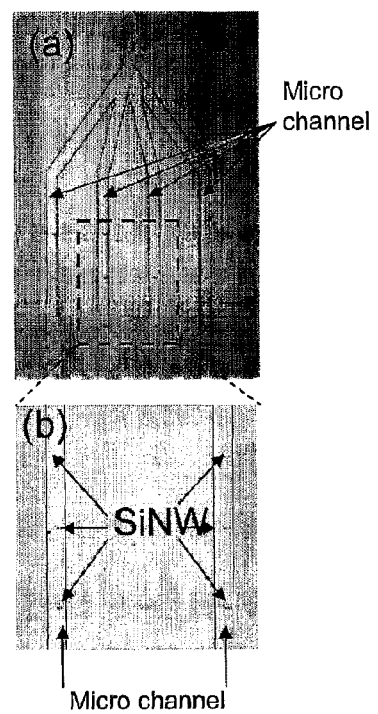

FIG. 10 shows different prototypes of fluidic channel formations. FIG. (a) of prototype 1 shows an input fluidic channel which divides into two channels. Each of these two channels further sub-divides into two more channels. All the channels are subsequently merged. FIG. (b) and FIG. (c) of prototype 1 show zoomed out views of sections of the fluidic channel in FIG. (a) of prototype 1. In FIG. (c) of prototype 1, a silicon nanowire is housed in a channel. But a plurality of nanowires may also be placed at different sections of each of these channels for sensing depending on the requirements. FIG. (a) of prototype 2 shows four independent fluidic channels which merged into a common fluidic channel. FIG. (b) of prototype 2 shows that a plurality of nanowires can be placed in each fluidic channel, but is not so limited.

Figure 11:
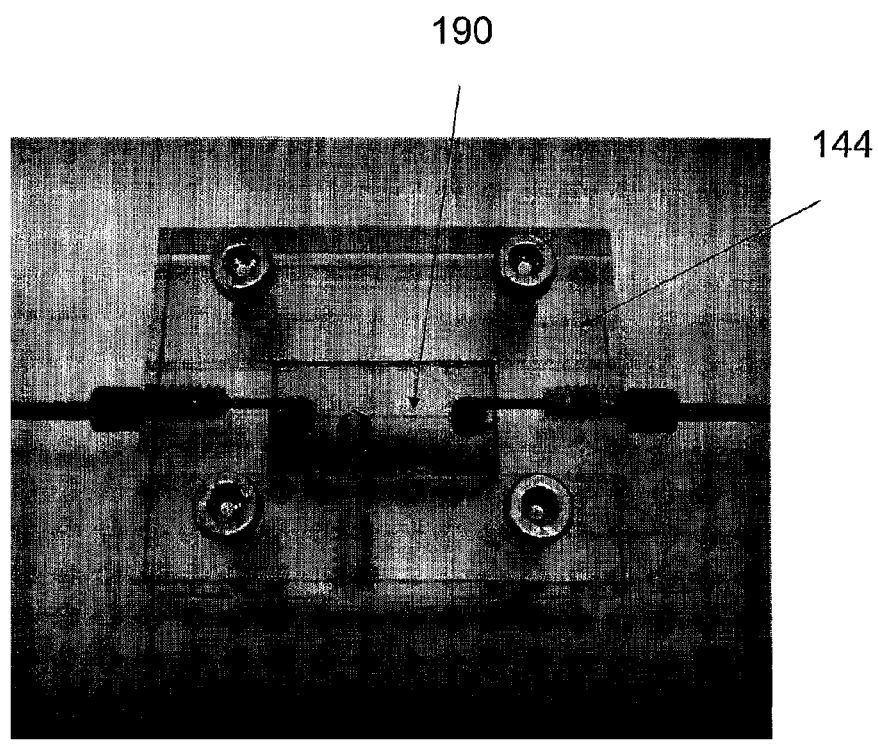
FIG. 11 shows a top view of a fluidic channel capped by a capping layer.

FIG. 11 shows a top view of a fluidic channel 190 capped by a capping layer 144. The capping layer 144 may be a layer of glass and the fluidic channel 190 may be capped by the capping layer 144 using a low temperature bonding process, at about 50° for example. From FIG. 11, it can be seen that there is no leakage and that the capping technology is feasible and can be applied to a nanowire array.

Figure 12A:
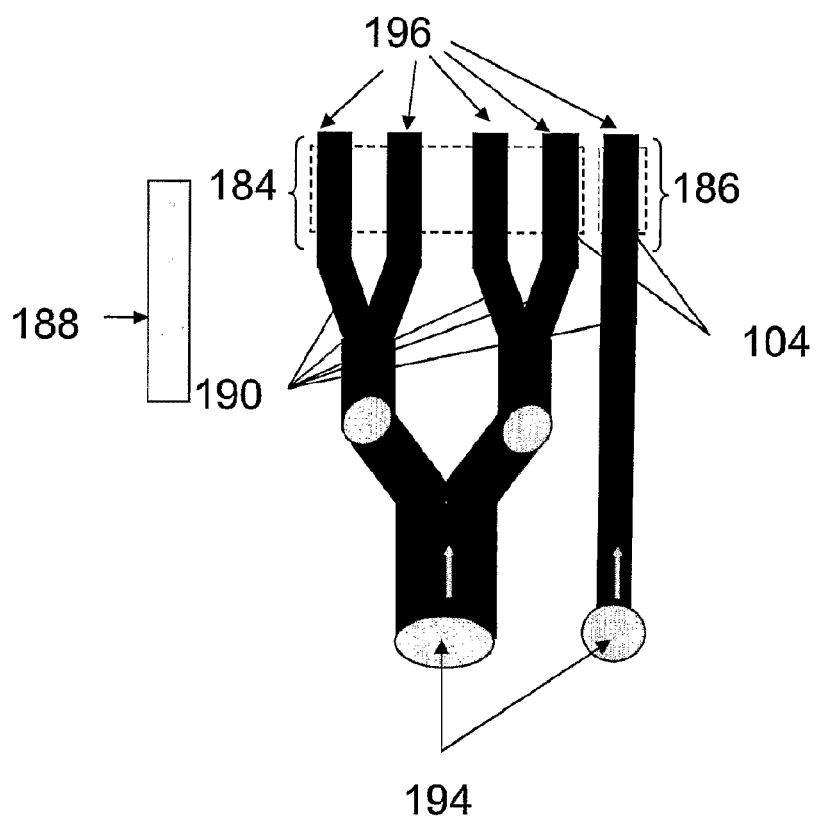
FIG. 12A and FIG. 12B show different multiplexed nanowire sensor array schemes with reference nanowire arrays and fluidic channels.
Figure 12B:
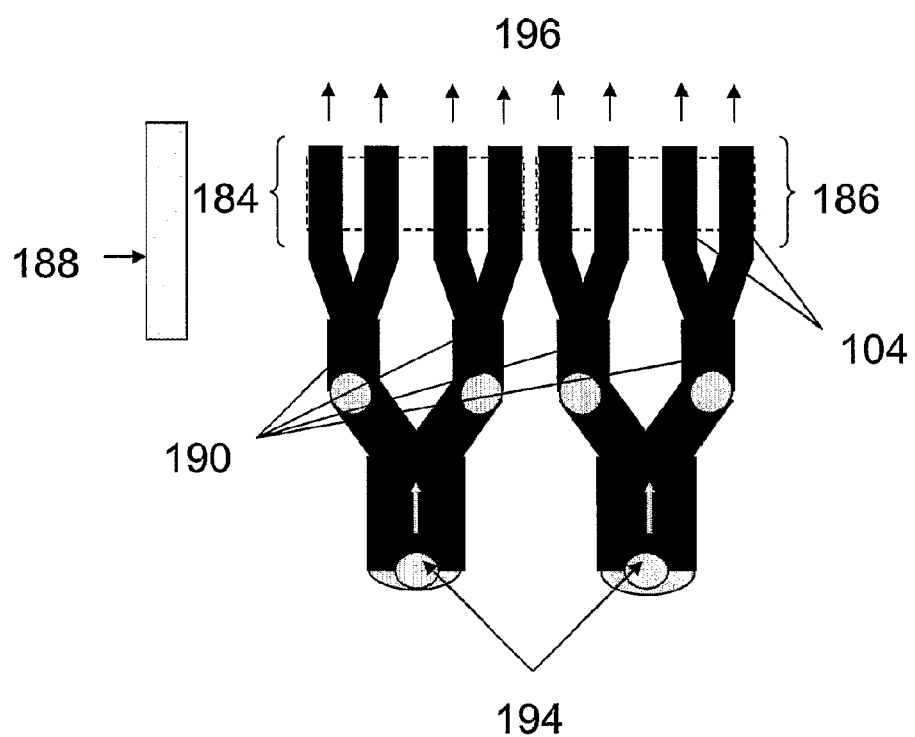

FIG. 12A and FIG. 12B show different multiplexed fluidic channel schemes in nanowire array configuration. FIG. 12A shows two different fluidic channel schemes, one associated with the sensor array 184 and the other associated with the reference array 186. For the schemes associated with the sensor array 184, a single fluid enters through a fluidic inlet 194 into a single fluidic channel 190 and exits through a fluidic outlet 196 with four separate fluidic channels 190. The single fluidic channel 190 divides into two fluidic channels 190 and each of these two fluidic channels 190 further sub-divides into two more fluidic channels 190, giving rise to four separate fluidic channels 190 but not so limited. The same fluid flows through all the fluidic channels 190 and nanowires 104 are respectively housed within each of the four fluidic channels 190 for different analysis or sensing purposes. The nanowires 104 in the respective fluidic channels 190 form the sensor array 184. For the scheme associated with the reference array 186, fluid enters through a fluidic inlet 194 into a single fluidic channel 190 and does not divide into further fluidic channels 190. Nanowires 104 are also housed in this single fluidic channel 190, and the nanowires 104 in the single fluidic channel 190 form the reference array 186. Results can be respectively detected by the sensor array 184 and the reference array 186 and the corresponding signal can be read by a control electronics circuit block 188.

FIG. 12B also shows two different fluidic channel schemes. For both the schemes, a single fluid enters through a fluidic inlet 194 into a single fluidic channel 190 and exits through a fluidic outlet 196 with four separate fluidic channels 190. The single fluidic channel 190 divides into two fluidic channels 190 and each of these two fluidic channels 190 further sub-divides into two more fluidic channels 190, giving rise to four separate fluidic channels 190 but not so limited. The same fluid flows through all the fluidic channels 190. Nanowires 104 are respectively housed within each of the four channels 190 for different analysis or sensing, forming the sensor array 184 and the reference array 186 respectively. Different multiplexed fluidic channel schemes in nanowire array configuration may be used for different analysis, depending on requirements.

Figure 13A:
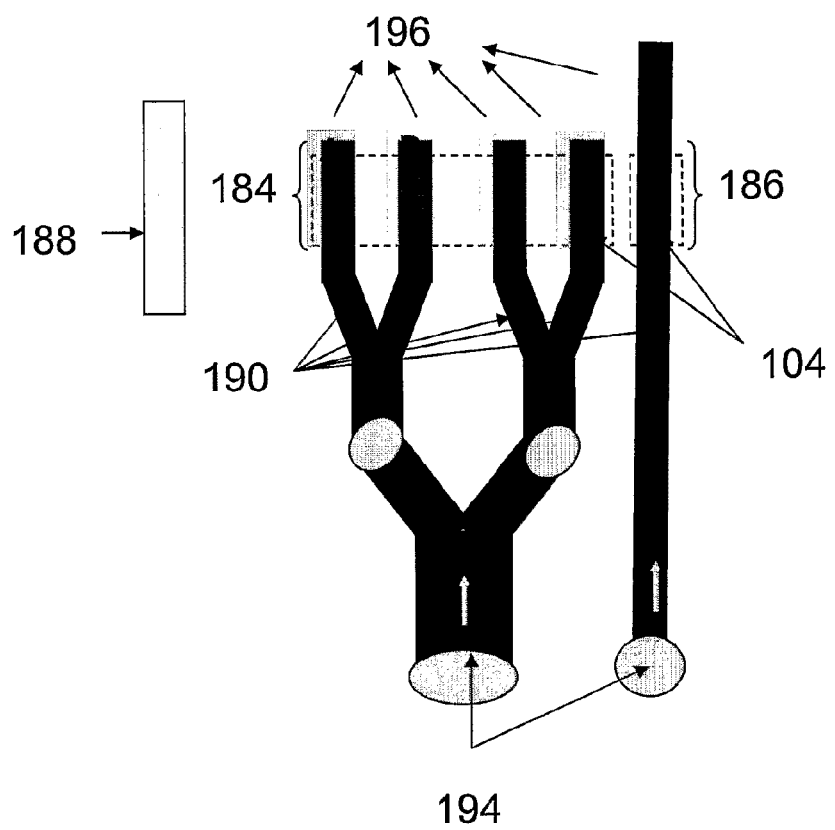
FIG. 13A shows a multiplexed nanowire array with four different surface modification schemes in different fluidic channels and a single reference nanowire array and FIG. 13B shows a multiplexed nanowire array with four different surface modification schemes in a single fluidic channel and a multiplexed reference nanowire array.
Figure 13B:
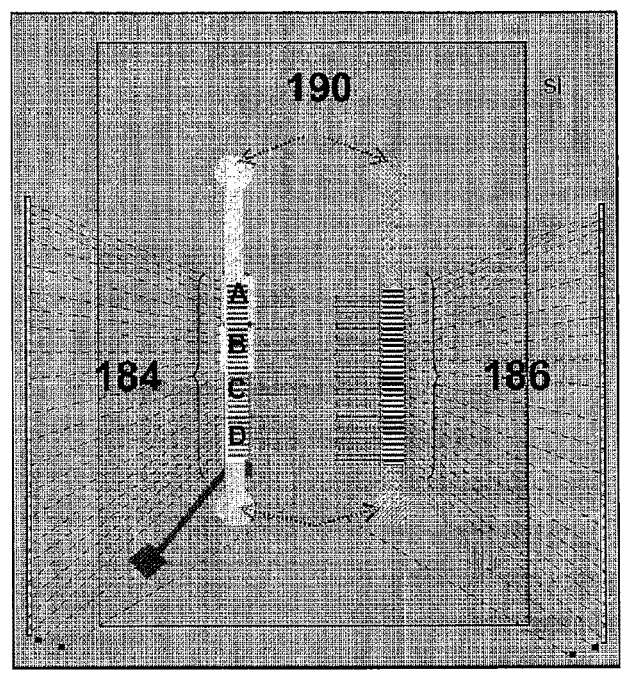

The nanowire sensor array of the present invention can be utilized for a multitude of applications, such as sensor applications or for drug discovery applications. For sensor applications, the nanowire sensor array can comprise a combination of a sensor array 184 and a reference array 186 as shown in FIG. 13A and FIG. 13B. In FIG. 13A, a set of nanowires 104 can be provided with a plurality of different surface modification schemes and can be respectively housed in a plurality of fluidic channels 190 forming the sensor array 184. Another set of nanowires 104 can be housed in a single fluidic channel 190 forming the reference array 186 and can serve as a control. Both the sensor array 184 and the reference array 186 can have a respective inlet 194 and outlet 196 for fluid flow. The inlet 194 and the outlet 196 can be common or separate for both the sensor array 184 and the reference array 186. Results can be respectively detected by the sensor array 184 and the reference array 186 and the corresponding signal can be read by the control electronics circuit block 188. The surface modifications could be specific to the applications and may be user defined. For example, if a first array is modified to detect/bind an anti-rabbit IgG and a second array is modified to detect/bind anti-mouse IgG, the respective arrays will only capture Rabbit-IgG and Mouse IgG respectively.

In FIG. 13B, a set of nanowires can be provided with a plurality of different modification schemes and can be housed in a single fluidic channel 190 forming the sensor array 184. Another set of nanowires 104 can be housed in another single fluidic channel 190 forming the reference array 186 and can serve as a control. There can be one reference array corresponding to each sensor array having a different modification scheme. In both FIG. 13A and FIG. 13B, the respective nanowires can also be housed in a plurality of channels, each channel in the reference array 186 corresponding to each channel in the sensor array 184.

Figure 14A:
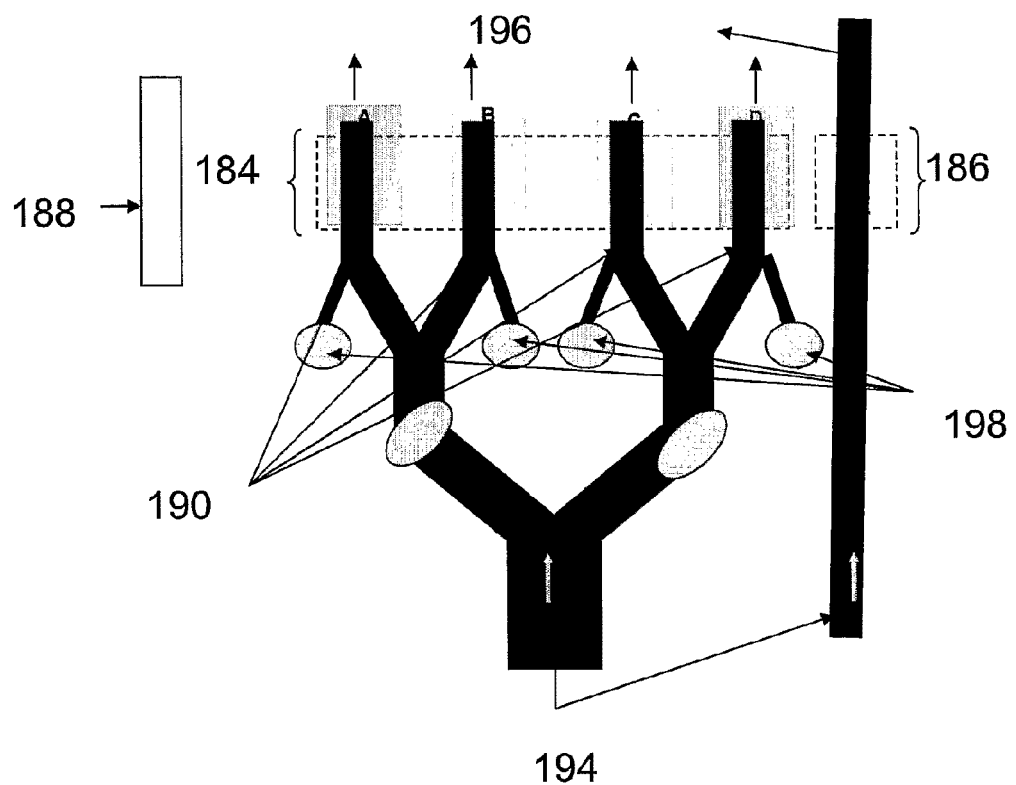
FIG. 14A and FIG. 14B show other embodiments of nanowire sensor arrays schemes.
Figure 14B:
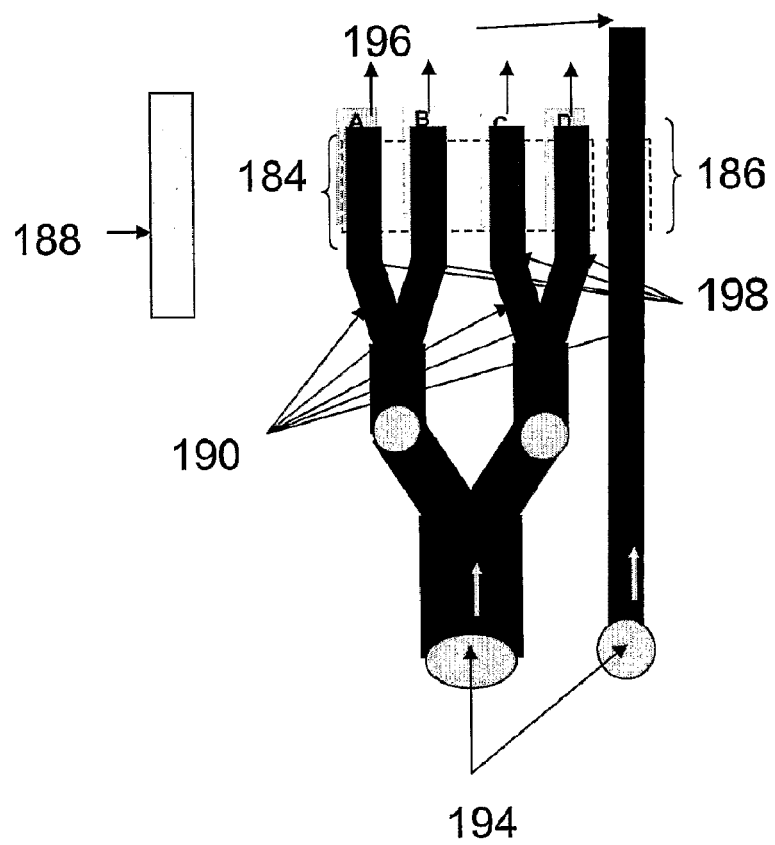

For drug discovery applications, either of the two embodiments shown in FIG. 14A and FIG. 14B can be utilized. In FIG. 14A, the nanowire sensor array can comprise a combination of a sensor array 184 and a reference array 186. The sensor array 184 can be provided in a plurality of fluidic channels 190 with a respective inlet 194 and outlet 196 and the reference array 186 can be in a single fluidic channel 190 with a respective inlet 194 and outlet 196. Different compounds 198 or same compounds with different dosage or concentrations can be injected into different respective fluidic channels 190 of the sensor array 184. The injected compound 198 will react with the targeted diseases. Results can respectively be detected by the down-stream sensor array 184 and the reference array 186 and the corresponding signal can be read by the control electronics circuit block 188. The inlet 194 and the outlet 196 can be separate for both the sensor array 184 and the reference array 186 as shown in FIG. 14B but the inlet 194 and the outlet 196 can also be common for both the sensor array 184 and the reference array 186 depending on requirements.

In FIG. 14B, the nanowire sensor array can comprise a combination of a sensor array 184 and a reference array 186. The sensor array 184 can be provided in a plurality of fluidic channels 190 with a respective inlet 194 and outlet 196 and the reference array 186 can be in a single fluidic channel 190 with a respective inlet 194 and outlet 196. Different compounds 198 are immobilized on the surfaces of the different channels 190 which are located up-stream of the sensor array 184. The targeted diseases will react with these immobilized compounds 198 upon fluid flow. Results will be detected by the down-stream sensor array 184 and the reference array 186 respectively and the corresponding signal can be read by the control electronics circuit block 188. The inlet 194 and the outlet 196 can be separate for both the sensor array 184 and the reference array 186 as shown in FIG. 14B but the inlet 194 and the outlet 196 can also be common for both the sensor array 184 and the reference array 186 depending on requirements.

EXPERIMENTAL EXAMPLES

A method of fabricating a sensor comprising a nanowire on a support substrate with a semiconductor layer arranged on the support substrate according to one embodiment of the present invention is set forth hereunder based on the following experimental examples. However, they should not be construed as limiting the scope of this invention.

Example 1

Figure 15:
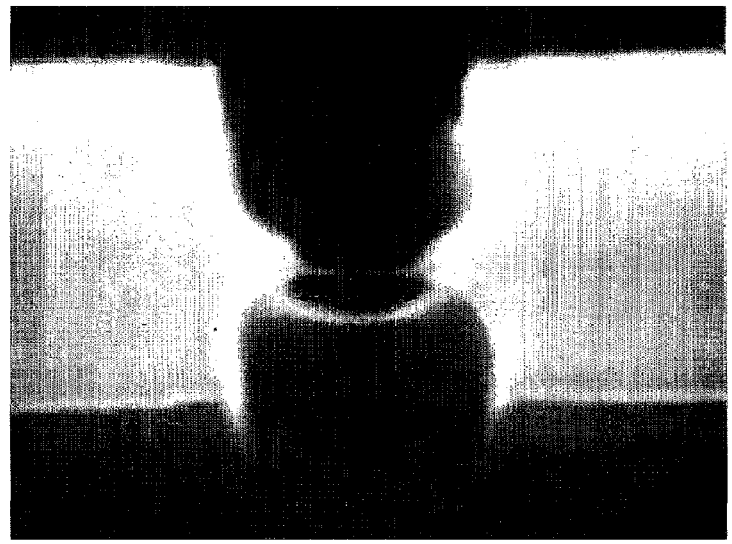
FIG. 15 shows a released single nanowire sensor as fabricated according to a first embodiment of the present invention.

For Si nanowire formation, SOI wafers of 200 mm diameter consisting of 200 nm thick Si device layer and 150 nm thick BOX on support substrate were utilized. Trenches were formed in Si device layer up to the BOX by lithography and etching to obtain Si FINs of width 80 nm. The wafers were then oxidized in dry $O_2$ ambient at 900° C. for 6 hrs to form nanowires 104 as shown in FIG. 15. The single nanowire is one of the nanowire structural arrangements mentioned in FIG. 6A. By doping n-type, p-type or a combination of n-type and p-type dopants, nanowires of different functional types can be realized as mentioned in FIG. 7A and FIG. 7B.

Example 2

Figure 16A:
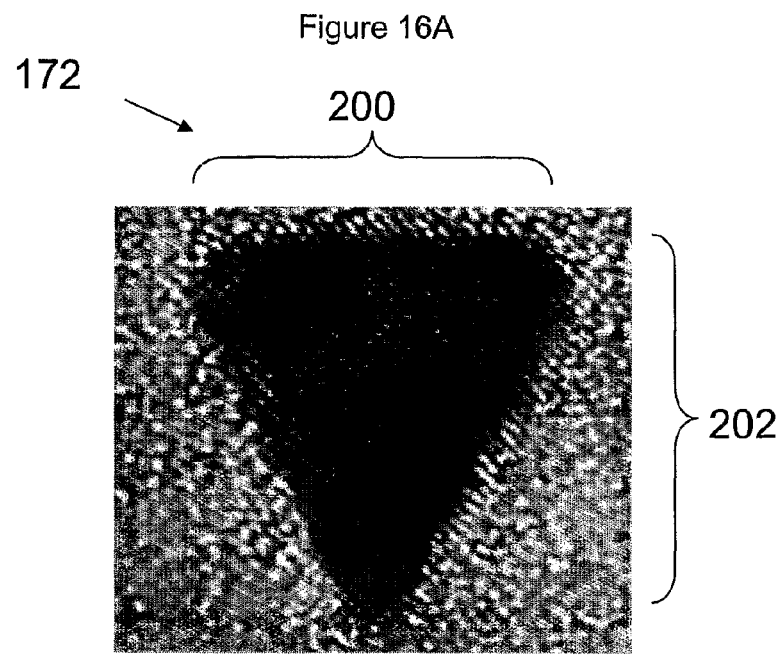
FIG. 16A shows a High Resolution Transmission Electron Microscopy (HRTEM) image of a Si nanowire showing a triangular cross-section and FIG. 16B shows a HRTEM image of a Si nanowire showing a circular cross-section.
Figure 16B:
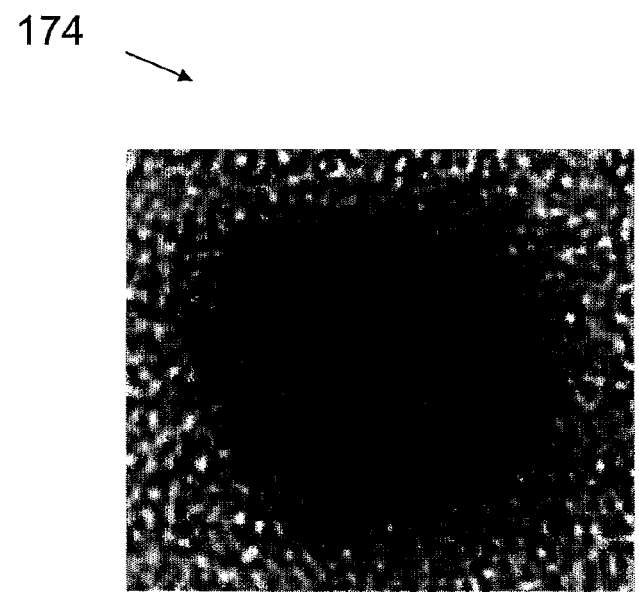

The High Resolution Transmission Electron Microscopy (HRTEM) images of Si nanowires are shown in FIG. 16A and FIG. 16B. FIG. 16A shows a nanowire 172 with a triangular cross-section with base 200 of about 10 nanometers and height 202 of about 12.3 nanometers. The reason for the triangular shape results from different oxidation fronts along various crystallographic orientations. By using the viscoelastic properties of $SiO_2$ and Si atomic migration at the Si—$SiO_2$ interface, a circular shape transformation can also be brought about by subjecting the wafers to nitrogen ($N_2$) anneal at approximately 1200° C. for 1 hr. A nanowire 174 with a circular cross-section with a diameter of about 7.7 nanometers is shown in FIG. 16B. Therefore, the cross-section of the nanowire can be triangular or circular depending on the process conditions.

A nanowire sensor array comprising a plurality of nanowire sensors wherein each nanowire sensor is individually addressable via the supporting portions according to an embodiment of the present invention is also set forth hereunder based on the following experimental examples. However, they should also not be construed as limiting the scope of this invention.

Figure 17:
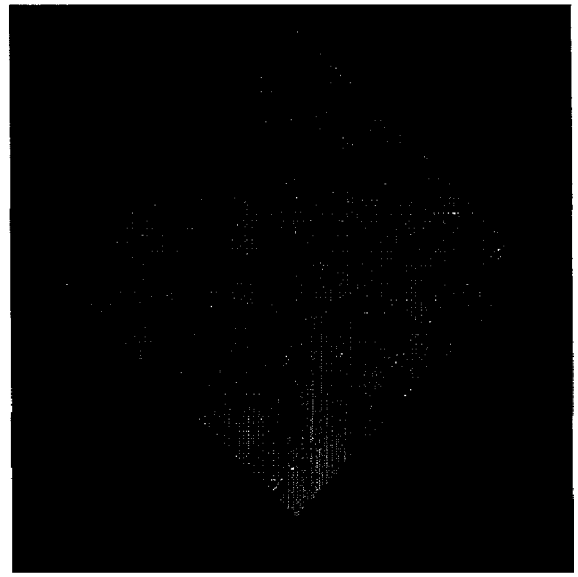
FIG. 17 shows a full view of a silicon nanowire array having 100 nanowires.

FIG. 17 shows a full view of a silicon nanowire array having 100 nanowires, each nanowire being approximately 200 micrometers in length.

Figure 18:
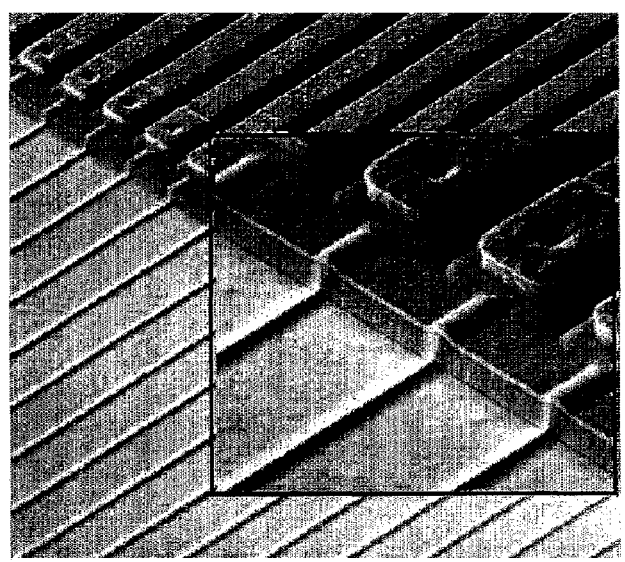
FIG. 18 shows a scanning electron microscopy (SEM) picture of silicon nanowire array before fluidic channel formation.

FIG. 18 shows a scanning electron microscopy (SEM) picture of silicon nanowire arrays before fluidic channel formation. The inset shows a zoomed part of the nanowire arrays.

Figure 19A:
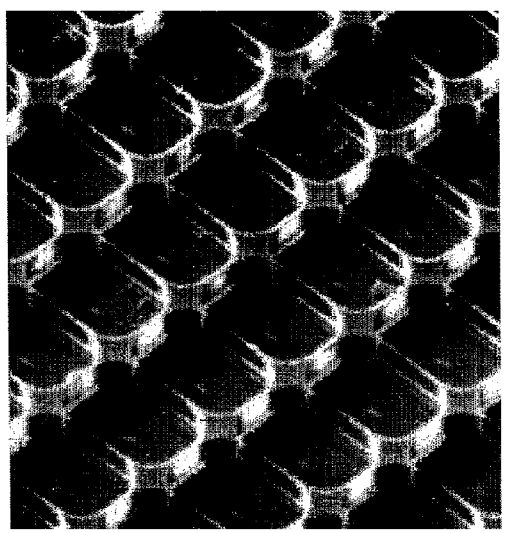
FIG. 19A and FIG. 19B show different views of an array of Si nanowires arranged vertically and horizontally.
Figure 19B:
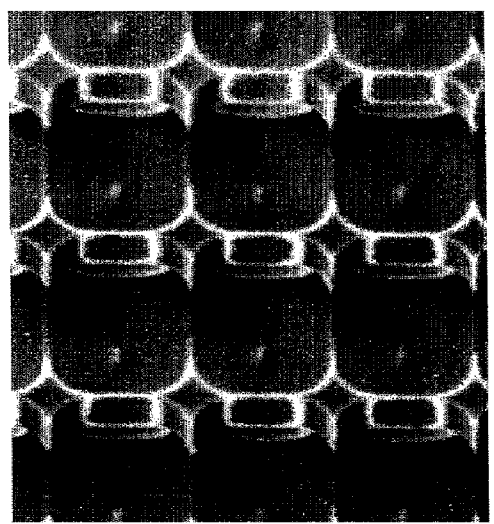

The array of Si nanowires 176 can be arranged vertically or horizontally (both parallel and perpendicular to each other) or in combination as shown in FIG. 19A and FIG. 19B. FIG. 19A and FIG. 19B show different views of the array of Si nanowires 176.

Figure 20:
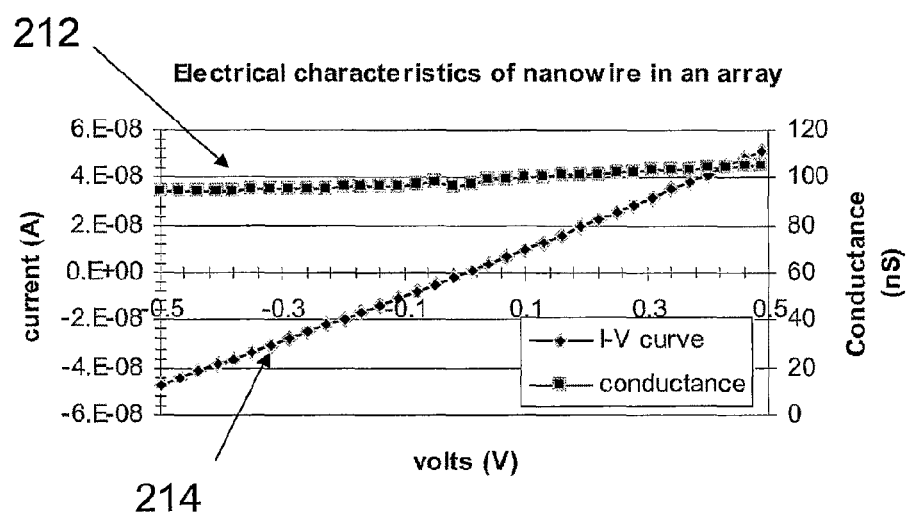
FIG. 20 shows electrical characteristic of a nanowire in a nanowire sensor array.

FIG. 20 shows electrical characteristic of a nanowire in a nanowire sensor array. The current (I) of the silicon nanowire is measured in amperes (A), the voltage (V) is measured in volts (V) and the conductance is measured in nanosiemens (nS). The plot of conductance vs voltage is depicted by 212 and the plot of current vs voltage is depicted by 214. To measure current-voltage characteristics of the nanowires, variable potential (−0.5V to +0.5V) is applied across the nanowire and the corresponding current is measured. This current vs voltage plot is called I-V curve 214. Conductance is calculated as the ratio of current to voltage. For current measurements, any standard ampere meter may be used while the voltage is applied from a voltage generator. The conductance vs voltage plot 212 shows that the conductance of the sensor is relatively stable at about 100 nS. The current vs voltage plot 214 shows that current varies linearly with voltage potential.

Figure 21A:
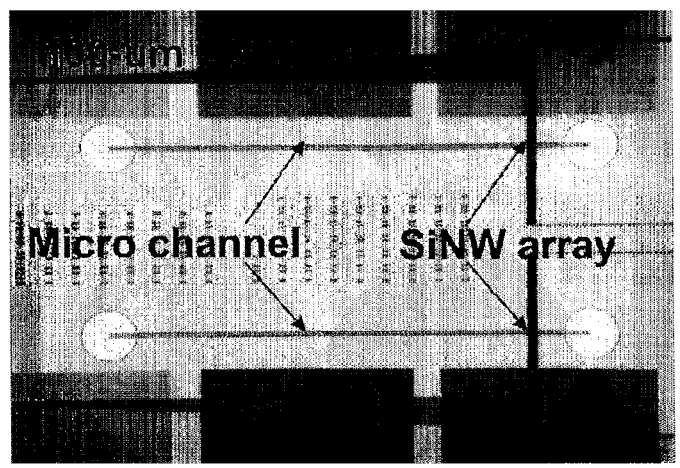
FIG. 21A to 21D shows fabricated silicon nanowire arrays with different dimensions integrated in fluidic channels.
Figure 21B:
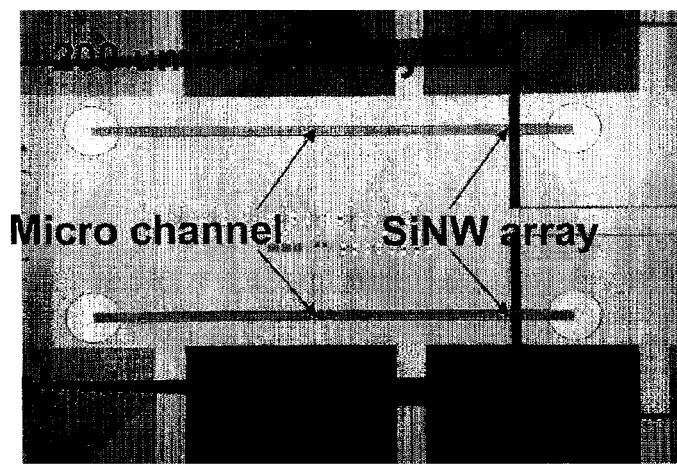
Figure 21C:
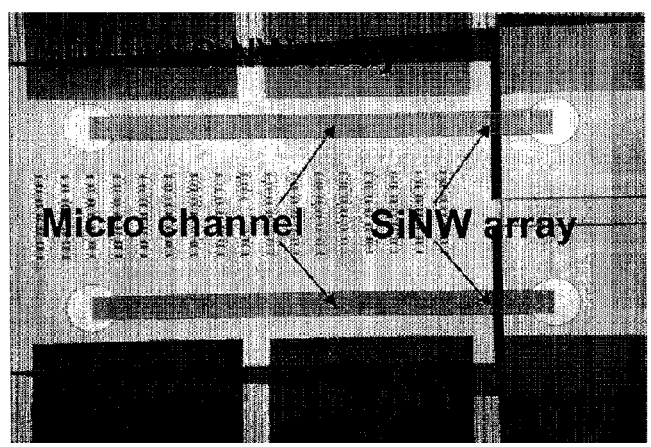
Figure 21D:
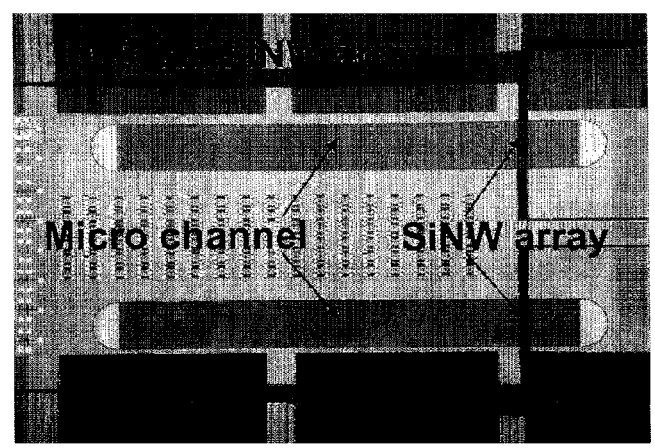
Figure 22A:
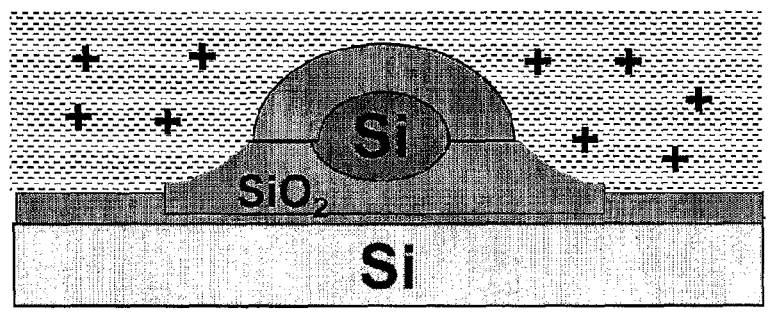
FIG. 22A shows a n-type silicon nanowire buried in $SiO_2$ and FIG. 22B shows a graph of change in conductance vs pH as measured of a n-type silicon nanowire buried in $SiO_2$.
Figure 22B:
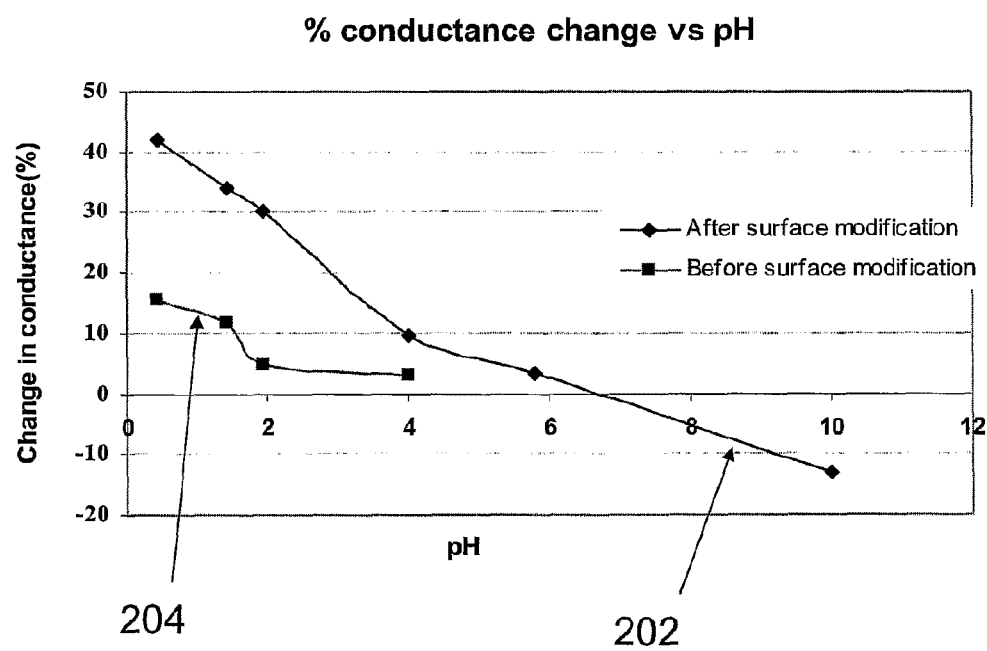

FIG. 21A to 21D show fabricated silicon nanowire arrays with different dimensions integrated in fluidic channels. Two fluidic channels are parallel to each other, with a silicon nanowire array housed respectively within each fluidic channel. The silicon nanowire arrays have dimensions ranging from about 100 μm to about 1000 μm. FIG. 21A shows a silicon nanowire array having a dimension of about 100 μm, housed in a fluidic channel. FIG. 21B shows a silicon nanowire array having a dimension of about 200 μm, housed in a fluidic channel. FIG. 21C shows a silicon nanowire array having a dimension of about 500 μm, housed in a fluidic channel. FIG. 21D shows a silicon nanowire array having a dimension of about 1000 μm, housed in a fluidic channel. The nanowire arrays can also be of any other suitable dimensions.

pH, potential hydrogen, is a measure of the activity of hydrogen ions ($H^+$) in a solution and, therefore, its acidity. In aqueous systems, the hydrogen ion activity is dictated by the dissociation constant of water ($K_w$=1.011×10$^{-14}$ $M^2$ at 25° C.) and interactions with other ions in solution. Due to this dissociation constant a neutral solution (hydrogen ion activity equals hydroxide ion activity) has a pH of approximately 7. Aqueous solutions with pH values lower than 7 are considered acidic, while pH values higher than 7 are considered basic. pH sensing is possible with a silicon nanowire. FIG. 22A shows a n-type silicon nanowire buried in $SiO_2$. In FIG. 22A, the n-type silicon nanowire is a nanowire which has been doped with n-type dopants. FIG. 22B shows a graph of change in conductance vs pH as measured using a n-type silicon nanowire buried in $SiO_2$. The change in conductance is measured in percentage (%). The process of silanation enhances the attachment of H+ in the solution to the n-type silicon nanowire. This enhances the positive gate voltage, causing accumulation of H+ on the n-type silicon nanowire and thereby enhanced conductivity. The plot after silane surface modification is depicted by 202 and the plot before silane surface modification is depicted by 204. Thus, these experiments show that the nanowire sensor can be used for example for analysis of fluid without having a capture molecule immobilized on the nanowire.

Figure 23:
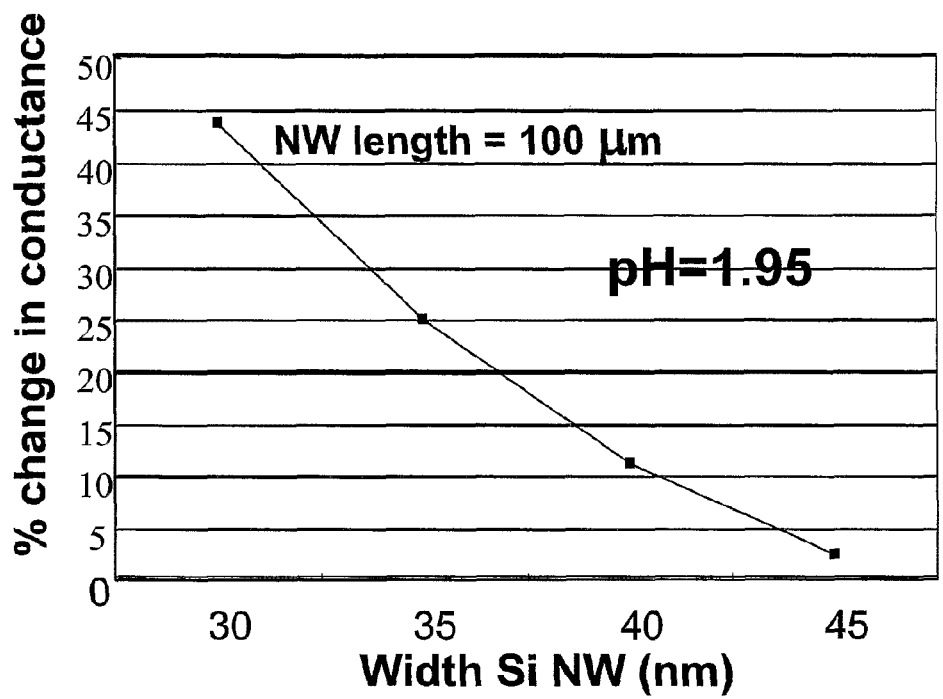
FIG. 23 shows a graph of change in conductance vs width of silicon nanowire.

FIG. 23 shows a graph of change in conductance vs width of silicon nanowire for a fixed nanowire length of 100 µm, at a pH of about 1.95. The width of the silicon nanowire is measured in nanometers (nm) and the change in conductance is measured in percentage (%). FIG. 23 shows that the thinner the width of the nanowire, the higher the change in conductance, thereby the better the sensitivity. This is due to better electrostatic control of properties of the gate. Therefore, further increase in sensitivity is possible through nanowire width reduction and reduction of the gate oxide thickness.

Figure 24A:
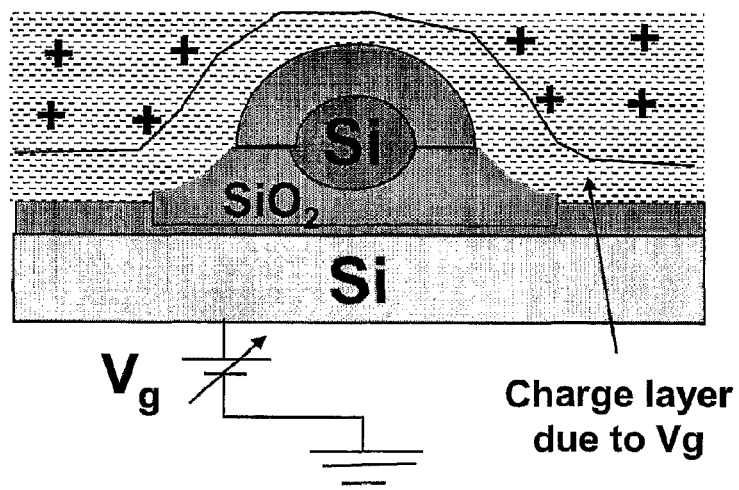
FIG. 24A shows a n-type silicon nanowire buried in $SiO_2$ covered by another layer of $SiO_2$ and FIG. 24B shows a graph of nanowire conductance variation in the presence or absence of buffer solution with different pH vs gate voltage (Vg) as measured of a n-type silicon nanowire buried in $SiO_2$ covered by another layer of $SiO_2$.
Figure 24B:
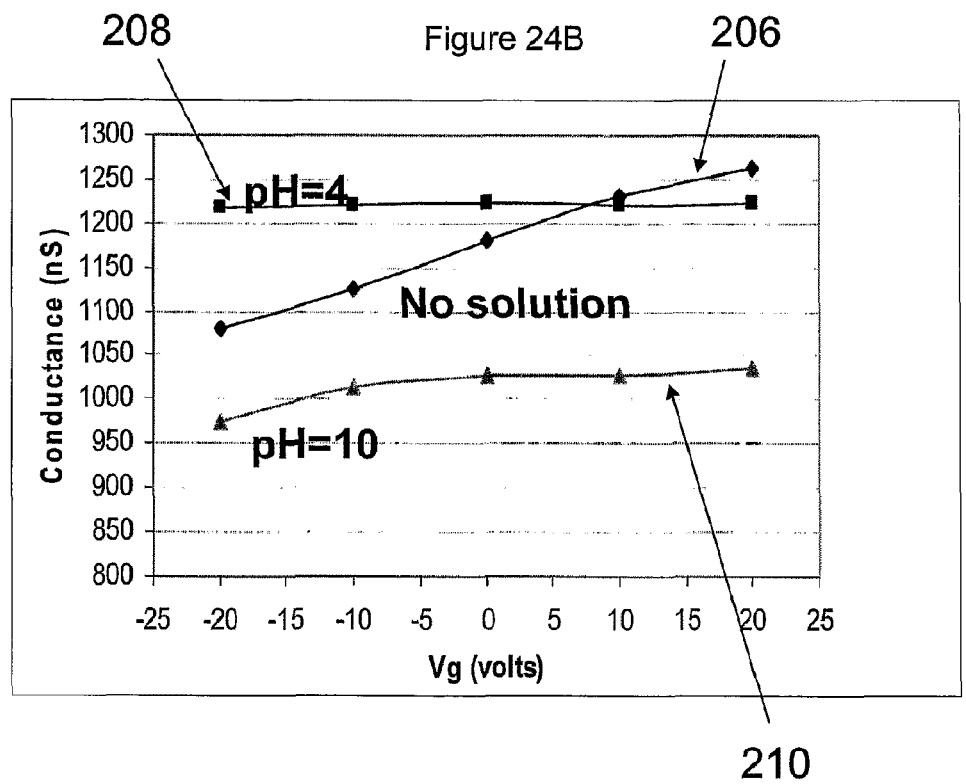

A study of the back gate effect on the nanowire response is also carried out. FIG. 24A shows a n-type silicon nanowire buried in $SiO_2$ covered by another layer of $SiO_2$ and FIG. 24B shows a graph of conductance vs gate voltage (Vg) as measured of the n-type silicon nanowire buried in $SiO_2$ covered by another layer of $SiO_2$. The gate voltage is measured in volts and the conductance is measured in nanosiemens (nS). In FIG. 24B, the n-type silicon nanowire can be emerged in a solution of about pH 4 or pH 10 or in no solution at all. The plot where the n-type silicon nanowire is not emerged in any solution is depicted by 206, the plot where the n-type silicon nanowire is emerged in a solution of about pH 4 is depicted by 208 and the plot where the n-type silicon nanowire is emerged in a solution of about pH 10 is depicted by 210. The higher the pH of the solution, the lower the conductance for a given voltage. The effects are attributed to the impact of biasing on the ionic solution and can be exploited for increased sensitivity.

Figure 25:
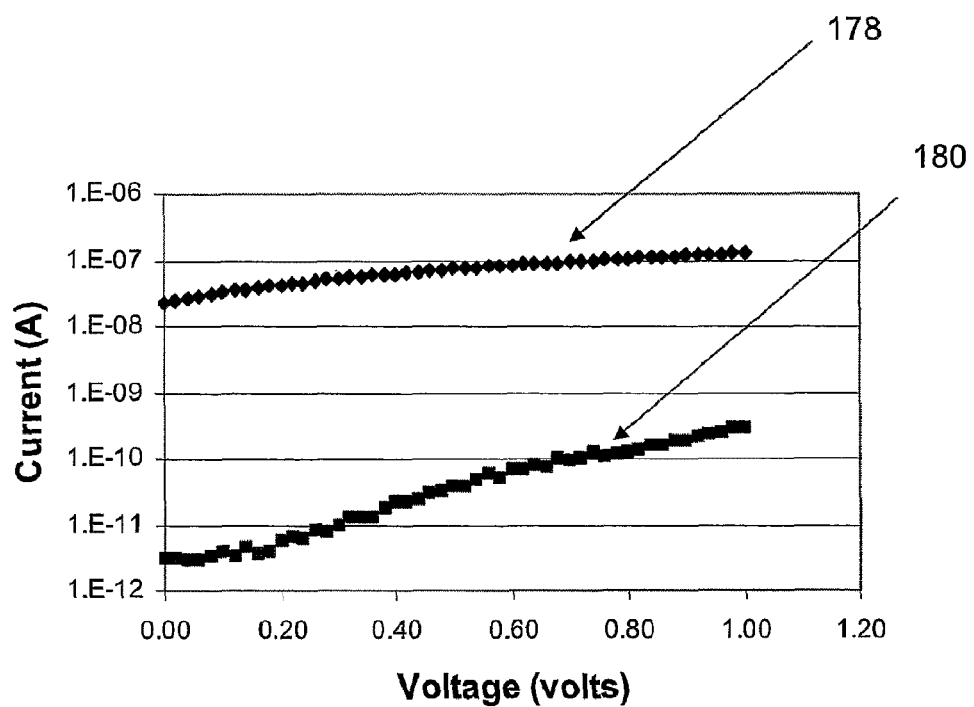
FIG. 25 shows a graph of Current (A) vs Voltage (V) as measured of a nanowire sensor before and after DNA attachment.

The nanowire sensor of the present invention is also suitable for biological applications as the sensor operates based on a conductance change which may be due to a charge or mass induced stress when a biological macromolecule is immobilized on the fin portion. The biological macromolecule can be bonded directly on the FIN portion or via means of a capture molecule. To facilitate the binding of the biological macromolecule on the FIN portion, at least a surface of the FIN portion can be adapted as mentioned earlier such that it is easier for binding of biological macromolecules, such as DNA. The respective current-voltage (I-V) electrical characteristics of an exemplary nanowire sensor before and after DNA attachment are depicted in FIG. 25. The plot after DNA attachment is depicted by 178 and the plot before DNA attachment is depicted by 180. After DNA attachment, the current for a same given voltage is higher than before DNA attachment.

Figure 26A:
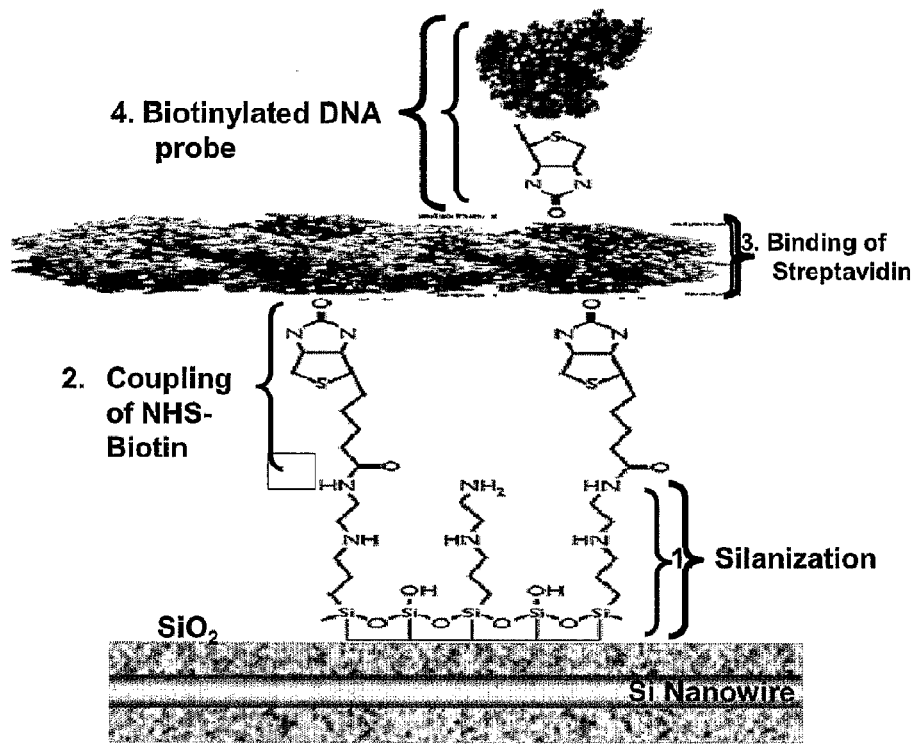
FIG. 26A shows a graph of probe DNA functionalization & DNA hybridization and FIG. 26B shows a box-plot of change in conductance when ssDNA hybridize DNA probes immobilized on p-type and n-type silicon nanowire array.

DNA probes are immobilized as illustrated in FIG. 26A. It involves forming SiO2 on the silicon nanowire followed by silanization, and immobilization of capture molecules via coupling using NHS-biotin and streptavidin as explained in detail the following. The capture molecule was a single strand 18 bp oligonucleotide termed Ec18c from E. coli K12 with the sequence TTA ACT TTA CTC CCT TCC (SEQ ID NO: 1). The E. coli K12 derived oligonucleotide termed Ec36T having the nucleotide sequence GGA AGG GAG TAA AGT TAA TAC CTT TGC TCA TTG ACG (SEQ ID NO: 2) was used as illustrative target ssDNA strang.

FIG. 26A illustrates the set up for exemplary binding experiments carried out with a sensor of the present invention. First, reactive hydroxyl group of the silicon dioxide present on the surface of the nanowire were reacted with a suitable amino silane in order to provide a silane layer having free terminal amino groups for the subsequent immobilization of the desired capture molecule. Then, biotin-N-succinimidylester was reacted via conventional NHS coupling to the silane layer. Making use of the specific binding of streptavidin (or avidin) to biotin, streptavidin was added to provide an immobilization agent for the specific immobilization of the respective capture molecule (which results in a low background and further improves the sensitivity of the sensor. Streptavidin is quite suitable for this purpose (however, the invention is by no means limited to the use of such an immobilization agent) as it is a homo-tetramer (meaning it has four identical subunits each of which has one biotin binding site) with biotin binding sites being arranged on opposite surfaces of the streptavidin molecule. Thus, while being non-covalently bound to the silane layer via one or two biotin binding sites) the other two biotin binding sites are available for binding a biotinylated capture molecule.

In the experiment example described here, the oligonucleotide having the sequence of SEQ ID NO: 1 was used as capture molecule. However, it is clear that any other capture molecule that has affinity to a desired ligand the presence of which is to be investigated can be used in connection with the sensor of the present invention. For example, such a capture molecule can be a biotinylated antibody that binds a small organic molecule, say an environmental toxin such as DDT or an antibody that binds to a virus (or more exactly to a surface structure of a virus) such as the human immune deficiency (HIV) virus or the hepatitis C virus. Thus, using such a capture molecule the sensor of the present invention can be used for environmental or diagnostic purposes.

In addition, it is also possible to use a sensor of the invention for drug screening. In such an embodiment, the capture molecule may for example, by a protein that is a drug target such as Vascular Endothelial Growth Factor (VEGF). This drug target can be biotinylated and then immobilized on the nanowire surface. Then, the nanowire surface is brought into contact with a solution containing phagemids that present on their surface antibody fragments with suspected binding affinity to VEGF. These phagemids can, for example, be prepared according to any conventional "phage display" technology as described in Hoess, Curr. Opin. Struct. Biol. 3 (1993), 572-579; Wells and Lowman, Curr. Opin. Struct. Biol. 2 (1992), 597-604 or by "colony screening" methods (Skerra et al., Anal. Biochem. 196 (1991), 151-155) or "ribosome display" (Roberts, Cuff. Opin. Chem. Biol. 3 (1999) 268-273), for example). Then, the complex formation between VEGF those antibodies that indeed bind to VEGF can be detected by the change in conductance of the nanowire sensor.

Figure 26B:
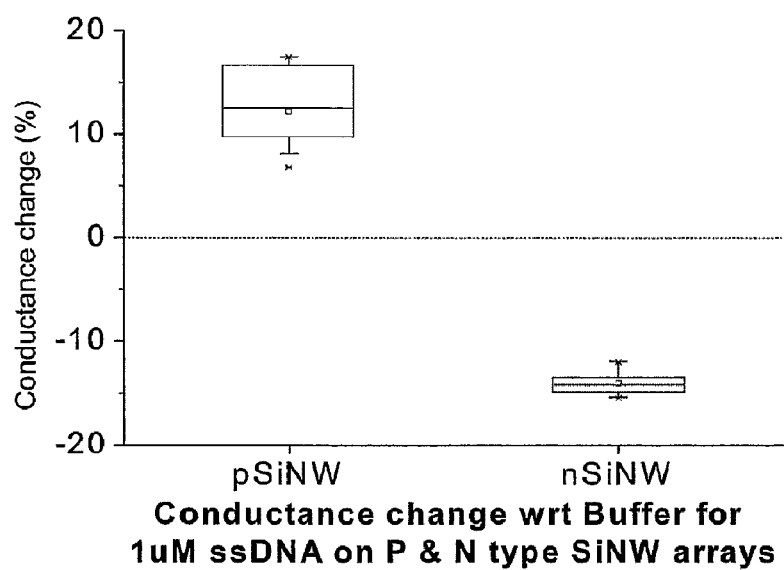

The detection of the complex formation (or hybridization when both capture molecule and ligand to be detected are nucleic acids) by the change in the electrical properties of the nanowire is illustrated in FIG. 26B. FIG. 26B shows a box-plot of the change in conductance for p-type and n-type silicon nanowire arrays respectively when a sensor on which nucleic acid molecules of SEQ ID NO: 1 was contacted with a solution containing DNA molecules of SEQ ID NO: 2. The change in conductance is measured in percentage (%). The box-plot in FIG. 26B shows the change in conductance with respect to a buffer solution for 1 µM of single-stranded DNA (ssDNA) for p-type and n-type silicon nanowire arrays respectively. Umbiotinylated capture DNA probe, being negatively charged, increases the conductance of p-type silicon nanowire and reduces the conductance of n-type silicon nanowire with respect to the conductance measured with buffer solution.

Figure 27:
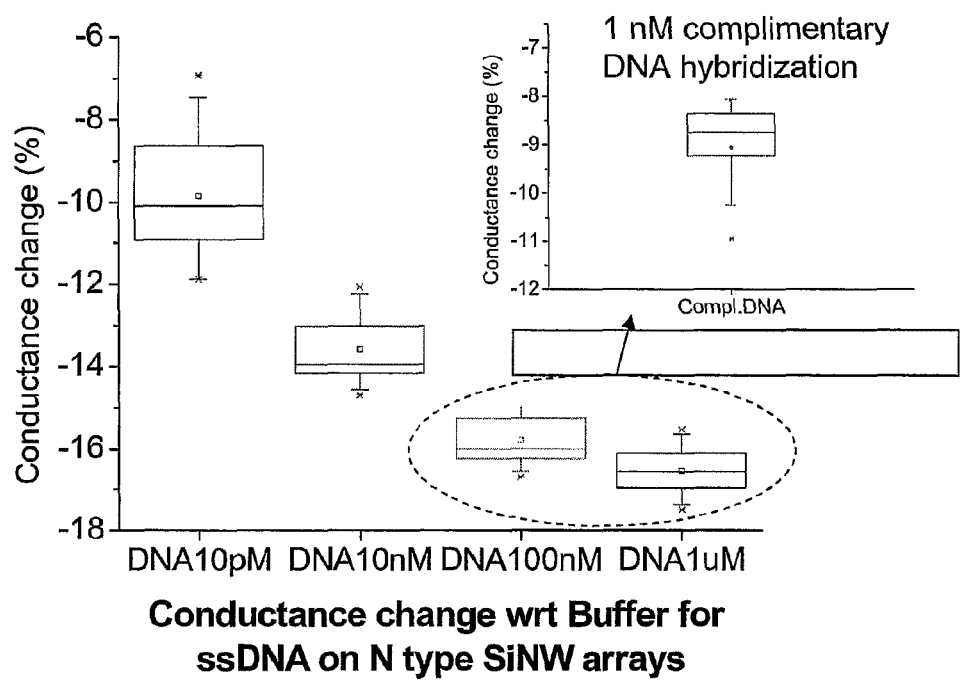
FIG. 27 shows a box-plot of change in conductance for different concentrations of probe DNA on n-type silicon nanowire array; Inset shows box-plot of conductance change when complementary DNA with concentration 1 pM hybridizes.

FIG. 27 shows a box-plot of change in conductance for different concentrations of the probe DNA of SEQ ID NO: 1 on an n-type silicon nanowire array. The concentration of the probe DNA is measured in nano-Molar (nM) and the change in conductance is measured in percentage (%). From the box-plot, the conductance of the n-type silicon nanowire decreases with increase in concentration of probe DNA.

The aforementioned description of the various embodiments has been presented for purposes of illustration and description. It is not intended to be exhaustive or to limit the invention to the precise form disclosed, and obviously many modifications and variations are possible in light of the disclosed teaching. It is intended that the scope of the invention be defined by the claims appended hereto.

What is claimed is:

1. A method of fabricating a sensor comprising a nanowire on a support substrate with a first semiconductor layer arranged on the support substrate comprising:
   forming a fin structure from the first semiconductor layer, the fin structure comprising at least two supporting portions and a fin portion arranged there between;
   oxidizing at least the fin portion of the fin structure thereby forming the nanowire being surrounded by a first layer of oxide; and
   forming a first conductive layer on a contact surface of the supporting portions;
   forming a first insulating layer above the first conductive layer and a portion of the fin structure;
   removing a part of the first insulating layer to form a part of a microfluidic channel to make accessible a contact surface of the first layer of oxide surrounding the nanowire;
   wherein the supporting portions and the first insulating layer form the microfluidic channel and the first conductive layer is isolated from the microfluidic channel by a portion of the first insulating layer.

2. The method of claim 1, further comprising forming a second layer of oxide on the contact surface of the supporting portions before forming the first conductive layer.

3. The method of claim 1, further comprising planarizing the first insulating layer.

4. The method of claim 1, further comprising removing the first layer of oxide surrounding the nanowire to expose the nanowire.

5. The method of claim 1, further comprising closing the microfluidic channel with a capping layer.

6. The method of claim 1, further comprising doping the fin portion with at least one dopant.

7. The method of claim 6, wherein the at least one dopant is either p-type or n-type.

8. The method of claim 1, further comprising forming a gap in the nanowire by removing a part of the nanowire.

9. The method of claim 8, further comprising covering a part of the nanowire with a dielectric material.

10. The method of claim 9, further comprising performing a silicidation process on the nanowire.

11. The method of claim 10, wherein performing the silicidation process comprises
   forming a second conductive layer on the nanowire;
   performing a first heat treatment to induce a chemical reaction between the nanowire and the second conductive layer, such that the nanowire is silicided; and
   removing the remaining second conductive layer.

12. The method of claim 1, wherein a second insulating layer is arranged between the support substrate and the first semiconductor layer.

13. The method of claim 1, wherein the support substrate comprises a material selected from the group consisting of silicon, sapphire, polysilicon, silicon oxide and silicon nitride.

14. The method of claim 1, wherein the first semiconductor layer comprises a material selected from the group consisting of silicon, gallium arsenide and silicon-germanium.

15. The method of claim 1, wherein the nanowire comprises of or is made of silicon.

16. The method of claim 1, wherein oxidizing at least the fin portion of the fin structure is performed by a self-limiting oxidation process.

17. The method of claim 2, wherein the first layer of oxide is the same as the second layer of oxide.

18. The method of claim 1, wherein the first layer of oxide is silicon oxide.

19. The method of claim 2, wherein the second layer of oxide is silicon oxide.

20. The method of claim 1, wherein the first conductive layer comprises a metal or a metal alloy.

21. The method of claim 1, wherein the first insulating layer comprises a material selected from the group consisting of silicon oxide, a polymer and a dielectric material.

22. The method of claim 5, wherein the capping layer is formed of a material selected from the group consisting of silicon, glass, silica, an organic polymer and polydimethylsiloxane.

23. The method of claim 5, further comprising forming at least two openings in the capping layer.

24. The method of claim 23, wherein each opening in the capping layer is positioned at a distance away from each supporting portion.

25. The method of claim 23, further comprising filling each opening with the first conductive layer thereby forming an electrical connection from each opening to the contact surface of the supporting portions.

26. The method of claim 1, further comprising oxidizing the fin structure thereby forming a first layer of oxide around the supporting portions.

27. The method of claim 1, further comprising depositing a second semiconductor layer on the support substrate before depositing the first semiconductor layer.

28. The method of claim 27, further comprising forming an electrode from the second semiconductor layer.

29. The method of claim 28, further comprising depositing a third insulating layer above the electrode before forming the fin structure.

30. The method of claim 28, wherein the electrode is positioned below the nanowire.

31. The method of claim 1, further comprising forming a passivation layer above the first conductive layer before forming the first insulating layer.

32. A nanowire sensor comprising:
 a support substrate;
 a semiconducting fin structure arranged on the support substrate, the fin structure comprising at least two semiconducting supporting portions and a nanowire arranged there between; and
 a first conductive layer on a contact surface of the supporting portions
 a first insulating layer on the first conductive layer and a portion of the semiconducting fin structure; the first insulating layer having an opening to make accessible a contact surface of the first layer of oxide surrounding the nanowire;
 wherein the supporting portions and the first insulating layer form a microfluidic channel and the first conductive layer is isolated from the microfluidic channel by a portion of the first insulating layer.

33. A nanowire sensor array comprising:
 a plurality of nanowire sensors as defined in claim 32
 wherein each nanowire sensor is individually addressable via the supporting portions, the nanowire optionally further comprising
 a plurality of microfluidic channels, and/or
 a control unit for individually addressing each nanowire sensor.

* * * * *

```
SEQUENCE LISTING

<160> NUMBER OF SEQ ID NOS: 2

<210> SEQ ID NO 1
<211> LENGTH: 18
<212> TYPE: DNA
<213> ORGANISM: artificial sequence
<220> FEATURE:
<223> OTHER INFORMATION: primer E. coli K12 capture

<400> SEQUENCE: 1
ttaactttac tcccttcc                                                  18

<210> SEQ ID NO 2
<211> LENGTH: 36
<212> TYPE: DNA
<213> ORGANISM: artificial sequence
<220> FEATURE:
<223> OTHER INFORMATION: E. coli K12

<400> SEQUENCE: 2
ggaagggagt aaagttaata cctttgctca ttgacg                              36
```